United States Patent
Zhao et al.

(10) Patent No.: US 10,825,513 B2
(45) Date of Patent: Nov. 3, 2020

(54) PARASITIC NOISE CONTROL DURING SENSE OPERATIONS

(71) Applicant: SanDisk Technologies LLC, Addison, TX (US)

(72) Inventors: Dengtao Zhao, Los Gatos, CA (US); Deepanshu Dutta, Freemont, CA (US); Zhenming Zhou, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/019,141

(22) Filed: Jun. 26, 2018

(65) Prior Publication Data

US 2019/0392894 A1    Dec. 26, 2019

(51) Int. Cl.
| | | |
|---|---|---|
| *G11C 16/04* | (2006.01) | |
| *G11C 11/56* | (2006.01) | |
| *G11C 16/26* | (2006.01) | |
| *G11C 16/24* | (2006.01) | |
| *G11C 16/34* | (2006.01) | |
| *H01L 27/11556* | (2017.01) | |
| *G11C 16/30* | (2006.01) | |
| *H01L 27/11582* | (2017.01) | |

(52) U.S. Cl.
CPC ...... *G11C 11/5642* (2013.01); *G11C 11/5628* (2013.01); *G11C 11/5671* (2013.01); *G11C 16/0483* (2013.01); *G11C 16/24* (2013.01); *G11C 16/26* (2013.01); *G11C 16/30* (2013.01); *G11C 16/3459* (2013.01); *H01L 27/11556* (2013.01); *H01L 27/11582* (2013.01); *G11C 16/0408* (2013.01); *G11C 16/0466* (2013.01); *G11C 2211/5621* (2013.01)

(58) Field of Classification Search
CPC . G11C 11/5642; G11C 11/5671; G11C 16/30; G11C 16/0483; G11C 11/5628; G11C 16/3459; G11C 16/24; G11C 16/26; G11C 16/0466; G11C 16/0408; G11C 2211/5621; H01L 27/11582; H01L 27/11556
USPC .................................................. 365/185.03
See application file for complete search history.

(56) References Cited

U.S. PATENT DOCUMENTS

| | | | |
|---|---|---|---|
| 4,716,549 A | 12/1987 | Nakano et al. | |
| 6,809,949 B2 * | 10/2004 | Ho | G11C 11/22 365/145 |
| 7,405,975 B2 | 7/2008 | Hosono | |
| 7,573,775 B2 | 8/2009 | Fallah et al. | |
| 7,782,681 B2 | 8/2010 | Kim et al. | |
| 8,154,927 B2 * | 4/2012 | Lee | G11C 16/28 365/185.02 |
| 8,724,395 B2 | 5/2014 | Park et al. | |
| 9,236,139 B1 | 1/2016 | Lai et al. | |
| 9,286,987 B1 | 3/2016 | Dong et al. | |
| 9,336,892 B1 | 5/2016 | Chen et al. | |

(Continued)

*Primary Examiner* — Tha-O H Bui
(74) *Attorney, Agent, or Firm* — Vierra Magen Marcus LLP

(57) ABSTRACT

A memory system includes a sense system configured to control parasitic noise sources by increasing selected bit line or channel voltages during sense stages. The increase may be tied to a triggering threshold voltage level. That is, while performing a memory operation, the sense system may increase the selected bit line voltage level dependent on a reference voltage level or memory state associated with a sense stage being above the triggering threshold level.

20 Claims, 23 Drawing Sheets

(56) References Cited

U.S. PATENT DOCUMENTS

| | | |
|---|---|---|
| 9,691,473 B2 | 6/2017 | Yang et al. |
| 2005/0083735 A1* | 4/2005 | Chen ..................... G11C 16/10 |
| | | 365/185.17 |
| 2005/0232012 A1* | 10/2005 | Park .................. G11C 16/0483 |
| | | 365/185.17 |
| 2006/0221694 A1 | 10/2006 | Cernea et al. |
| 2008/0247239 A1 | 10/2008 | Nguyen et al. |
| 2008/0304316 A1* | 12/2008 | Mokhlesi ............... G11C 16/26 |
| | | 365/185.2 |
| 2009/0059660 A1 | 3/2009 | Lee et al. |
| 2010/0074014 A1 | 3/2010 | Dunga et al. |
| 2013/0208545 A1 | 8/2013 | Lee |
| 2014/0056069 A1 | 2/2014 | Park et al. |
| 2014/0169093 A1 | 6/2014 | Parat et al. |
| 2014/0233327 A1 | 8/2014 | Chen et al. |
| 2014/0269070 A1 | 9/2014 | Hsiung et al. |
| 2015/0092488 A1 | 4/2015 | Wakchaure et al. |
| 2015/0179267 A1 | 6/2015 | Srinivasan et al. |
| 2015/0279472 A1 | 10/2015 | Jones |
| 2015/0294717 A1 | 10/2015 | Vimercati et al. |
| 2016/0086675 A1 | 3/2016 | Ray et al. |
| 2016/0093384 A1 | 3/2016 | Lee |

\* cited by examiner

Program Operation with Program-Only Cycles

PARASITIC NOISE CONTROL DURING SENSE OPERATIONS

BACKGROUND

Memory system that utilize charge trap technology include memory cells that trap or store charge in or below their gates in response to program pulses. Different amounts of charge may change the threshold voltage levels of the memory cells, allowing them to store different data values. One problem with existing charge trap technology is that the charge supplied by program pulses can get trapped in other locations of blocks besides the memory cells. These other locations add or create noise in the blocks, degrading a memory system's ability to verify and read memory cells. Ways to bias the memory cells during verify and read operations that reduce or minimize the noise may be desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1A:
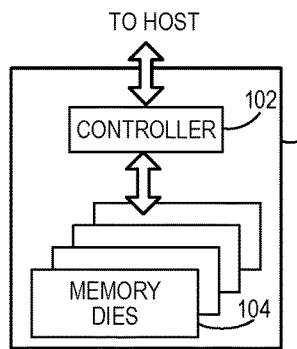
FIG. 1A is a block diagram of an example memory system.

The following embodiments describe apparatuses, devices, systems, circuits, and methods for setting selected bit line voltage levels dependent on reference voltage levels and/or memory states associated with sense stages in order to control parasitic noise sources. In one embodiment, a circuit includes: a memory cell structure including a plurality of memory cells; a sense circuit configured to sense a threshold voltage of a memory cell relative to a reference voltage level for a sense operation; a bit line coupled to the memory cell; and a bit line voltage supply circuit configured to supply a bit line voltage to the bit line at a level dependent on the reference voltage level.

In some embodiments, the bit line voltage supply circuit is configured to supply the bit line voltage at a high level of a plurality of levels in response to the reference voltage level being above a triggering threshold voltage level.

In some embodiments, the bit line voltage supply circuit is configured to supply the bit line voltage at a low level of a plurality of levels in response to the reference voltage level being below a triggering threshold voltage level.

In some embodiments, the bit line voltage supply circuit is configured to apply the bit line voltage at a high level of a plurality of levels during sense stages associated with at least one memory state above a triggering threshold voltage level, and to apply the bit line voltage at a low level of a plurality of levels during sense stages associated with at least one memory state below the triggering threshold voltage level.

In some embodiments, the at least one memory state above the triggering threshold voltage level comprises a memory state G of a three bits-per-cell storage scheme.

In some embodiments, the bit line voltage includes a selected channel voltage, and the bit line voltage supply circuit is configured to apply the selected channel voltage dependent on the reference voltage level.

In some embodiments, the reference voltage level is associated with one of a plurality of sense stages of a memory operation.

In some embodiments, the sense stage includes a verify stage.

In some embodiments, the sense stage includes a read stage.

In some embodiments, the bit line voltage supply circuit is configured to supply the bit line voltage at three different levels during three different sense stages of a memory operation.

In some embodiments, the bit line voltage supply circuit is further configured to supply the bit line voltage dependent on a height of a word line coupled to the memory cell.

In some embodiments, the bit line voltage supply circuit is configured to supply the bit line voltage at different levels dependent on different reference voltage levels during memory operations for selected memory cells coupled to word lines below a height threshold, and to supply the bit line voltage at a same level independent of the different reference voltage levels during memory operations for selected memory cells coupled to at least one word line at or above the height threshold.

In some embodiments, the height threshold comprises an edge word line.

In another embodiment, a circuit includes: a memory cell structure comprising a plurality of memory cells, and a sense controller. The sense controller is configured to: identify a memory state associated with a sense operation to sense a response of a memory cell coupled to a bit line, and control a parasitic noise source during the sense operation dependent on the memory state being above a triggering threshold voltage level.

In some embodiments, the sense controller is configured to increase a selected channel voltage from a low level to a high level to control the parasitic noise source in response to the memory state being above the triggering threshold level.

In some embodiments, the sense controller is configured to set the selected channel voltage to the low level in response to the memory state being below the triggering threshold level.

In some embodiments, the memory state comprises a memory state G of a three bits-per-cell storage scheme.

In some embodiments, the sense controller is configured to control the parasitic noise source dependent on the memory state being above the triggering threshold level in response to the memory cell coupled to a selected word line below a height threshold.

In another embodiment, a system includes a block including a plurality of word line layers, a group of memory cells disposed in one of the plurality of word line layers, a plurality of sense circuits configured to sequentially perform a plurality of sense operations on the group of memory cells, and a sense controller configured to increase a selected bit line voltage level in response to a transition from one sense operation to another sense operation, where the another sense operation senses at a higher threshold voltage level than the one sense operation.

In some embodiments, the transition crosses a triggering threshold voltage level.

In another embodiment, a method includes: identifying, with a sense controller, a first bit line voltage for a first sense stage of a sequence of sense stages; outputting, with a bit line voltage supply circuit, the first bit line voltage to a first selected bit line during the first sense stage; identifying, with the sense controller, a second bit line voltage for a second sense stage of the sequence of sense stages; and outputting, with the bit line voltage supply circuit, a second bit line voltage to a second selected bit line during the second sense stage, where the second bit line voltage is higher than the first bit line voltage.

In another embodiment, a circuit includes: a memory cell structure including a plurality of memory cells; a means for sensing a threshold voltage of a memory cell relative to a reference voltage level for a sense operation; and a means for supplying a bit line voltage to the bit line at a level dependent on the reference voltage level.

Other embodiments are possible, and each of the embodiments can be used alone or together in combination. Accordingly, various embodiments will now be described with reference to the attached drawings.

FIG. 1A is a block diagram illustrating a memory system 100. The memory system 100 may include a controller 102 and memory that may include or be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure the it is operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s)s 104, even if a single channel is shown in the drawings.

Figure 1B:
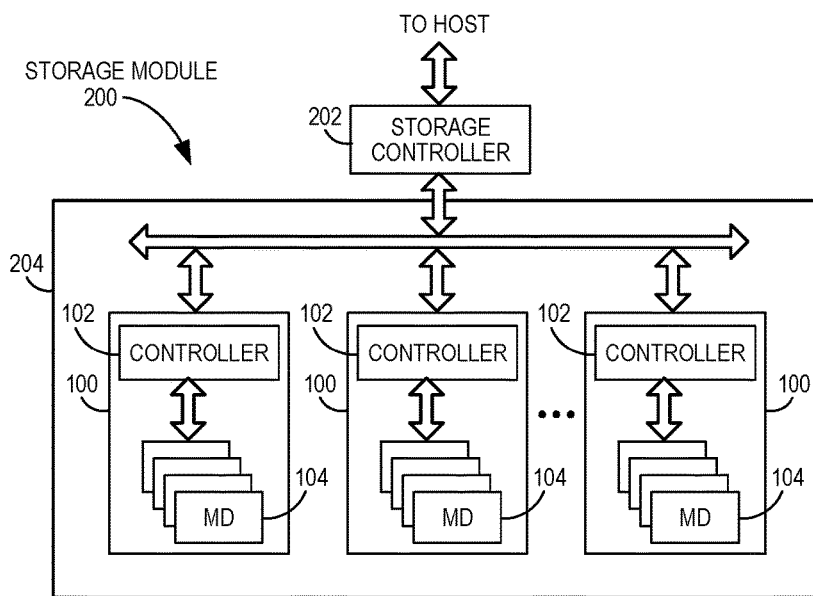
FIG. 1B is a block diagram of an example storage module that includes a plurality of memory systems.

FIG. 1B illustrates a storage module 200 that includes a plurality of non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
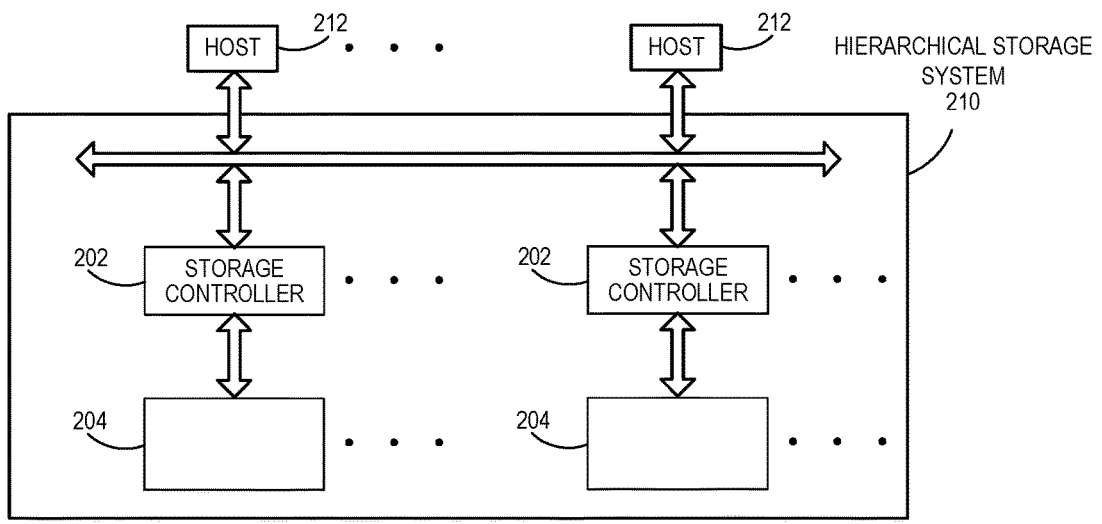
FIG. 1C is a block diagram of an example hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
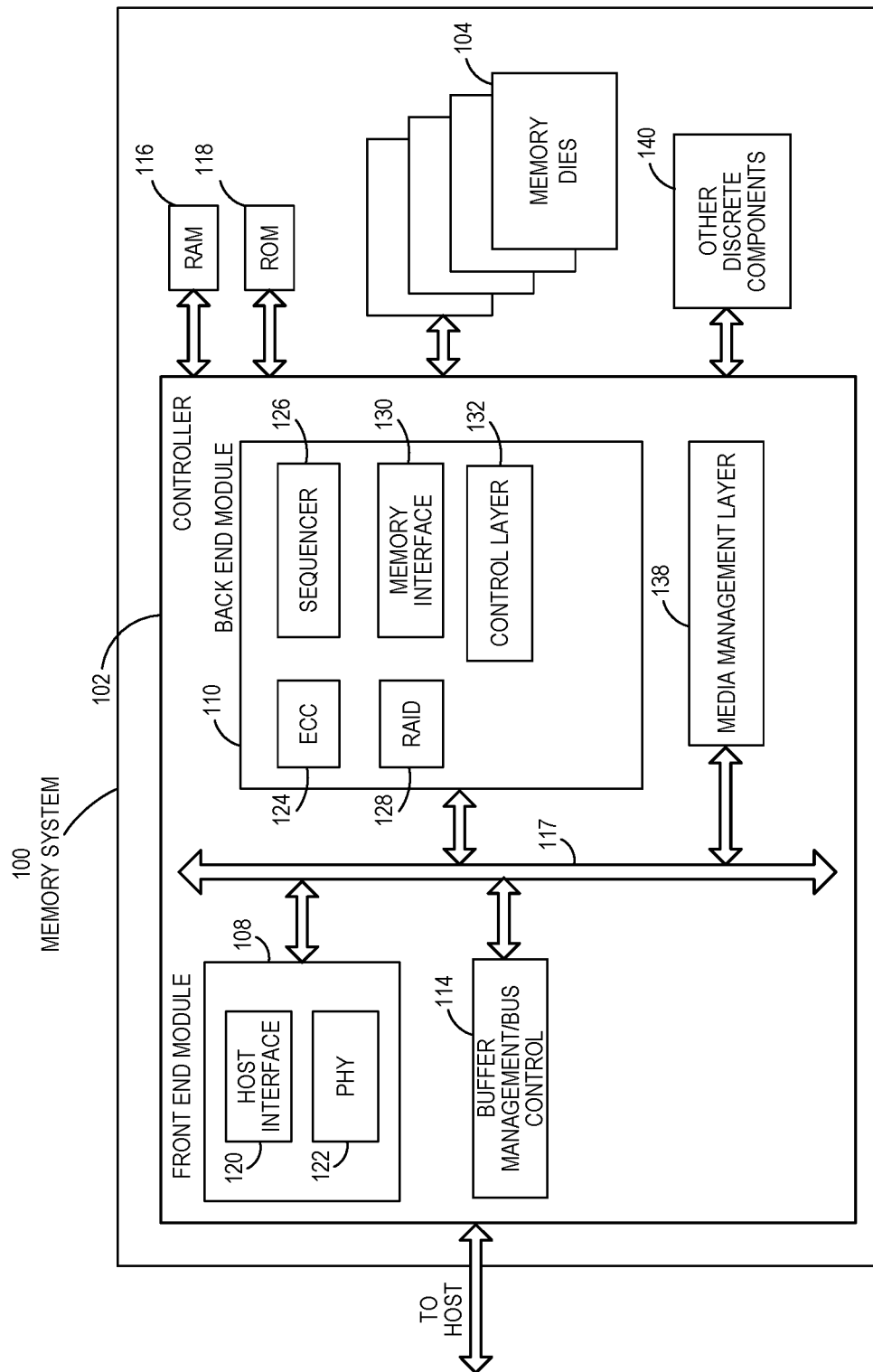
FIG. 2A is a block diagram of an example configuration of components of a controller of the memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138 that performs certain memory management functions such as wear leveling of memory cells of the memory dies 104, address management, and facilitates folding operations. Other memory management functions may be possible. The non-volatile memory system 100 may also include other discrete components 140, such as external electrical interfaces, external RAM, resistors, capacitors, or other components that may interface with the controller 102. In alternative embodiments, one or more of the RAID module 128, media management layer 138 and buffer management/bus controller 114 are optional components that may not be necessary in the controller 102.

Figure 2B:
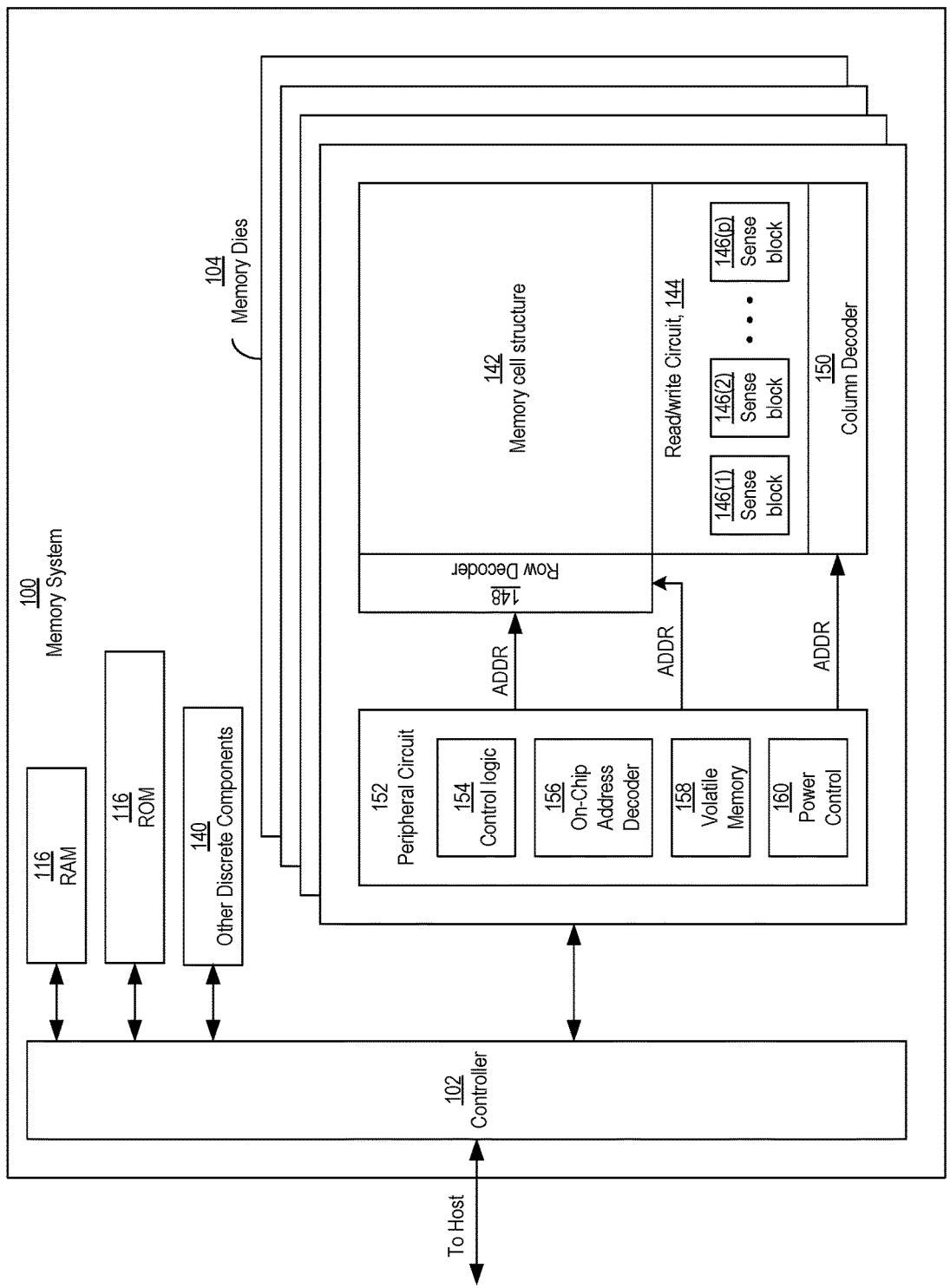
FIG. 2B is a block diagram of an example configuration of components of a memory die of the memory system of FIG. 1A.

FIG. 2B is a block diagram of an example configuration of components of a memory die 104 in more detail. The memory die 104 may include a memory cell structure 142 that includes a plurality of memory cells, otherwise or interchangeably referred to as memory elements. A memory cell is an element or component that stores a unit of data having an n-bit data value, where n is on or more. Any suitable type of memory can be used for the memory cells of the memory cell structure 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group. Alternatively, memory cells may be configured so that each element is individually accessible, e.g., a NOR memory array. NAND and NOR memory configurations are exemplary, and memory cells may be otherwise configured.

A plurality of memory cells that form the memory cell structure 142 of a memory die may be located within and/or over a substrate. The substrate may be a wafer over or in which the layer of the memory cells are formed or it may be a carrier substrate which is attached to the memory cells after they are formed. As a non-limiting example, the substrate may include a semiconductor and/or be made of a semiconductor material, such as silicon.

In addition, a plurality of memory cells that form the entire memory cell structure 142 or at least a portion of the memory cell structure 142, may be arranged in two dimensions or in three dimensions. A plurality of memory cells arranged in two dimensions is referred to as a two-dimensional (2-D) memory cell structure. A plurality of memory cells arranged in three dimensions is referred to as a three-dimensional (3-D) memory cell structure.

In a two-dimensional memory cell structure, the memory cells are arranged in a single plane or a single memory device level. Typically, in a two dimensional memory cell structure, the memory cells are arranged in a plane (e.g., in an x-y direction plane) that extends substantially parallel to a major surface of a substrate that supports the memory cells.

In a three-dimensional memory cell structure, the memory cells are arranged so that memory cells occupy multiple planes or multiple memory device levels (e.g., multiple x-y direction planes), thereby forming a structure in three dimensions (i.e., in the x, y and z directions, where the z direction is substantially perpendicular to and the x and y directions are substantially parallel to the major surface of the substrate). When configured as a three-dimensional memory cell structure, the memory cells extend up or away from the major surface of the substrate.

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the z direction) with each column having multiple memory cells in each column. The columns may be arranged in a two dimensional configuration, e.g., in an x-y plane, resulting in a three-dimensional arrangement of memory cells, with the memory cells on multiple vertically stacked memory planes. Other configurations of memory cells in three dimensions can also constitute a three dimensional memory array.

In at least some example configurations, a two-dimensional or a three-dimensional memory cell structure may be in the form of or configured as an ordered array (or just array). One type of an array is an orthogonal array, which is a matrix-like structure that includes rows and columns. The memory cells are arranged in the rows and columns. At the intersection of a row and a column is a memory cell. However, in other configurations, the memory cells may be arrayed in non-regular or non-orthogonal configurations.

Figure 3A:
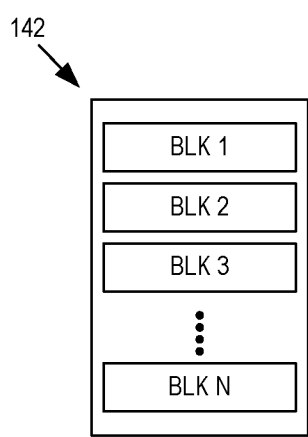
FIG. 3A is a block diagram of a memory cell structure organized into blocks.

Referring to FIG. 3A, the memory cells 142 located on a single memory die 104 may be organized into an N-number of blocks, extending from a first block BLK 1 to an Nth block BLK N. A block is a minimum unit of erase of a memory die 104. Memory cells that are part of the same block are erased at the same time and/or as part of a same erase operation.

Figure 3B:
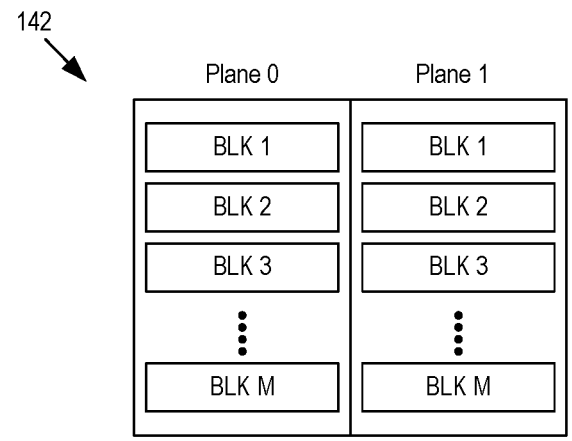
FIG. 3B is a block diagram of a memory cell structure organized into blocks in different memory planes.

Referring to FIG. 3B, for some example configurations, the N-number of blocks located on a single memory die 104 are organized into a plurality of memory planes (or just planes). FIG. 3B shows an example configuration where the blocks are organized into two memory planes, including a first memory plane Plane 0 and a second memory plane Plane 1. Configurations that include more than two memory planes may be possible. In FIG. 3B, each memory plane is shown as including an M-number of blocks, extending from a first block BLK 1 to an Mth block BLK M. In at least some example configurations, blocks that are part of the same plane may be oriented in and/or form a column or a one-dimensional array of blocks, although other configurations of blocks in a single plane may be possible.

The memory cells of a block may be arranged two-dimensionally in a two-dimensional (2-D) memory array or three-dimensionally in a three-dimensional (3-D) memory array. A two-dimensional block is a block that has memory cells arranged two-dimensionally. A three-dimensional block is a block that has memory cells arranged three-dimensionally.

Figure 4A:
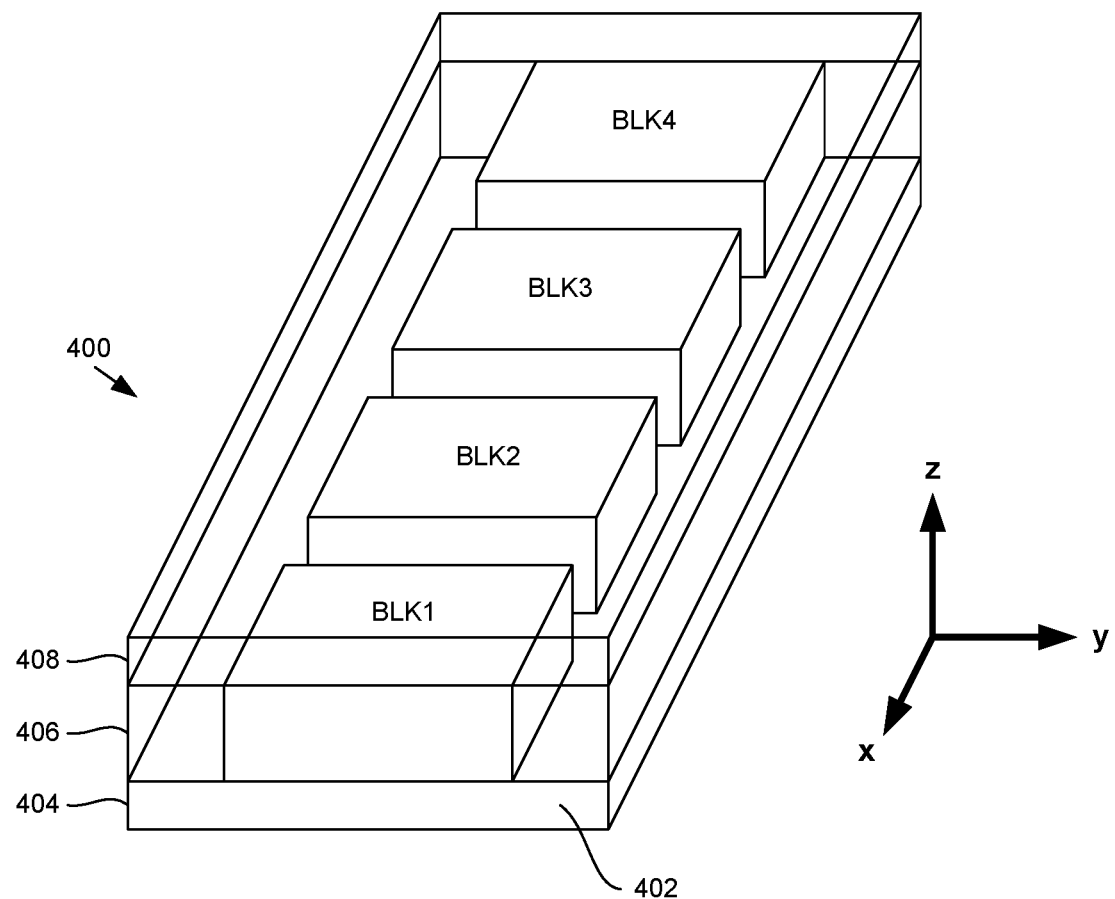
FIG. 4A is a perspective view of at least a portion of the memory die of FIG. 2B that includes a plurality of three-dimensional blocks.

FIG. 4A shows a perspective view of at least a portion of a memory die 104 that includes a set or a plurality of three-dimensional blocks 400, which may represent at least a portion of the memory cell structure 142 of FIG. 2B. For simplicity, the plurality of blocks 400 is shown as including four blocks, BLK1, BLK2, BLK3, and BLK4. In actual implementation, a given memory cell structure 142 of a memory die 104 may include several more blocks than four, such as on the order of hundreds, thousands, or tens of thousands of blocks. In a particular example configuration, one plane of blocks includes 2,000 blocks.

The blocks 400 are located or disposed on a substrate 402 of the memory die 104. The substrate 402 may be part of a lower level or region 404 of the memory die 104 that carries or includes circuitry under the blocks 400, along with one or more lower metal layers patterned to form conductive paths that carry or supply signals or voltages output from the circuitry, such as those used to perform memory operations (read, program, sense, erase, e.g.).

The blocks 400 are disposed in an intermediate level or region 406 (also referred to as a block level or region, or an array level or region) of the memory die 104 in between the lower region 404 and an upper level or region 408 of the memory die 104. The upper region 408 may include one or more upper metal layers patterned in the form of conductive paths that carry or supply signals or voltages output from the circuitry.

The substrate 402 is generally a planar structure having opposing planar surfaces. Herein, the components on a memory die 104 can be physically described with reference to a three-dimensional Cartesian coordinate system having an x-axis, a y-axis, and a z-axis. The z-axis is the axis that extends perpendicular to the planar surfaces of the substrate 402. In general, the components on a memory die 104 are disposed on and/or extend from one of the planar surfaces in a z-direction that is parallel with the z-axis. The terms "above" and "below" as well as other terms such as "top" and "bottom" and "upper" and "lower" are used herein to describe relative positioning of components of the memory die 104 along or with reference to the z-axis. For example, the blocks 400 are "above" the substrate 402, and the substrate 402 is part of the lower region 404 that is "below" the blocks 400. In addition, the upper region 408 is a region of the memory die 104 "above" both the blocks 400 and the substrate 402. Components of the memory die 104 disposed in the upper region 408 are farther away in the z-direction from the substrate 402 than components of the blocks 400. In general, for two components on a given memory die 104, where the first component is "above" the second component, the first component is positioned or disposed farther in the z-direction from the substrate 402 than the second component. In addition, where the first component is "below" the second component, the first component is positioned or disposed closer in the z-direction to the substrate 402 than the second component.

The terms "top" and "bottom" are also used to refer to the relative positioning of components of the memory die 104 in the z-direction and/or along the z-axis. In general, "bottom" components are positioned or disposed closer in the z-direction to the substrate 402 than "top" components, and "top" components are positioned or disposed farther in the z-direction from the substrate 402 than "bottom" components. In this context, a memory die 104 may include one or more top metal layers disposed in the upper region 408 and one or more bottom metal layers disposed in the lower region 404. In general, the bottom metal layers are positioned or disposed closer in the z-direction to the substrate 402 than the top metal layers, and the top metal layers are positioned or disposed farther in the z-direction from the substrate 402 than the bottom metal layers.

Although the terms "upper" and "lower," "above" and "below," and "top" and "bottom" are used to describe the relative position of components on a memory die 104, they should not be construed as limiting the relative positioning of the components since a memory die 104, or the memory system 100 as a whole, can be oriented in any of various positions.

With respect to the components of a block, a block includes a plurality of bias elements and a plurality of control lines. A bias element is a component or unit of a block that receives, is biased with, and/or that responds to a bias. A bias, as used in conjunction with a bias element of a block, is a voltage, a current, a plurality of voltages, a plurality of currents, or a combination of at least one voltage and at least one current that is applied to and/or received by the bias element to cause a response from the bias element or configure the bias element in a particular state. A bias is applied or supplied to the bias element, or the bias element is biased with the bias, at one or more levels to induce a response or configure the bias element in a particular state in order for a memory operation to be carried out.

The plurality of bias elements of a block may all be of a single type or may each be one of a plurality of different types. Bias elements of different types may perform different functions in the block and/or may be biased with different biases at different levels during the memory operations.

One type of bias element is a memory cell. Memory cells that are part of the same block are referred to as a block of memory cells. Other types of bias elements may be possible, depending on the memory technology. In NAND technology, other types bias elements may include dummy cells, drain select gate transistors (referred to as SGD transistors), and source select gate transistors (referred to as SGS transistors). At least with NAND technology, dummy cells are memory cells that do not store data from a host, and are disposed coplanar with dummy word line layers that shield memory cells and word line layers from certain edge effects. SGD transistors and SGS transistors may be configured to enabled (turn on) and disabled or inhibited (turn off), or otherwise configured in conductive and non-conductive states, at certain time and/or in response to certain biases to allow memory operations to be performed—e.g., to allow data to be programmed into, read from, or erased from the memory cells. Bias element types other than or in addition to memory cells, dummy cells, SGD transistors, and/or SGS transistors may be possible.

In addition, a control line of a block is a conductive structure, element, or component of a block that supplies, applies, or outputs at least a part of a bias (such as a single voltage or a single current) to one or more bias elements of a block and/or that biases the one or more bias elements with at least part of the bias. In at least some example configurations, a control line functions as a contact line, in that it is the conductive line that physically extends to and contacts the one or more bias elements it biases, such as by contacting and/or forming at least a part of the electrodes or terminals of the bias element that it biases.

The control lines of a block may be organized, arranged, characterized, divided, or configured into a plurality of different types of control lines. The control lines may be organized into types by the way that they bias the bias elements. For example, control lines of the same type may bias the bias elements in the same way, such as by biasing type of bias elements and/or the same types of terminals of the bias elements.

For NAND technology, the control lines of a block may be organized into three main types, including control gate lines, bit lines, and source lines. A control gate line (at least for NAND technology) is a control line that applies a control gate voltage to one or more control gate terminals (or just control gate) of one or more bias elements, and/or that biases one or more control gate terminals of one or more bias elements with a control gate voltage.

A bit line (at least for NAND technology) is a control line that applies a bit line voltage to one or more drain terminals (or just drain) of one or more bias elements, and/or that biases one or more drain terminals of one or more bias elements with a bit line voltage. In this context, the bit line voltage may alternatively be referred to as a drain voltage, where a bit line is a control line that applies a drain voltage to one or more drain terminals of one or more bias elements. In particular example configurations, a bit line biases drain terminals by applying its bit line voltage to one or more drain ends or sides of one or more channel element groups and/or associated channels, and/or by biasing one or more drain ends or sides of one or more channel element groups and/or associated channels with a bit line voltage. In this context, a bit line voltage may alternatively be referred to as a drain-side channel voltage (or just drain-side voltage). Herein, the terms bit line voltage, drain voltage, drain-side voltage, and drain-side channel voltage are used interchangeably, at least as those voltages pertain to NAND technology, unless expressly described otherwise. Channel element groups, channels, and their drain ends are described in further detail below.

A source line (at least for NAND technology) is a control line that applies a source line voltage to one or more source terminals (or just source) of one or more bias elements, and/or that biases one or more source terminals of one or more bias elements with a source line voltage. In this context, the source line voltage may alternatively be referred to as a source voltage, where a source line is a control line that applies a source voltage to one or more source terminals of one or more bias elements. In particular example configurations, a source line biases source terminals by applying its source line voltage to one or more source ends or sides of one or more channel element groups and/or associated channels, and/or by biasing one or more source ends or sides of one or more channel element groups and/or associated channels with a source line voltage. In this context, a source line voltage may alternatively be referred to as a source-side channel voltage or (or just source-side voltage). Herein, the terms source line voltage, source voltage, source-side voltage, and source-side channel voltage are used interchangeably, at least as those voltages pertain to NAND technology, unless expressly described otherwise. Also, the source line of a block may alternatively be referred to as a cell source line CELSRC. Channel element groups, channels, and their source ends are described in further detail below.

In at least some example configurations, control gate lines of a block may be further organized, arranged, characterized, divided, or configured into a plurality of different control gate types (or sub-types). In particular, the control gate lines may be further arranged into the types of bias elements that they bias, and include word lines, dummy word lines, drain select gate lines (referred to as SGD lines), and source select gate lines (referred to as SGS lines).

A word line is a control gate line that applies a word line voltage to one or more control gates of one or more memory cells, and/or that biases one or more control gates of one or more memory cells with a word line voltage. A dummy word line is a control gate line that applies a dummy word line voltage to one or more control gates of one or more dummy cells, and/or that biases one or more control gates of one or more dummy cells with a dummy word line voltage. A drain select gate line (referred to as an SGD line) is a control gate line that applies a drain select gate voltage (referred to as a SGD line voltage) to one or more control gates of one or more SGD transistors, and/or that biases one or more control gates of one or more SGD transistors with an SGD line voltage. A source select gate line (referred to as a SGS line) is a control gate line that applies a source select gate voltage (referred to as a SGS line voltage) to one or more control gates of one or more SGS transistors, and/or that biases one or more control gates of one or more SGS transistors with an SGS line voltage.

For some example configurations of a three-dimensional block, at least one type of control line is implemented or formed as a plurality of layers. For example, in at least some 3-D NAND configurations, the control gate lines of a block are implemented or formed as layers. In general, a layer, otherwise referred to as a sheet or a plate, is a generally planar structure extending in the x-y directions perpendicular to the z-direction. A layer has opposing planar surfaces facing in opposite directions. One of the planar surfaces is a top surface that faces in the z-direction away from the substrate 402, and the other planar surface is a bottom surface that faces in the z-direction toward the substrate 402.

Herein, the terms "line" and "layer," at least as they are used to refer to control lines—except SGD lines as described in further detail below—are used interchangeably or as alternatives to each other. For example, the terms "control gate line" and "control gate layer" are used interchangeably; the terms "word line" and "word line layer" are used interchangeably; the terms "dummy word line" and "dummy word line layer" are used interchangeably; and the terms "source select gate line" (or SGS line) and "source select gate layer" (or SGS layer) are used interchangeably.

In addition, for at least for some example configurations of 3-D NAND technology, a three-dimensional block includes a stack. In general, a stack is a plurality or a collection of layers disposed on top of one another. For 3-D NAND, a stack of a block includes a plurality of control gate layers and a plurality of dielectric layers. A dielectric layer, at least when implemented with control gate layers of a stack, is a layer that electrically isolates one control gate layer from another control gate layer. In the stack, the control gate layers and the dielectric layers are arranged in an alternating manner, in that as the stack extends in the z-direction away from the substrate, the layers consecutively alternate between control gate layers and dielectric layers. In this context, a stack of a three-dimensional block is a collection of alternatingly disposed control gate layers and dielectric layers.

A stack of a three-dimensional block includes outer surfaces and edges as defined by the side surfaces and edges of the layers, as well as a top surface of a top-most layer of the stack and a bottom surface of a bottom-most layer of the stack. The outer surfaces and edges of the stack, in turn, define an outer boundary of the stack. The bias elements of the three-dimensional block are three-dimensionally arranged within the outer boundary. In this context, the bias elements of the three-dimensional block are referred to as being disposed in or within the stack.

In addition, at least for some example configurations, the bias elements of a three-dimensional block are disposed coplanar (in the x-y direction) with control gate layers. In particular, the bias elements are coplanar with the control gate layers by which they are configured to be biased. Accordingly, memory cells configured to be biased by a particular word line layer are disposed coplanar with the particular word line layer; SGD transistors configured to be biased by a particular SGD layer are disposed coplanar with the particular SGD layer; SGS transistors configured to be biased by a particular SGS layer are disposed coplanar with the particular SGS layer; and dummy cells configured to by biased by a particular dummy word line layer are disposed coplanar with the particular dummy word line layer.

A bias element that is coplanar with and/or configured to be biased by a given control gate layer may be referred to as being disposed in, located in, and/or coupled to the given control gate layer. For example, a memory cell coplanar with and/or configured to be biased by a given word line may be referred to as being disposed in, located in, and/or coupled to the given word line layer.

In addition, at least for some example configurations of 3-D NAND technology, a three-dimensional block includes a plurality of channels. A channel is an elongate structure that extends in the z-direction through a stack of a block, around or about which bias elements of the block are formed or disposed. A bias element that is disposed or formed around or about a channel may at least partially, and in some configurations completely, encompass or surround the channel.

In addition, at least for some example configurations of 3-D NAND technology, bias elements of a block are biased by way of channels. Otherwise stated, a channel is structure of a block by which bias elements are biased. In particular, drain terminals and source terminals of bias elements are biased by way of channels. A bias element that has its source and drain terminals biased by a given channel is coupled to that given channel.

Each channel includes a respective drain end (or drain side) and a respective source end (or source side). A channel extends through a stack in the z-direction toward the substrate from its drain end to its source end. Bit lines of a block are electrically connected or coupled the drain ends of the channels, and the source line of a block is electrically connected or coupled to the source ends of the channels. In a block, a bit line applies a bit line voltage (or drain voltage or drain-side voltage or drain-side channel voltage) to the one or more drain ends of one or more channels to which it is coupled. The source line applies a source line voltage (or source voltage or source-side voltage or source-side channel voltage) to the source ends of the channels to which it is coupled.

Additionally, as used herein, a channel element group is a plurality or a collection of bias elements that are formed or disposed around or about the same channel. A given channel and a given channel element group that includes the bias elements disposed or formed around or about the given channel are referred to as being coupled to and/or associated with each other. In addition, bias elements that are part of the same channel element group are referred as being coupled to each other.

For at least some example configurations, the bias elements of a channel element group include a plurality of memory cells, at least one SGD transistor, and at least one SGS transistor. In particular example configurations, a channel element group may further include one or more dummy cells.

The channel element groups extend in the z-direction about their associated channels. Similar to the channels, the channel element groups each include respective drain ends (or drain sides) and source ends (or source sides). A channel extends in the z-direction toward the substrate from its drain end to its source end.

Drain ends of channel element groups are electrically coupled to drain ends of their associated channels. Accordingly, the bit lines are electrically connected or coupled to drain ends of channels and associated channel elements groups. A bit line is configured to apply a bit line voltage (or a drain voltage, a drain-side channel voltage, or a drain-side voltage) to drain ends of channels and associated channel element groups to which the bit line is coupled. Otherwise stated, a bit line voltage (or a drain voltage, a drain-side channel voltage, or a drain-side voltage) is a voltage that a bit line generates and that it applies to a drain end (or drain side) of a channel and/or a drain end (or drain side) of a channel element group to which it is electrically connected or coupled. During at least some memory operations, a bit line may bias one or more drain terminals of one or more bias elements by applying a bit line voltage (or a drain voltage, a drain-side channel voltage, or a drain-side voltage) to one or more drain ends of one or more channels and/or to one or more drain ends of one or more channel element groups to which it the bit line is electrically connected or coupled. Otherwise stated, during memory operations, a bit line biases one or more drain terminals of one or more bias elements with a bit line voltage (or a drain voltage, a drain-side channel voltage, or a drain-side voltage) by way of the drain ends of one or more channels and/or the drain ends of one or more channel element groups to which the bit line is coupled.

Similarly, source ends of channel element groups are electrically coupled to source ends of their associated channels. Accordingly, the source line is electrically connected or coupled to source ends of channels and associated channel elements groups. The source line is configured to apply a source line voltage (or a source voltage, a source-side channel voltage, or a source-side voltage) to source ends of channels and associated channel element groups to which the source line is coupled. Otherwise stated, a source line voltage (or a source voltage, a source-side channel voltage, or a source-side voltage) is a voltage that a source line generates and that it applies to a source end (or source side) of a channel and/or a source end (or source side) of a channel element group to which the source line is electrically connected or coupled. During at least some memory operations, a source line may bias one or more source terminals of one or more bias elements by applying a source line voltage (or a source voltage, a source-side channel voltage, or a source-side voltage) to one or more source ends of one or more channels and/or to one or more source ends of one or more channel element groups to which it the source line is electrically connected or coupled. Otherwise stated, during memory operations, a source line biases one or more source terminals of one or more bias elements with a source line voltage (or a source voltage, a source-side channel voltage, or a source-side voltage) by way of the source ends of one or more channels and/or the source ends of one or more channel element groups to which the source line is coupled.

In addition, bias elements of a channel element group extend in the z-direction around or about the same channel. Each bias element of the channel element group is disposed coplanar with one of the plurality of control gate layers of the block. In this regard, each control gate layer of the block is configured to bias a control gate of a respective one of the plurality of bias elements of the channel element group.

In addition, for at least some example configurations, the channel element groups of a block may have the same number of bias elements, the same combination of bias element types, and the same number of bias elements of each bias element type. Also, a bias element order in which the bias elements of their respective bias element types extend in the z-direction away from the substrate is the same among the channel element groups of a block. At least for some example configurations of 3-D NAND technology, the bias element order of the bias elements of a channel element group, starting closest to the substrate and moving away from the substrate in the z-direction, includes one or more SGS transistors followed by one or more source-side dummy cells, followed by a plurality of memory cells, followed by one or more drain-side dummy cells, and followed by one or more SGD transistors. Other bias element orders may be possible.

A control gate layer order of the control gate layers and their respective types may match or correspond to the bias element order of a block. Accordingly, at least for some example configurations of 3-D NAND technology, a control gate layer order of a plurality of control gate layers of a block, starting closest to the substrate and moving away from the substrate in the z-direction, includes one or more SGS layers, followed by one or more source-side dummy word line layers, followed by a plurality of word line layers, followed by one or more drain-side dummy word line layers, and followed by one or more SGD layers.

Figure 4B:
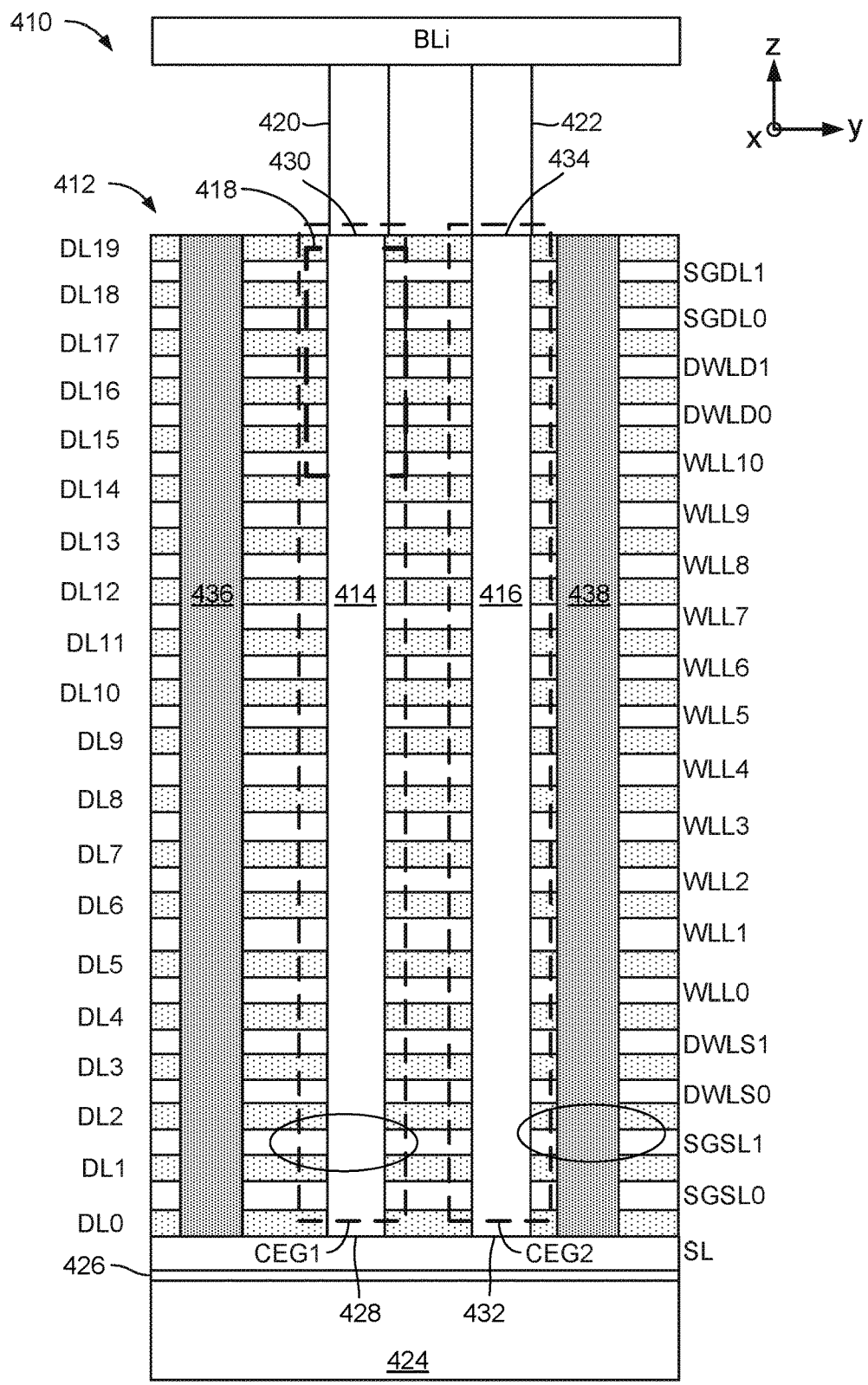
FIG. 4B is a cross-sectional view of a portion of one of the blocks of FIG. 4A.

In further detail, FIG. 4B shows a cross-sectional view of a portion of a block 410, which may be representative of one of the blocks 400 of FIG. 4A. The block 410 includes a stack 412 of alternating control gate layers and dielectric layers (DL). In addition, the portion shown in FIG. 4B includes two channels (or memory holes) extending through the layers, including a first channel 414 and a second channel 416. Bias elements forming two memory channel element groups around the two channels 414, 416 are identified by dotted boxes in FIG. 4B. In particular, bias elements forming a first channel element group CEG1 around the first channel 414 are identified by a dotted box labeled CEG1, and bias elements forming a second channel element group CEG2 around the second memory hole 416 are identified by a dotted box labeled CEG2. Further details of bias elements and example materials to form the elements and the channels are described in further detail below with respect to FIG. 4C with reference to a particular region 418 of the first channel element group CEG1 and associated first channel 414.

For purposes of illustration, in FIG. 4B, the first and second channel element groups CEG1, CEG2 formed around the first and second channels 414, 416 are both electrically connected to an ith bit line BLi. In actual implementation, a block may include hundreds or thousands of bit lines. An arrangement of channels and associated channel element groups of a block may determine which channels and channel element groups are electrically connected to which bit lines. Among the plurality of channels and channel element groups of a block, certain combinations of channels and associated channel element groups are electrically connected to the same bit line as each other, while certain other combinations of channels and associated channel element groups are electrically connected to different bit lines from each other.

In addition, a given channel element group may be electrically connected to a given bit line by way of its associated channel and a conductive via electrically connecting the associated channel with the bit line. For example, in FIG. 4B, the first channel element group CEG1 is electrically connected to the ith bit line BLi by way of the first channel 414 and a conductive via 420 that electrically connects the first channel 414 with the ith bit line BLi. The second channel element group CEG2 is electrically connected to the ith bit line BLi by way of the second channel 416 and a conductive via 422 that electrically connects the second channel 416 with the ith bit line BLi. Other ways of electrically connecting bit lines with channel element groups may be possible.

The block 410 may further include or be disposed on a substrate 424. An insulating film 426 may be formed on the substrate 424, and a source line SL may be formed or disposed on a bottom-most layer of the stack 412.

In addition, in the example configuration shown in FIG. 4B, each channel 414, 416 includes a source end connected to the source line SL, and a drain end connected to its associated conductive via. In FIG. 4B, the first channel 414 includes a source end 428 connected to the source line SL, and a drain end 430 connected to the conductive via 420. Similarly, the second channel 416 includes a source end 432 connected to the source line SL, and a drain end 434 connected to the conductive via 422.

In addition, at least some example configurations, the block 410 may further include vertical interconnects (e.g., metal-filled slits) extending through the stack 412 that connect the source line SL to a conductive line above the stack 412, such as a conductive line in one of the metal layers in the upper region 408 (FIG. 4A). For purposes of illustration, FIG. 4B shows two interconnects 436, 438 extending through the stack 412.

In addition, in the example configuration in FIG. 4B, for purposes of illustration, each of the channel element groups include two SGS transistors, two source-side dummy cells, eleven memory cells, two drain-side dummy cells, and two SGD transistors. Accordingly, the control gate layers of the stack 412 include: two SGS layers, including a first SGS layer SGSL0 and a second SGS layer SGSL1; two source-side dummy word line layers, including a first source-side dummy word line layer DWLS0 and a second source-side dummy word line layer DWLS1; eleven word line layers extending from a first word line layer WLL0 to an eleventh word line layer WLL10; two drain-side dummy word line layers, including a first drain-side dummy word line layer DWLD0 and a second drain-side dummy word line layer DWLD1; and two SGD layers, including a first SGD layer SGSL0 and a second SGD layer SGDLl1. The stack further includes twenty dielectric layers, extending from a first dielectric layer DL0 to a twentieth dielectric layer DL19, alternatingly disposed between the control gate layers.

The numbers of bias elements and their respective bias element types used for the channel element groups and the number of corresponding control gate layers in the example configuration of the block 410 in FIG. 4B are non-limiting and merely exemplary for purposes of illustration. Other numbers of bias elements for any of the bias element types, or other configurations that do not include bias elements of certain bias elements types or that include one or more bias elements of bias element types other than those shown in FIG. 4B, may be possible.

Figure 4C:
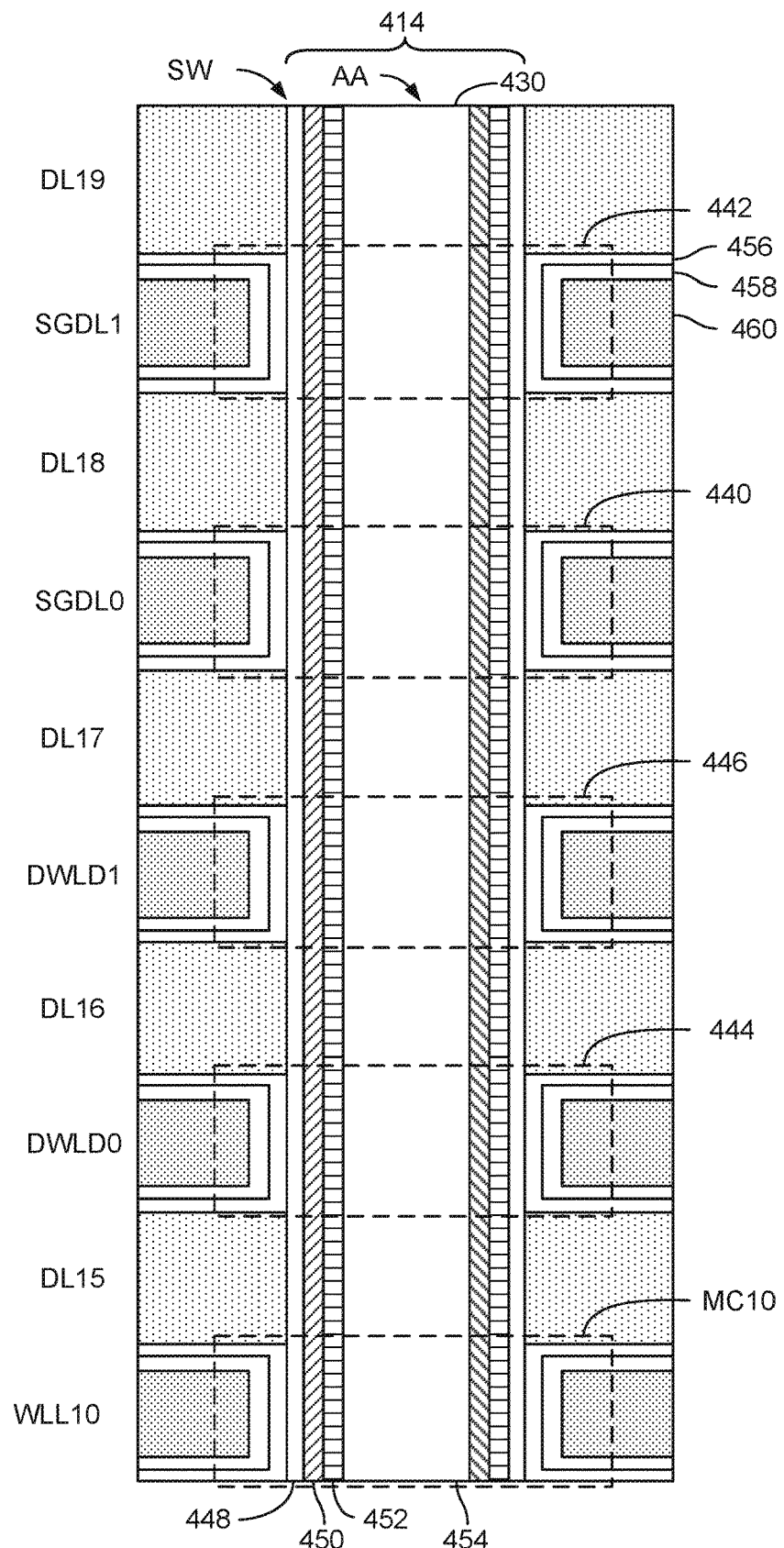
FIG. 4C is a close-up view of a region of the cross-section of FIG. 4B.

FIG. 4C is a close-up view of the region 418 of the block 410 of FIG. 4B. The materials forming the bias elements are formed at different levels of the stack 412 at the intersection of respective control gate layers and respective channels. In the example configuration of the block 410, as depicted in the close-up view of FIG. 4C, a first SGD transistor 440 and a second SGD transistor 442 are disposed below the drain end 430 of the first channel 414, and above first and second drain-side dummy cells 444, 446 and an eleventh memory cell MC10.

Physically or structurally, a channel includes a memory hole extending in the z-direction defines by a sidewall (SW). A channel further includes one or more layers of materials disposed in the memory hole and/or on the side wall, such as by using atomic layer deposition as an example. In some example configurations, as described with respect to the first channel 414, the layers of materials of a channel (which may be referred to as a column or a pillar of materials) may include a charge-trapping layer or film 448 such as silicon nitride, a tunneling layer 450, a polysilicon body or channel 452, and a dielectric core 454. In addition, in some example configurations, such as the one shown in FIG. 4C, the materials making up each of the bias elements may include a blocking oxide/block high-k material 456, a barrier metal 458, and a conductive metal 460 (e.g. Tungsten) that forms the control gates of the transistors. The materials forming the bias elements may be disposed in the same level or in the same plane as the respective control gate layers. Other configurations may use materials deposited along the sidewall (SW) and/or for the bias elements other than those shown and described with reference to FIG. 4C.

Figure 4D:
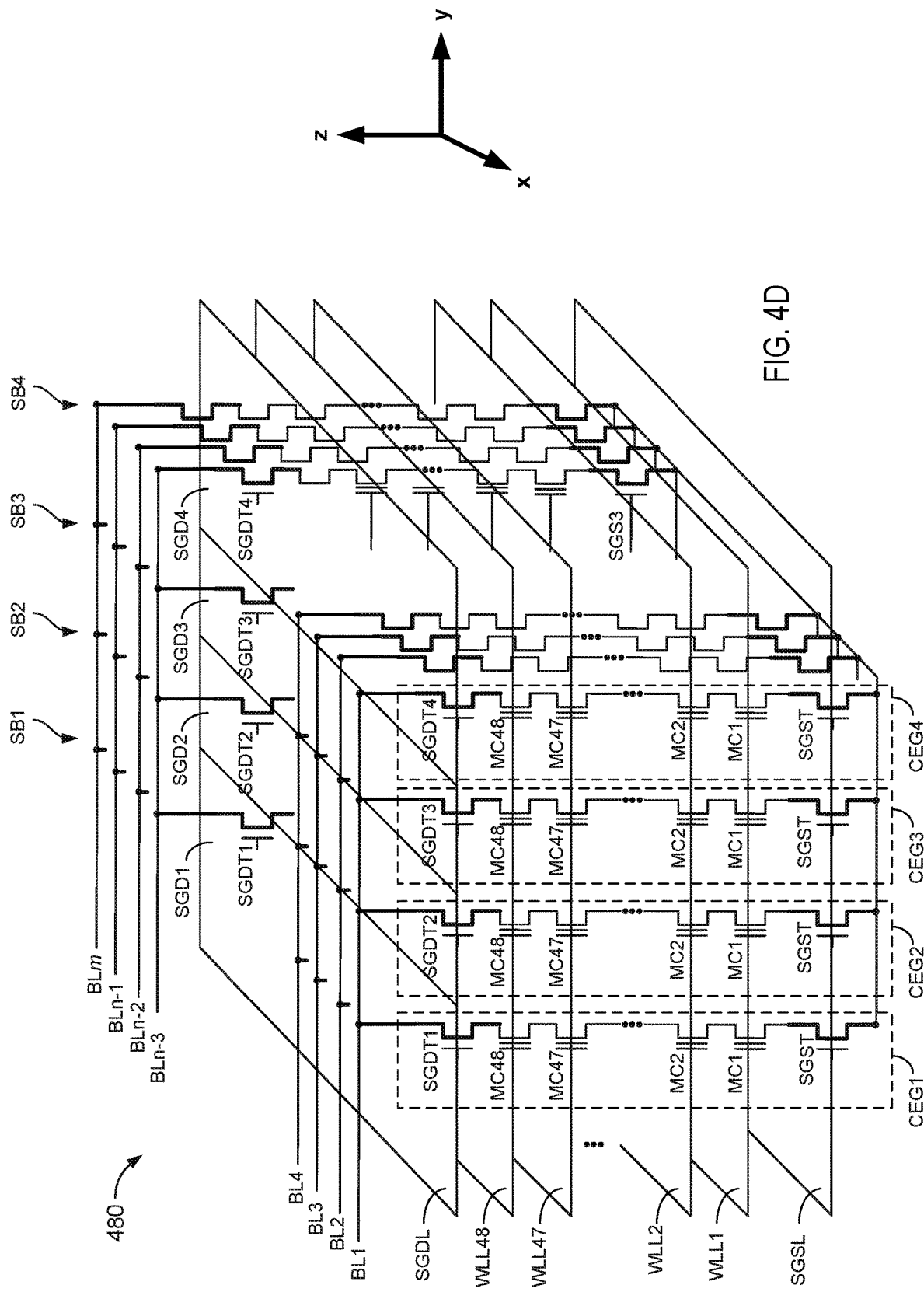
FIG. 4D is a circuit schematic diagram of a block of memory cells three-dimensionally arranged into a plurality of NAND strings.

FIG. 4D shows a circuit schematic diagram of an example configuration of a three-dimensional block 480, which may be representative of at least a portion of one of the blocks 400 of FIG. 4A and/or have the physical construction or structure as depicted in FIGS. 4B, 4C. In FIG. 4D, each bias element is represented or depicted as a transistor. In addition, memory cells are labeled MC, SGD transistors are labeled SGDT, and SGS transistors are labeled SGST. In the example block 480, each channel element group includes 50 cells, including 48 memory cells, extending from a first memory cell MC1 to a 48th memory cell MC48, one SGD transistor SGDT, and one SGS transistor SGST. Other channel element group configurations are possible, including those that include one or more source-side dummy cells, one or more drain-side dummy cells, more than one SGD transistor, and/or more than one SGS transistor, as previously described.

In accordance with the channel element group configuration in FIG. 4B, the block 480 includes 50 control gate layers, including 48 word line layers extending from a first word line layer WLL1 to a 48th word line layer WLL48, a SGD layer SGDL, and a SGS layer SGSL. As previously described, the ith memory cells MCi in each channel element group are disposed in and configured to have their respective control gates biased by the ith word line layer WLLi of the control gate layers. As examples, first memory cells MC1 of the channel element groups CEG are disposed in and configured to have their control gates biased by the first word line layer WLL1, the second memory cells MC2 are disposed in and configured to have their control gates biased by the second word line layer WLL2, and the 48th memory cells MC48 of the channel element groups CEG are disposed in and configured to have their control gates biased by the 48th word line layer WLL48. In addition, the SGD transistors of the channel element groups are disposed in and configured to have their respective control gates biased by the SGD layer SGDL, and the SGS transistors of the channel element groups are disposed in and configured to have their respective control gates biased by the SGS layer SGSL.

As depicted in FIG. 4D, the channel element groups CEG and their associated channels are two-dimensionally arranged in the x and y directions in the block 480, and electrically connected to an m-number of bit lines. In particular example configurations, the channel element groups CEG and their associated channels are two-dimensionally arranged in accordance with a channel arrangement that depends on a P-number of channel element groups and their associated channels that are connected to a single bit line. Otherwise stated, each bit line BL is configured to electrically connect to, apply a respective bit line voltage to, and/or bias with a respective bit line (channel) voltage, a unique set of a P-number of channel element groups and their associated channels.

In the example configuration of FIG. 4D, each bit line BL is configured to electrically connected to four channel element groups (i.e., P=4). Accordingly, FIG. 4D shows the first bit line BL1 electrically connected to each of a first channel element group CEG1, a second channel element group CEG2, a third channel element group CEG3, and a fourth channel element group CEG4. Each of the other two through mth bit lines BL2 to BLm are also electrically connected to a respective set of four channel element groups and their respective channels. Numbers for P other than four may be possible for various other configurations.

In some example configurations, an SGD layer may be separated or divided into a plurality of different drain select gate (SGD) sub-layers that are electrically isolated or disconnected from each other. For example, an SGD layer may be etched to remove portions of the metal forming the SGD layer in order to form a plurality of electrically isolated or disconnected SGD sub-layers.

Different SGD sub-layers of the same SGD layer may be independently and/or individually biased and/or supplied with a different one of a plurality of SGD line voltages. In turn, for a given plurality of SGD transistors disposed in the same SGD layer, each SGD sub-layer of the same SGD layer may be configured to bias the control gates of those SGD transistors disposed in its SGD sub-layer, but not the SGD transistors disposed in the other SGD sub-layers. In this way, the plurality of SGD sub-layers may be configured to independently or individually bias the different SGD transistors within their respective SGD sub-layers with a respective one of a plurality of SGD line voltages.

In addition, for example configurations that include multiple SGD layers, each SGD layer may include multiple SGD sub-layers. The number of SGD sub-layers in each SGD layer may be the same. In addition, certain combinations of SGD-sub-layers in different SGD layers may be electrically coupled together and/or supplied with the same SGD line voltage such that SGD transistors of the same channel element group have their control gates biased with the same SGD line voltage. SGD sub-layers that bias SGD transistors with the same SGD line voltage form part of the same SGD line.

As used herein, an SGD line is a conductive structure of a block that biases control gates of SGD transistors with a common or the same SGD line voltage. Accordingly, as used specifically herein for SGD layers and SGD lines, the terms "line" and "layer" are not used interchangeably. Instead, an SGD line is a single SGD sub-layer, or a collection of SGD sub-layers each part of a different SGD layer. In particular, for 3-D block configurations that include a single SGD layer, each SGD sub-layer of the SGD layer forms an entire SGD line. For 3-D block configurations that include multiple SGD layers, each SGD sub-layer forms a part of an SGD line with one or more other SGD sub-layers from one or more other SGD layers.

In addition, different SGD lines are configured to independently or separately bias different sets or groups of SGD transistors of a block with different SGD line voltages. An SGD line is configured to bias the control gates of those SGD transistors to which it is coupled or electrically connected, and not bias the control gates of those SGD transistors from which it is uncoupled or electrically disconnected. Accordingly, the SGD transistors SGDT of a block are arranged or formed into a plurality of SGDT groups. SGD transistors that are part of the same SGDT group are coupled to the same SGD line and configured to be biased by the same SGD line voltage. SGD transistors that are part of different SGDT groups are coupled to different SGD lines and configured to be biased by different SGD line voltages.

In addition, for at least some example configurations of a 3-D block, the number of SGD lines is equal to the P-number of channel element groups and associated channels that are connected to the same bit line. For example, with reference to FIG. 4D, the block 480 includes four SGD lines corresponding to the four channel element groups connected to a single bit line, including a first SGD line SGD1, a second SGD line SGD2, a third SGD line SGD3, and a fourth SGD line SGD4. Otherwise stated, the SGD layer SGDL includes four SGD lines SGD1, SGD2, SGD3, and SGD4.

In addition, the channel element groups may be arranged so that for a given set of channel element groups connected to the same bit line, each channel element group of the set has its SGD transistor SGDT coupled to a different one of the SGD lines. For example, in the block 480 of FIG. 4D, the set of four channel element groups CEG1, CEG2, CEG3, CEG4 connected to the first bit line BL1 have their respective SGD transistors connected to a different one the SGD lines SGD1, SGD2, SGD3, SGD4. In particular, the first channel element group CEG1 includes an SGD transistor SGDT1 coupled to and configured to have its control gate biased by the first SGD line SGD1, the second channel element group CEG2 includes an SGD transistor SGDT2 coupled to and configured to have its control gate biased by the second SGD line SGD2, the third channel element group CEG3 includes an SGD transistor SGDT3 coupled to and configured to have its control gate biased by the third SGD line SGD3, and the fourth channel element group CEG4 includes an SGD transistor SGDT4 coupled to and configured to have its control gate biased by the fourth SGD line SGD4.

A 3-D block may be arranged, organized, or divided into sub-blocks across the m-number of word lines based on the different SGD lines. As used herein, a sub-block is a portion of a block that has channel element groups with SGD transistors configured to be biased by the same SGD line and/or with the same SGD line voltage. A sub-block may span, such as in the x-direction, across the m-number of word lines of a block. In addition, channel element groups with SGD transistors configured to be biased by different SGD transistors and/or with different SGD line voltages are part of different sub-blocks.

The number of sub-blocks of a block may be equal to the number of SGD lines. For example, the example block 480 of FIG. 4D includes four sub-blocks (SB) equal to the number of SGD lines, including a first sub-block SB1, a second sub-block SB2, a third sub-block SB3, and a fourth sub-block SB4. The first sub-block SB1 includes those channel element groups with SGD transistors SGD1 coupled to the first SGD line SGD1 and configured to be biased with a first SGD line voltage, the second sub-block SB2 includes those channel element groups with SGD cells SGD2 coupled to the second SGD line and configured to be biased with a second SGD line voltage, the third sub-block SB3 includes those channel element groups with SGD cells SGD3 coupled to the third SGD line and configured to be biased with a third SGD line voltage, and the fourth sub-block SB4 includes those channel element groups with SGD cells SGD4 coupled to the fourth SGD line and configured to be biased with a fourth SGD line voltage.

In addition, a block of memory cells (i.e., memory cells that are part of the same block), may be arranged, organized, separated, and/or labeled on a sub-block level, or on both a sub-block level and a word line level. A plurality of memory cells MC that are part of the same sub-block is referred to as a sub-block of memory cells. Otherwise stated, a sub-block of memory cells are memory cells of channel element groups having SGD cells coupled to the same SGD line and/or configured to be biased with the same SGD line voltage.

In addition, a plurality of memory cells that are part of the same sub-block, and that are also disposed in the same word line layer and/or that are configured to have their control gates biased by the same word line and/or with the same word line voltage are referred to as a word line cell group or a string of memory cells. Otherwise stated, a word line cell group (or string) of memory cells is a plurality or a collection of memory cells coupled to the same word line layer, and that are part of channel element groups configured to be biased with the same SGD line voltage.

A single word line layer may include a plurality of word line cell groups, such that the memory cells disposed in a single word line layer are organized, arranged, or disposed into a plurality of word line cell groups (or strings). Memory cells coupled to the same word line layer but that are part of channel element groups having SGD transistors coupled to different SGD lines are part of different word line cell groups. In particular example configurations, the number of word line cell groups coupled to a single word line layer is equal to the number of SGD lines of a block. In addition, the number of memory cells of a single word line cell group may be equal to the m-number of bit lines BL1 to BLm, such that each memory cell of a word line cell group is electrically connected to a different one of the m-number of bit lines BL1 to BLm.

In addition, the memory cells of a block, or of the memory cell structure 142 generally, are configured to store data as bits or binary digits, with each bit having either a logic 0 or a logic 1 binary value. A single memory cell may be configured to store either a single bit or a plurality of bits. A bit or bits that a single memory cell stores is referred to as a data value. Otherwise stated, a data value is an n-bit binary value that a single memory cell stores, where n is the number of bits of the binary value, and where the number n is one or more. The number of possible data values that a single memory cell can store depends on the n-number of bits it is configured to store. In particular, the number of possible data values a single memory cell can store is $2^n$.

Memory cells may be referred to as single-level cells or multi-level cells depending on the number of bits they are configured to store. A single-level cell, referred to as a SLC cell (or just SLC), is a memory cell configured to store a single or one bit of data. A multi-level cell, referred to as a MLC cell (or just MLC), is a memory cell configured to store multiple (i.e., two or more) bits of data. Example numbers of bits that an MLC cell can store include 2, 3, or 4, although MLC cells that store more than 4 bits may be possible.

In general, certain collections of memory cells are configured to store the same number of bits. For example, memory cells that are part of the same word line cell group, part of the same block, or part of the same memory cell structure 142, are configured to store the same number of bits. In this context, a given collection of memory cells (e.g., memory cells of the same word line cell group, the same block, the same memory cell structure, etc.) stores data on a bits-per-cell basis. Each memory cell of the given collection stores the same number of bits-per-cell.

In addition, a memory cell structure 142, including blocks and word line cell groups of the memory cell structure 142, may store data as pages. Herein, a page is a single unit of data that a single word line cell group of memory cells stores. The number of pages that a single word line cell group stores depends on the number of bits-per-cell that the memory cells of the single word line cell group are configured to store. As examples, a word line cell group of SLC cells is configured to store a single or one page of data; a word line cell group of MLC cells configured to store two-bits-per-cell is configured to store two pages of data; and a word line cell group of MLC cells configured to store three-bits-per-cell is configured to store three pages of data.

In addition, a memory cell structure 142 may store data according to one or more storage schemes. As used herein, a storage scheme is a general plan including a predefined set of actions and a predefined set of parameters that a memory system implements to store data. A given storage scheme for a particular collection of memory cells may identify or define the number of bits-per-cell that the memory cells of the particular collection are configured to store. The components of the memory system, including the circuit components on a given memory die, are configured to perform memory operations on the particular collection in accordance with the given storage scheme in order to program data into and/or read data from the particular collection of memory cells.

Memory cells of different memory technologies may store data in accordance with different storages schemes. In addition, memory cells of the same memory technology may store data in accordance with different storage schemes. For example, memory cells of the same memory technology but located in different memory systems, or in the same memory system but in different memory dies, or in different blocks or planes of the same memory die, or even different word line layers or different word line cell groups of the same block, may store data in accordance with different storage schemes, at least with respect to the number of bits-per-cell the different memory cells are configured to store.

At least for NAND memory technology, the NAND memory cells may be configured to store data in accordance with one of multiple different storage schemes, with each storage scheme associated or identifying a different number of bits-per-cell. In at least some example configurations, some NAND memory cells may store data according to one storage scheme while other NAND memory cells store data according to a different storage scheme. Accordingly, two different collections of NAND memory cells located in different memory systems, or in the same memory system but in different dies, planes, blocks, word line layers, or word line cell groups, may store different numbers of bits-per-cell according to different storage schemes. To illustrate, one collection of NAND memory cells may be configured as SLC cells and another collection of NAND memory cells may be configured as MLC cells.

In addition, the same memory cell (or the same collection of memory cells) may be configured to store different numbers of bits-per-cell according to different storage schemes at different times. To illustrate, in one example, a memory cell may be configured as an SLC cell at one point in time, and then reconfigured as an MLC cell at a later point in time. As another example, a memory cell may be configured as an MLC cell at one point in time, and then reconfigured as an SLC cell at a later point in time. As another example, a memory cell may be configured as an MLC cell storing a first number of bits-per-cell at one point in time, and then reconfigured as an MLC cell storing a second number of bits-per-cell at a later point in time, where the first and second numbers are different from each other, with the first number being either less than or greater than the second number.

In addition, a memory cell stores data by having an associated storage parameter (alternatively or otherwise referred to as a characteristic, property, or feature) set to a level, value, magnitude, or state. The associated parameter is adjustable or variable, and can be controlled by biasing the control lines coupled to the memory cells at certain levels, at certain times, during certain memory operations, and according to certain storage schemes. Within one storage scheme defining a set of data values, a memory cell can store data at a certain one of the data values by having its storage parameter set to a level, value, magnitude, or state, or within a predetermined range of levels, values, magnitudes, or states. The level, value, magnitude, or state that the memory cell is at or set to corresponds to the data value of the set that the memory cell is storing. In addition, the memory cell can be configured to store a different value, or to change the data value of the data it is storing from one data value to another data value, by changing or adjusting the storage parameter to a different level, value, magnitude, or state.

The storage parameter that a memory cell has to store data depends on the memory technology, and can vary across different memory technologies. For NAND technology, the storage parameter is threshold voltage. At least with respect to NAND memory cells, a threshold voltage of a memory cell is a voltage applied to a control gate of the memory cell at which the memory cell becomes conductive. The level (otherwise referred to as the value or magnitude) of the threshold voltage depends on or is proportional to the amount of electrical charge that the memory cell is storing or trapping. The more charge that a memory cell is storing, the higher its threshold voltage, and the less charge that a memory cell is storing, the lower its threshold voltage. Accordingly, the data value that the memory cell is storing is set by setting the threshold voltage of the memory cell to a certain level, and the data value is adjusted or changed by changing the threshold voltage to a different level or within a different range of levels.

In addition, for NAND technology, the memory cells store data by being configured in memory states. As used herein, a memory state is an identifier that identifies a data value of data that a memory cell is storing, can store, or is intended to store. A storage scheme identifies or defines an associated plurality or set of memory states at which a memory cell can be configured. Each memory state identifies, corresponds to, and/or is associated with one of the plurality of data values identified or defined by the storage scheme. Accordingly, a memory cell configured in a given memory state is storing a data value that corresponds to the given memory state. A memory cell can store a different data value by being configured into a different memory state.

For a given storage scheme, the memory states include an erased state and one or more program states. An erased state is a memory state in which a memory cell is configured when erased. For at least some example configurations, the erased state is the memory state that all of a collection of memory cells are in at the start of a program operation to program at least some of the memory cells of the collection. A program state is a memory state that a memory cell is in upon being subjected to a program operation. At a given point in time, a memory cell may be in the erased state or one of the program states.

In addition, for a given storage scheme, each memory state has, corresponds to, or is associated with an associated range of threshold voltage levels, with each range being bounded by an upper threshold voltage level and a lower threshold voltage level. Otherwise stated, a given storage scheme may define a plurality of non-overlapping threshold voltage ranges, with each range being associated with or corresponding to a respective one of the plurality of memory states defined or identified by the given storage scheme. In turn, each range has, corresponds to, or is associated with a respective one of the data values. In this way, a storage scheme establishes a one-to-one correspondence between the threshold voltage ranges, the memory states, and the data values. Memory cells are programmed and read according to the one-to-one correspondence. That is, a memory cell configured with a threshold voltage level within a given threshold voltage range is configured in the memory state associated with the given threshold voltage range, and in turn is storing data having a data value that is associated with the given threshold voltage range and the corresponding memory state.

For particular embodiments, the erased state is associated with the lowest threshold voltage range. The program states are associated with consecutively or sequentially higher threshold voltage ranges from the range associated with the erased state.

In addition, the storage schemes may label or name the memory states in any of various ways, including alphabetically, numerically, or alphanumerically, as non-limiting examples. In particular example configurations, the erased state is called the erased state, and the program states are named with letters, numbers, or a combination thereof by associating higher letters in the alphabet or higher numbers with higher threshold voltage ranges. As illustrations, a memory state C is associated with a higher threshold voltage range than a memory state A, and a memory state 8 is associated with a higher threshold voltage range than a memory state 1. Various ways of labeling or naming memory states are possible.

In addition, memory states may be referred to as being higher memory states and lower memory states relative to each other. A first memory state is a higher memory state than a second memory state where the first memory state is associated with a higher threshold voltage range than the threshold voltage range with which the second memory state is associated. In addition, a first memory state is a lower memory state than a second memory state where the first memory state is associated with a lower threshold voltage range than the threshold voltage range with which the second memory state is associated.

In addition, the way in which the data values correspond to the memory states and/or the threshold voltage ranges may vary, and in particular embodiments, how the data values correspond to or are assigned to the memory states and/or threshold voltage ranges may depend on a particular code scheme, such as the Gray code scheme, for example.

In implementation, a collection of memory cells programmed into the same memory state may have an associated collection of threshold voltage as a result of the programming. The threshold voltages may be represented as a threshold voltage probability distribution, or just threshold distribution of the number of memory cell in the collection as a function of threshold voltage.

A given storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state to have. The lower and upper tails of the model threshold voltage distributions may align or correspond to the upper and lower threshold voltage levels of the ranges with which each of the model threshold voltage distributions is associated.

Figure 5A:
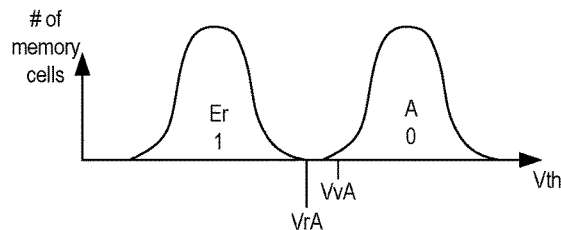
FIG. 5A is a plot of threshold voltage distribution curves for memory cells storing one bit of data per cell.
Figure 5B:
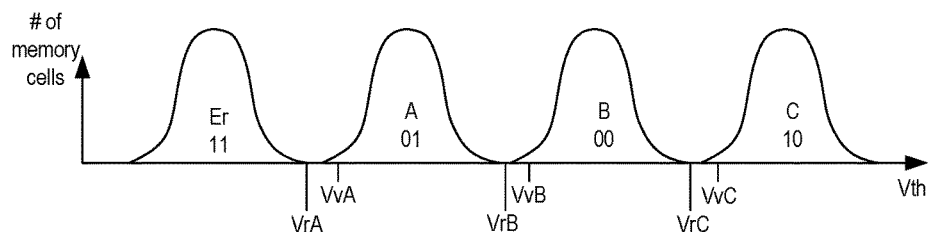
FIG. 5B is a plot of threshold voltage distribution curves for memory cells storing two bits of data per cell.
Figure 5C:
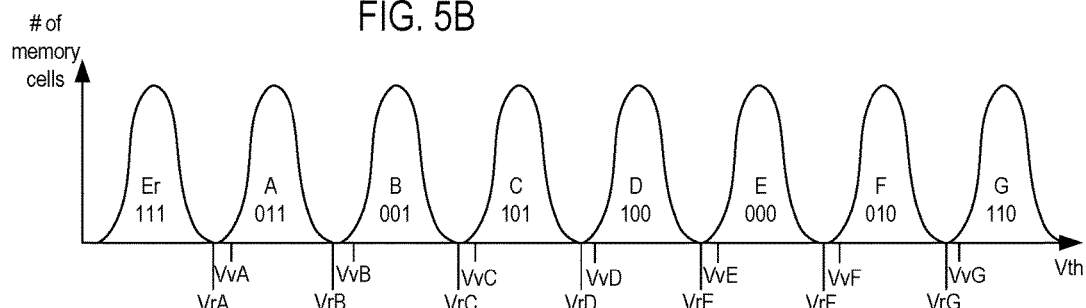
FIG. 5C is a plot of threshold voltage distribution curves for memory cells storing three bits of data per cell.
Figure 5D:
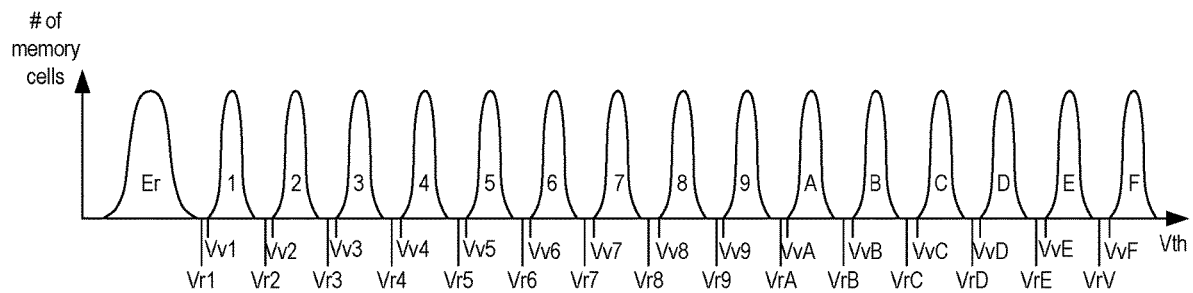
FIG. 5D is a plot of threshold voltage distribution curves for memory cells storing four bits of data per cell.

FIGS. 5A-5D are plots of threshold voltage distribution curves for different storage schemes for storing different numbers of bits into memory cells. The threshold voltage distribution curves are plotted for numbers of memory cells as a function of threshold voltage Vth. In addition, FIGS. 5A-5D show the memory state, the data value, and the threshold voltage range with which each threshold voltage distribution curve is associated. FIG. 5A shows threshold voltage distribution curves for an SLC storage scheme for storing one bit of data per memory cell. FIGS. 5B-5D show threshold voltage distribution curve for MLC storage schemes. In particular, FIG. 5B shows threshold voltage distribution curves for an MLC storage scheme for storing two bits of data per memory cell; FIG. 5C shows threshold voltage distribution curves for an MLC storage scheme for storing three bits of data per memory cell; and FIG. 5D shows voltage distribution curves for an MLC storage scheme for storing four bits of data per memory cell. Similar threshold voltage distribution curves may be defined or generated for other storage schemes used for storing numbers of bits other than (such as more than) two, three, or four bits-per-cell.

With reference to FIG. 5A, for memory cells configured to store one bit of data, each of the memory cells may be configured in an erase state Er or a program state A. With reference to FIG. 5B, for memory cells configured to store two bits of data, each of the memory cells may be configured in an erase state Er or one of three program states A, B, C. With reference to FIG. 5C, for memory cells configured to store three bits, each of the memory cells may be configured in an erase state Er or one of seven program states A, B, C, D, E, F, G. With reference to FIG. 5D, for memory cells configured to store four bits, each of the memory cell may be configured in an erase state Er or one of fifteen program states 1, 2, 3, 4, 5, 6, 7, 8, 9, A, B, C, D, E, F. As shown in FIGS. 5A-5D, each voltage distribution curve is associated with the erase state or one of the program states. Also, herein, the terms "memory state" and "program state" are used interchangeably. For example, the terms "memory state A" and "program state A" are used interchangeably to refer to the same memory state.

In addition, in FIGS. 5A-5D, the associated memory state and data value is included within or under each of the threshold voltage distribution curves. For example, FIG. 5A shows the left threshold voltage distribution curve as being associated with the erased state Er and a logic 1 value, and the right threshold voltage distribution curve as being associated with memory state A and a logic 0 value. For the example MLC storage schemes depicted in FIGS. 5B-5D, the data values sequentially change with increasing memory states and threshold voltage ranges according to a Gray code scheme. For example, with reference to FIG. 5B, memory cells configured in the erase state Er store data value "11"; memory cells configured in memory state A store data value "01"; memory cells configured in memory state B store data value "00"; and memory cells configured in memory state B store data value "10." Similar relationships or correspondences between data values, memory states, and threshold voltage ranges can be made for memory cells programmed to store three bits (FIG. 5C), four bits (FIG. 5D), or more than four numbers of bits-per-cell.

In addition, as illustrated in FIGS. 5A-5D, each program state is associated with a respective verify voltage pulse level (or just verify pulse level) Vv and a read voltage pulse level (or just read pulse level) Vr. For example, with respect to the storage schemes of FIGS. 5A-5D, a verify pulse level VvA and a read pulse level VrA are associated with memory state A, verify pulse level VvB and read pulse level VrB are associated with memory state B, and verify pulse level VvC and read pulse level VrC are associated with memory state C. Similar verify and read pulse levels Vv, Vr are associated with other memory states, such as memory states D-G and memory states 1-9, as depicted in FIGS. 5C and 5D.

As shown in FIGS. 5A-5D, the verify and read pulse levels Vv, Vr specify or are positioned relative to lower bounds or tails of the threshold voltage distribution curves. As described in further detail below, the verify pulse levels Vv may be used to set levels of selected word line voltages during program operations in order to verify program statuses of the memory cells, and the read pulse levels Vr may be used to set levels of selected word line voltages during read operations in order to read data from the memory cells.

Referring back to FIG. 2B, the memory die 104 may further include a read/write circuit 144 that includes a plurality or a p-number of sense blocks (also referred to as sense modules or sense systems) 146. As described in further detail below, the sense blocks 146 are configured to participate in reading data from or programming data into word line cell groups of memory cells in parallel.

The memory die 104 may also include a row address decoder (or just row decoder) 148 and a column address decoder (or just column decoder) 150. The row decoder 148, which may also be referred to as a word line decoder, an x decoder, or an x-wire decoder, may decode a row address (also referred to as a word line address or an x address), and select a particular word line in the memory cell structure 142 corresponding to and/or identified by the decoded row address when reading data from or programming/writing data into to the memory cell structure 142. The column decoder 150, which may also be referred to as a bit line decoder, a y decoder, or a y-wire decoder, may decode a column address (also referred to as a bit line address or a y address), and select a particular bit line or group of bit lines in the memory cell structure 142 corresponding to and/or identified by the column address, when reading data from or programming data to the memory cell structure 142.

In addition, the non-volatile memory die 104 may include a peripheral circuit 152. The peripheral circuit 152 may include a control logic circuit (also referred to as a control logic, an on-chip controller, or an on-die controller) 154, which, at least in some example embodiments, may be implemented as a state machine, that is configured to control on-chip memory operations as well as send status information to the controller 102. The peripheral circuit 152 may also include an on-chip address decoder 156 that provides an address interface between addressing used by the controller 102 and/or a host and the addressing used by the row and column decoders 148, 150. In addition, the peripheral circuit 152 may include volatile memory 158. An example configuration of the volatile memory 158 may include latches, although other configurations are possible.

In addition, the peripheral circuit 152 may include a power control circuit 160 that is configured to generate and supply control line voltages (including voltage pulses) to control lines of the memory cell structure 142. The control line voltages include control gate line voltages supplied to control gate layers, bit line voltages supplied to bit lines, and supply line voltages supplied to supply lines. The control gate line voltages include word line voltages supplied to the word lines, drain select gate line voltages (SGD line voltages) supplied to the SGD lines, and source select gate line voltages (SGS line voltages) supplied to the SGS lines. The power control circuit 160 also be configured to generate and/or supply voltages other than the control lines voltages, including other voltages that may be supplied to the memory cell structure 142, the read/write circuits 144, the sense blocks 146, and/or other circuit components on the memory die 104.

The power control circuit 160 may include any of various circuit topologies or circuit configurations to generate and/or supply the voltages at appropriate levels to perform memory operations, (including read, program/write, sense, and erase operations), such as driver circuits, current sources, charge pumps, reference voltage generators, regulators, and pulse generation circuits, or any of various combinations thereof. Other types of circuits to generate the voltages may be possible. In addition, the power control circuit 160 may communicate with and/or be controlled by the control logic circuit 154, the read/write circuits 144, and/or the sense blocks 146 in order to supply the voltages at appropriate levels and at appropriate times to carry out the memory operations.

Figure 6:
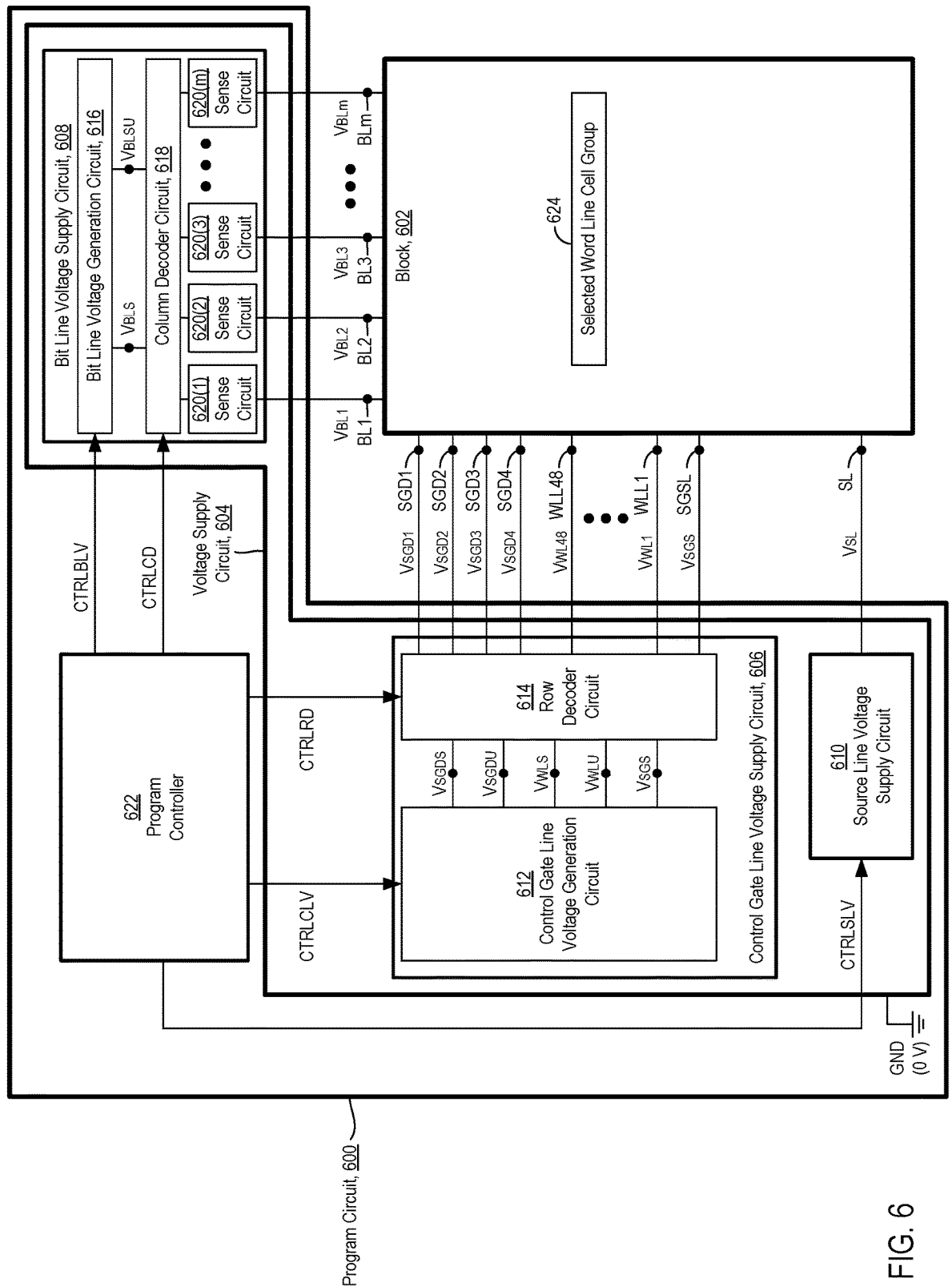
FIG. 6 is a block diagram of an example program circuit of the memory die of FIG. 2B configured to program data into blocks.

FIG. 6 is a block diagram of an example program circuit 600 configured to perform program operations to program (write) data into a block 602. As used herein, a program circuit is a circuit, or a collection of circuits or circuit components, that programs or writes data into memory cells. In addition, for at least some example embodiments, a program circuit can verify the program status of memory cells that it programs. In particular example embodiments, a program circuit is located on the same memory die as the memory cells that it programs and/or verifies. Also, as used herein, a program operation (otherwise referred to as a write operation) is a memory operation that a program circuit performs to program data into memory cells.

The block 602 may be a block of the memory cell structure 142 of FIG. 2B, one of the blocks BLK in FIG. 3A, 3B, or 4A, have the physical construction or structure of the block 410 in FIGS. 4B, 4C, and/or have the circuit configuration of the block 480 in FIG. 4D. The block 602 includes a plurality of control lines, including a plurality of control gate line layers (or just control gate lines), a plurality of bit lines BL, and a source line SL. Corresponding to the block 480 of FIG. 4D, the block 602 includes an m-number of bit lines BL1 to BLm, and the control gate layers include four SGD lines SGD1, SGD2, SGD3, SGD4; forty-eight word line layers (or just word lines) WLL1 to WLL48; and an SGS line/layer SGSL.

The bit lines BL are configured to generate bit line voltages $V_{BL}$ (also or alternatively referred to as drain voltages, drain-side channel voltages, or drain-side voltages) and apply the bit line voltages $V_{BL}$ to channels and associated channel element groups of the block 602. Each bit line BL is configured to generate a respective bit line voltage and apply the respective bit line voltage to an associated set of channels and associated channel element groups. As examples, a first bit line BL1 is configured to generate a first bit line voltage $V_{BL1}$ and apply the first bit line voltage $V_{BL1}$ to a first set of channels and associated channel element groups; a second bit line BL2 is configured to generate a second bit line voltage $V_{BL2}$ and apply the second bit line voltage $V_{BL2}$ to a second set of channels and associated channel element groups; a third bit line BL3 is configured to generate a third bit line voltage $V_{BL3}$ and apply the third bit line voltage $V_{BL3}$ to a third set of channels and associated channel element groups; and an mth bit line BLm is configured to generate an mth bit line voltage $V_{BLm}$ and apply the mth bit line voltage $V_{BLm}$ to an mth set of channels and associated channel element groups. The other bit lines BL4 to BL(m−1) not shown in FIG. 6 are similarly configured to generate respective bit line voltages and apply their respective bit line voltages to associated sets of channels and channel element groups.

In addition, the control gate lines are configured to generate control gate voltages and apply the control gate voltages to control gates of the bias elements to which the control gate lines are respectively coupled. As examples, a first SGD line SGD1 is configured to generate a first SGD line voltage $V_{SGD1}$ and apply the first SGD line voltage $V_{SGD1}$ to control gates of SGD transistors coupled to the first SGD line SGD1; a second SGD line SGD2 is configured to generate a second SGD line voltage $V_{SGD2}$ and apply the second SGD line voltage $V_{SGD2}$ to control gates of SGD transistors coupled to the second SGD line SGD2; a third SGD line SGD3 is configured to generate a third SGD line voltage $V_{SGD3}$ and apply the third SGD line voltage $V_{SGD3}$ to control gates of SGD transistors coupled to the third SGD line SGD3; and a fourth SGD line SGD4 is configured to generate a fourth SGD line voltage $V_{SGD4}$ and apply the fourth SGD line voltage $V_{SGD4}$ to control gates of SGD transistors coupled to the fourth SGD line SGD4. In addition, a first word line WLL1 is configured to generate a first word line voltage $V_{WL1}$ and apply the first word line voltage $V_{WL1}$ to control gates of memory cells coupled to the first word line WLL1; and a forty-eighth word line WLL48 is configured to generate a forty-eighth word line voltage $V_{WL48}$ and apply the forty-eighth word line voltage $V_{WL48}$ to control gates of memory cells coupled to the forty-eighth word line WLL48. The other word lines WLL2 to WLL47 not shown in FIG. 6 are similarly configured to generate respective word line voltages and apply their respective word line voltages to memory cells to which the word lines are coupled. In addition, the SGS line SGSL is configured to generate an SGS line voltage $V_{SGS}$ and apply the SGS line voltage $V_{SGS}$ to SGS transistors coupled to the SGS line SGSL. Also, as shown in FIG. 6, the source line SL is configured to generate a source line voltage $V_{SL}$ and apply the source line voltage $V_{SL}$ to source ends of channels and associated channel element groups to which the source line SL is coupled.

The program circuit 600 performs program operations to program data into selected memory cells. As used herein, a selected memory cell of a program operation is a memory cell that is programmed during the program operation. In addition or alternatively, a selected memory cell of a program operation is a memory cell that changes its memory state from an initial memory state to a target memory state during the program operation. An initial memory state of a selected memory cell is the memory state of the memory cell at the start of the program operation. A target memory state is the memory state that the memory cell is to be in at the end of the program operation in order for data to be correctly stored in the memory cell. For at least some program operations, the initial memory state for a selected memory cell is the erase state. For such program operations, a selected memory cell is a memory cell that changes its memory state from the erase state to a program state. In addition or alternatively, a selected memory cell of a program operation is a memory cell that changes a level, value, or state of a storage parameter in order to change its memory state from an initial memory state to a target memory state.

At least for NAND technology, a selected memory cell of a program operation is a memory cell that changes a level of its threshold voltage from an initial threshold voltage level to a target threshold voltage level in order to change its memory state from an initial memory state to a target memory state during the program operation. An initial threshold voltage level of a selected memory cell is the threshold voltage level of the target memory cell at the start of a program operation, and is a threshold voltage level that is within a range of threshold voltage levels that corresponds to the initial memory state of the selected memory cell. A target threshold voltage level of a selected memory cell is a threshold voltage level that is within a range of threshold voltage levels that corresponds to the target memory state of the selected memory cell. In addition, at least for NAND technology, a selected memory cell of a program operation is a memory cell that changes its threshold voltage level from an initial threshold voltage level to a target threshold voltage level in response to at least one program voltage pulse (or just program pulse) during the program operation. Program pulses generated during a program operation are described in further detail below.

In addition, memory cells that are not the subject of a program operation are referred to as unselected memory cells. Otherwise stated, an unselected memory cell of a program operation is a memory cell that is not programmed during a program operation. An unselected memory cell may be a memory cell that stays or remains in its initial memory state throughout the duration of the program operation.

In particular example embodiments, the program circuit 600 confines a program operation to a particular region or portion of the memory cell structure 142. For such embodiments, the selected memory cells include a first portion or first group of the particular region, and the unselected memory cells include a second portion or second group of the particular region.

At least for NAND technology, the program circuit 600 confines a program operation to a block. The selected memory cells of a program operation are part of a first set or group of the memory cells of the block, and the unselected memory cells are part of a second set or group of the memory cells of the block, namely those memory cells that are not the selected memory cells. In particular example embodiments, the selected memory cells of a program operation are disposed in or coupled to the same word line (or word line layer) and/or are configured to be biased by the same word line (or word line layer). In further particular embodiments, the selected memory cells of a program operation include only those memory cells that are part of the same or a single word line cell group (or string).

The program circuit 600 may perform a program operation over one or more program cycles. A program cycle, otherwise referred to as a program loop or a program iteration, is at least a portion of a program operation during which a program circuit performs a discrete set of program actions to move the memory states of selected memory cells into their respective target memory states. As described in further detail below, the discrete set of program actions may include applying a discrete set of biases, such voltages, to control lines of the block 602 in order to change the levels, magnitudes, values, or states of the storage parameters of at least some of the selected memory cells. One of the discrete set of program actions includes applying a program pulse to a selected word line.

In the event that the program circuit 600 is unable to program all of the selected memory cells in a single program cycle with a single discrete set of program actions, the program circuit 600 may perform a plurality of program cycles, such as sequentially or consecutively, until the selected memory cells are programmed in their respective target memory states. Where the program circuit 600 performs a plurality of program cycles to program the selected memory cells into their target memory states, the program circuit 600 may perform a plurality of sets of discrete program actions, each in a different one of the plurality of program cycles.

At any given moment in time during a program operation, a selected memory cell can have an associated program status, which can be one of three different program statuses, including a sufficiently programmed status, an insufficiently programmed status, and an over-programmed status. A selected memory cell that has a sufficiently programmed status is a sufficiently programmed memory cell, which is a memory cell that is in or has reached its target memory state. A selected memory cell that has an insufficiently programmed status is an insufficiently programmed memory cell, which is a memory cell that has not yet reached its target memory state. A selected memory cell that has an over-programmed status is an over-programmed memory cell, which is a memory cell that is not in its target memory state, and that cannot be moved into its target memory state through further performance of one or more discrete sets of program actions. A selected memory cell can be over-programmed in situations where it is in its target memory state at the start of a program stage, but is program-enabled instead of program-inhibited, and thus responds to the discrete set of program actions during the program stage. In other situations, a selected memory cell can be over-programmed where the selected memory cell is insufficiently programmed at the start of a program stage, but the discrete set of program actions performed during the program stage changes the storage parameter of the selected memory cell too much such that performance of additional discrete sets of program actions cannot move the storage parameter of the selected memory cell to a level corresponding to the target memory state.

After the program circuit 600 performs a program cycle, the program circuit 600 determines whether all of the selected memory cells are sufficiently programmed. If all of the selected memory cells are sufficiently programmed, then the program circuit 600 ends the program operation. Alternatively, if at least one of the selected memory cells is insufficiently programmed, then the program circuit 600 performs a next program cycle. The program circuit 600 may iterate through the program cycles until the program circuit 600 determines that all of the selected memory cells are sufficiently programmed, or the program circuit 600 identifies that a timeout event has occurred, which causes the program circuit 600 to end the program operation. In one example configuration, the timeout event is a number of program cycles reaching a predetermined maximum number of program cycles. Other timeout events may be possible.

In addition, the program circuit 600 is configured to perform the discrete set of program actions in or during program stages of the program cycles. As used herein, a program stage is at least a portion of a program cycle during which a program circuit performs a discrete set of program actions to move at least some selected memory cells into their target memory states.

During a program stage, the program circuit 600 may configure each of the selected memory cells in one of two program bias states, including a program-enable state and a program-inhibit state. The program-enable and program-inhibit states are referred to as bias states in that different biases, such as in the form of voltages having different levels, are applied to bit lines and SGD transistors in order to configure each of the selected memory cells in the program-enable state or the program-inhibit state.

The program-enable state is a program bias state that enables or allows a selected memory cell to respond to a discrete set of program actions by changing a storage parameter associated with the memory states into which the selected memory cell can be programmed. When a selected memory cell is configured in the program-enable state, the program-enabled selected memory cell (which can just be referred to as a program-enabled memory cell), is enabled or allowed to change a level or value of its storage parameter in response to the discrete set of actions.

When the program-enabled memory cell changes its storage parameter in response to a discrete set of program actions during a program stage, the change in the storage parameter may or may not change a present memory state that the memory cell is in at the start of the program stage. That is, in response to a discrete set of program actions, the program-enabled memory cell may stay in the same memory state or change to a new memory state.

As previously described, for NAND technology, the storage parameter of a memory cell is its threshold voltage. When a selected memory cell is configured in the program-enable state, the program-enabled memory cell may respond to a discrete set of program actions by increasing the level of its threshold voltage. The increase in the threshold voltage may keep the selected memory cell in its current memory state or may move the selected memory cell into a new memory state.

The program-inhibit state is a program bias state that inhibits or prevents a selected memory cell from responding to a discrete set of program actions. When a selected memory is configured in the program-inhibit state, the program-inhibited selected memory cell (which can just be referred to as a program-inhibited memory cell), is prevented or inhibited from, or unable to, change a level of its storage parameter when the program circuit 600 performs a discrete set of program actions. Otherwise stated, when the program circuit 600 performs a discrete set of program actions during a program stage, the program-inhibited memory cell keeps a current value or level of its storage parameter unchanged, and in turn, stays in the same memory state. In addition or alternatively to being referred to as a program-inhibited memory cell, a selected memory cell configured in the program-inhibit state may be referred to as a locked-out memory cell in that it is locked out from being programmed during a program stage.

At the start of a program stage, the program circuit 600 may configure each of the selected memory cells in the program-enable state or the program-inhibit state. At the start of a program stage, if a selected memory cell is sufficiently programmed—i.e., it is in or has reached its target memory state—then the program circuit 600 configures the selected memory cell in the program-inhibit state so that the selected memory cell does not change its memory state during the program stage. On the other hand, if a selected memory cell is insufficiently programmed—i.e., it is not yet at or has not yet reached its target memory state—then the program circuit 600 configures the selected memory cell in the program-enable state so that the program-enabled memory cell changes a level of its storage parameter to either move into or at least move closer to its target memory state.

A program cycle may be one of various types. One type of program cycle is a program-only cycle. A program-only cycle is a program cycle performed to only program selected memory cells. A program-only cycle only includes program stages. That is, a program-only cycle excludes a verification step (e.g., a verify operation or a verify stage that would confirm that a selected memory cell is programmed the target or desired memory state. After the program circuit 600 performs a program stage, the program circuit 600 either ends the program operation, or starts performing a next or another program stage of a next or another program cycle without making any express checks or verifications of program statuses of selected memory cells. For program-only cycles, the program circuit 600 makes implicit determinations or presumptions of whether a selected memory cell is sufficiently or insufficiently programmed. For example, the program circuit 600 may perform a predetermined number of one or more program stages and/or a predetermined number of one or more program-only cycles, and presume that the selected memory cells are sufficiently programmed after performing the predetermined number of program stages or program-only cycles.

Figure 7A:
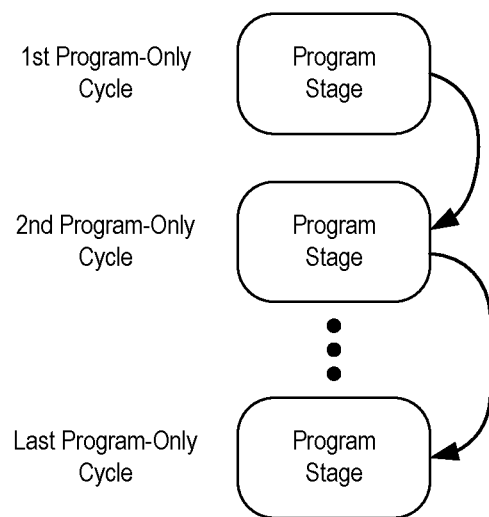
FIG. 7A is a schematic diagram of a program operation performed with program-only cycles.

FIG. 7A shows a schematic diagram of a program operation performed with program-only cycles. After performing a first program stage of a first program-only cycle, the program circuit 600 may proceed directly to performing a next program stage in a second program-only cycle. The program circuit 600 may continue to perform program stages in consecutive program-only cycles in this manner until the program circuit 600 performs a last program stage in a last program-only cycle, after which the program circuit 600 may end the program operation.

Another type of program cycle is a program-verify cycle. A program-verify cycle is a program cycle performed to both program selected memory cells and check or verify program statuses of the selected memory cells being programmed. When the program circuit 600 performs program-verify cycles, the program circuit 600 makes express determinations of the program statuses of the selected memory cells in the form of verify operations. A verify operation is a memory operation performed to check or verify program statuses of selected memory cells. When performed in conjunction with or as part of a program operation, the verify operation may be considered a sub-operation of the program operation.

In particular implementations, the program circuit 600 performs a single verify operation in one program-verify cycle. During a program-verify cycle, after performing a program stage, the program circuit 600 performs a verify operation to check or verify whether the selected memory cells are sufficiently programmed before moving on to a next program-verify cycle.

Herein, the phrase "verify a memory cell" is used refer to an action or collection of actions that determine a program status of the memory cell, and in particular, whether the memory cell is sufficiently programmed or insufficiently programmed. Also, as used herein, the term "last program stage" when referenced in relation to a particular verify operation, is used to refer to the program stage performed in the same program-verify cycle as the particular verify operation, or the program stage that is performed immediately prior to the particular verify operation. In addition, the term "following verify operation" is used to refer to the verify operation of a given program-verify cycle that is performed immediately after the last program stage of the program-verify cycle.

For some example configurations, for a given program-verify cycle, the program circuit 600 verifies all of the selected memory cells during the verify operation of the given program-verify cycle. For other example configurations, for a given program-verify cycle, the program circuit 600 verifies, during the following verify operation, only those selected memory cells that were program-enabled during the last program stage. Since selected memory cells that were program-inhibited during the last program stage are considered to be sufficiently programmed, the program circuit 600 may not need to verify their program statuses, and thus not subject them to the following verify operation. A verify operation consumes power, and so not subjecting certain selected memory cells already determined to be sufficiently programmed may save power.

During a verify operation, the program circuit 600 may configure the selected memory cells in one of two verify bias states, including a verify-enable state and a verify-inhibit state. A verify-enable state is a bias state that enables or allows a selected memory cell to be verified—i.e., enables or allows a program status of the selected memory cell to be determined. When the program circuit 600 configures a selected memory cell in the verify-enable state, the verify-enabled selected memory cell (which can just be referred to as a verify-enabled memory cell) is able or allowed to be verified. A verify-inhibit state is a bias state that prevents or inhibits a selected memory cell from being verified—i.e., prevents or inhibits a program status of the selected memory cell from being determined. When the program circuit 600 configures a selected memory cell in the verify-inhibit state, the verify-inhibited selected memory cell (which can just be referred to as a verify-inhibited memory cell) is prevented or inhibited from being verified. Like the program-enable and program-inhibit states, the verify-enable and verify-inhibit states are referred to as bias states in that the program circuit 600 applies different biases, such as in the form of voltages having different levels, to bit lines and SGD lines in order to configure each of the selected memory cells in the verify-enable state or the verify-inhibit state. In addition or alternatively to being referred to as a verify-inhibited memory cell, a selected memory cell configured in the verify-inhibit state may be referred to as a locked-out memory cell in that it is locked out from being verified during a verify operation.

When performing a verify operation within or as part of a program-verify cycle, the program circuit 600 may separate or divide the verify operation into discrete verify stages. A verify stage is at least a portion of a verify operation during which the program circuit 600 performs a discrete set of verify actions to verify selected memory cells that have the same target memory state. As described in further detail below, the discrete set of verify actions may include applying a discrete set of biases, such as voltages, to the control lines of the block in order to verify the selected memory cells having the same target memory state. The discrete set of verify actions may also include performing sense operations to sense program statuses of the selected memory cells having the same target memory state. For a given program-verify cycle, the program circuit 600 verifies selected memory cells that have the same target memory state in the same verify stage, and verifies selected memory cells that have different target memory states in different verify stages.

By dividing or separating a verify operation into different verify stages, the program circuit 600 associates each verify stage with a different one of the plurality of memory states that the selected memory cells can have. The memory state associated with a given verify stage is referred to as the associated memory state of the given verify stage.

For a given verify stage with an associated memory state, the program circuit 600 verifies those selected memory cells that have target memory states that match or that are the same as the associated memory state of the given verify stage. In addition, the program circuit 600 may not verify those selected memory cells that have target memory states that do not match or that are different from the associated memory state of the given verify stage, and instead verifies those selected memory cells during one or more other verify stages of the verify operation.

A selected memory cell that has a target memory state that matches or is the same as an associated memory state of a given verify stage is referred to as a matched memory cell of the given verify stage. In addition, a selected memory cell that has a target memory state that does not match or that is different from the associated memory state of the given verify stage is referred to as unmatched memory cell of the given verify stage. Among the selected memory cells of a program operation, each of the selected memory cells is a matched memory cell for one of the verify stages, and is an unmatched memory cell for the other verify stages. So that the program circuit 600 verifies only matched memory cells during a given verify stage, the program circuit 600 configures matched memory cells in the verify-enable state while configuring unmatched memory cells in the verify-inhibit state during the given verify stage.

To perform a verify operation, the program circuit 600 performs or executes the verify stages sequentially in a predetermined verify order. The verify order may be an order of memory states, such as memory state A, memory state B, memory state C, and so on. Where a given memory state is positioned in the verify order determines when the program circuit 600 performs a given verify stage associated with the given memory state relative to when the program circuit 600 performs the other verify stages. For example, if memory state A is the first memory state in the verify order, the verify stage associated with memory state A is the first verify stage that the program circuit 600 performs in the verify operation.

For a verify operation that includes a plurality of verify stages, the program circuit 600 sequentially performs or executes the verify operation by sequentially transitioning from one verify stage to another verify stage according to the verify order. When the program circuit 600 ends a current verify stage, the program circuit 600 identifies a next verify stage in the verify order as the current verify stage, and begins performing the new current verify stage. The program circuit 600 sequentially performs the verify stages in this manner until a last verify stage in the verify order is performed.

As the program circuit 600 transitions from a current verify stage associated with a first memory state to a next verify stage associated with a second memory state according to the verify order, those selected memory cells that were matched memory cells in the current verify stage transition to unmatched memory cells in the next verify stage. Accordingly, the program circuit 600 changes those memory cells from being configured in the verify-enable state to the verify-inhibit state. In addition, those selected memory cells that were unmatched memory cells in the current verify stage but now have target memory states that match the second memory state of the next verify stage transition to matched memory cells. Accordingly, the program circuit 600 changes those memory cells from being configured in the verify-inhibit state to the verify-enable state. Also, those selected memory cells that were unmatched memory cells in the current verify stage and still have target memory states that do not match the second memory state in the next verify stage stay as unmatched memory cells. Accordingly, the program circuit 600 keeps those memory cells configured in the verify-inhibit state.

In addition, for some example configurations, the transitioning between matched and unmatched memory cells during a verify operation pertains to only those selected memory cells that were program-enabled during the last program stage. For those selected memory cells that were program-inhibited during the last program stage, the program circuit 600 may keep them configured in the verify-inhibit state throughout the duration of the verify operation, regardless of whether their respective target memory states match an associated memory state of a given verify stage. For other example configurations, the transitioning between matched and unmatched memory cells during a verify operation pertains also to selected memory cells that were not program-enabled—i.e., that were program-inhibited—during the last program stage. That is, for these other example configurations, even if a selected memory cell is configured in the program-inhibit state during the last program stage, the program circuit 600 configures the selected memory cell in the verify-enable state for a given verify stage if the selected memory cell is a matched memory cell for the given verify stage.

In addition, for at least some example configurations, the program circuit 600 may not perform all of the verify stages for every program-verify cycle. Which verify stages are performed can change from cycle to cycle. One way that the verify stages can change is by completing programming for a given target memory state. If those selected memory cells having the same target memory state are all sufficiently programmed, the program circuit 600 configures them all in the verify-inhibit state for the remainder of the verify operations, and skips the verify stage associated with that target memory state for the remainder of the verify operations. Another way that the verify stages can change is by reaching predetermined threshold numbers of program-verify cycles. In some example configurations, it may be impossible or at least statistically unlikely that the program circuit 600 can sufficiently program a selected memory cell before the program circuit 600 performs a predetermined number of discrete program actions. To save time, the program circuit 600 may skip or omit a verify stage associated with the certain target memory cell from earlier verify operations of the program operation. For example, an initial predetermined number of program-verify cycles may have verify orders that exclude one or more certain verify stages. Then, after the program circuit 600 performs a predetermined or threshold number of program-verify cycles, the program circuit 600 may add the one or more certain verify stages to verify orders of subsequent program-verify cycles.

Figure 7B:
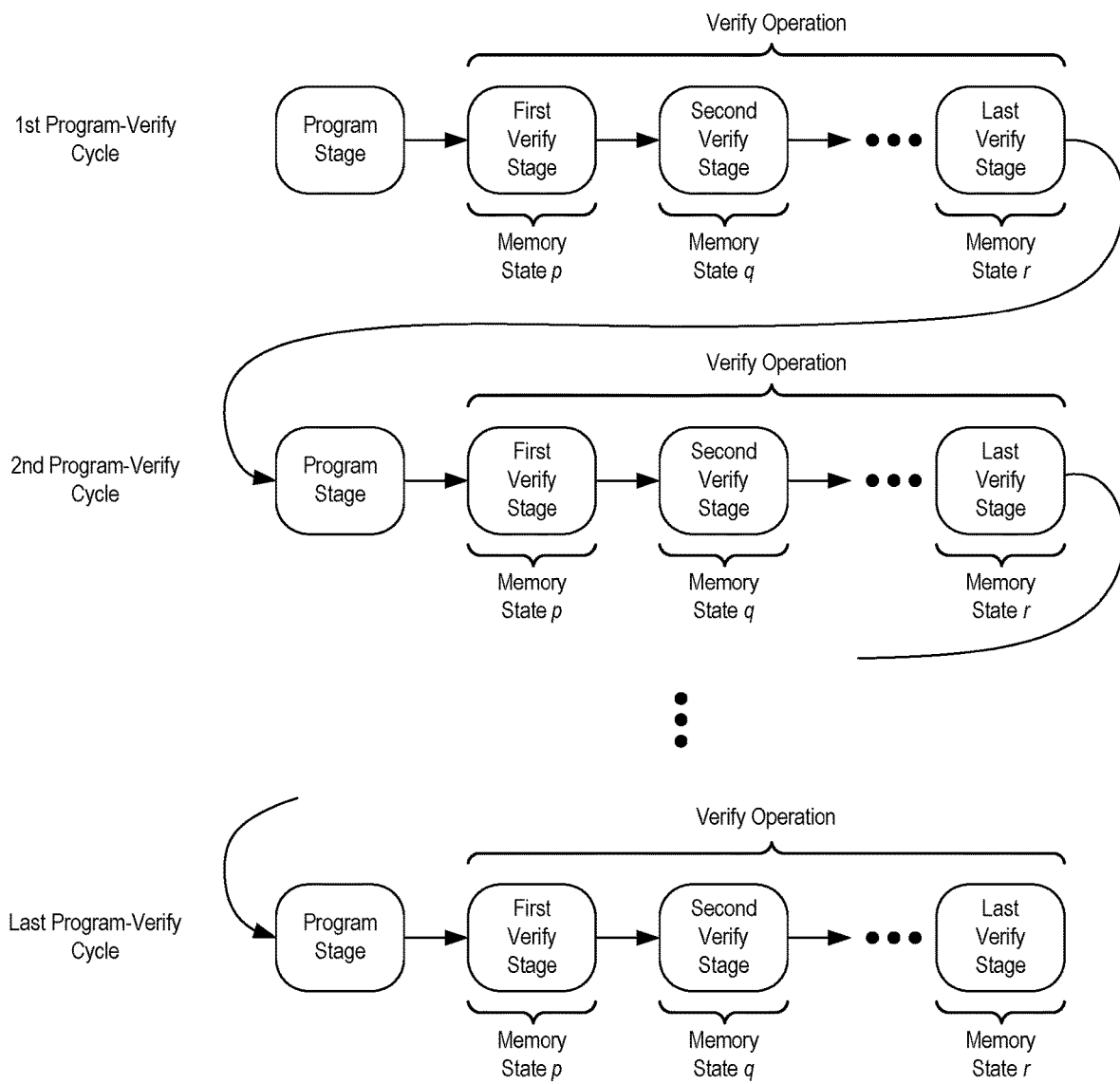
FIG. 7B is a schematic diagram of a program operation performed with program-verify cycles.

FIG. 7B shows a schematic diagram of a program operation performed with program-verify cycles. The program circuit 600 may begin the program operation by performing a first program stage or a first program-verify cycle. After performing the first program stage, the program circuit 600 may transition to the verify operation of the first program-verify cycle by performing a first or initial verify stage of the verify operation. After performing the first verify stage, the program circuit 600 may proceed to the second verify stage. The program circuit 600 may proceed in this manner by consecutively performing verify stages in accordance with a verify order associated with the first program-verify cycle until it performs a last verify stage of the verify operation of the first program-verify cycle.

During or after performance of the verify operation of the first program-verify cycle, the program circuit 600 may determine which of the selected memory cells are sufficiently programmed as a result of performing the first program stage in the first program-verify cycle. If all of the selected memory cells are not sufficiently programmed, then the program circuit 600 may proceed or transition to the second or next program-verify cycle. The program circuit 600 may start the second or next program-very cycle by performing a program stage of the program-verify cycle. After performing the program stage, the program circuit 600 may perform the verify operation of the second program-verify cycle by consecutively performing the verify stages in accordance with the verify order of the second program-verify cycle. After performing the last verify stage, if there are still memory cells that are insufficiently programmed, the program circuit 600 may proceed to a third program-verify stage. The program circuit 600 may proceed in this manner by consecutively performing program-verify cycles until the selected memory cells are sufficiently programmed following a last program-verify cycle.

As shown in FIG. 7B, the first, second, and last verify stages of each of the program-verify cycles are associated with memory states p, q, and r, respectively. Memory stages p, q, and r represent any of various memory states into which selected memory cells can be programmed. The memory states p, q, and r can be the same or different from each other for the different program-verify cycles depending on the verify orders of those program-verify cycles. In particular example configurations, the memory states p, q, and r may correspond to increasing or ascending threshold voltage ranges, with memory state q corresponding to a higher threshold voltage range than memory stage p, and memory state r corresponding to a higher threshold voltage range than memory states p and q.

During a given program-verify cycle, when performing the first memory stage associated with memory state p, the program circuit 600 may configure those selected memory cells having memory state p as their target memory states as verify-enabled memory cells and configure the other selected memory cells as program-inhibited or locked out memory cells. The program circuit 600 may then verify the selected memory cells with target memory state p during the first verify stage. When transitioning to the second program stage associated with memory state q, the program circuit 600 may configure those selected memory cells having memory state p as their target memory state in the verify-inhibit state, and configure those selected memory cells having memory state q as their target memory state in the verify-enable state. The program circuit 600 may keep those selected memory cells having memory state r as their target memory state in the verify-inhibit state. The program circuit 600 may perform similar actions when transitioning to the last verify stage associated with memory state r.

Referring back to FIG. 6, the program circuit 600 may perform discrete sets of program actions during program stages and discrete sets of verify actions during verify stages, as previously described. At least for NAND technology, a set of program actions that the program circuit 600 performs during a given program stage includes biasing the control gates and channels of a block with a set of program voltages. Each program voltage may be at one of a plurality of program levels associated with the given program stage. In addition, a set of verify actions that the program circuit 600 performs during a given verify stage includes biasing the control gates and channels of a block with a set of verify voltages. Each verify voltage may be at one of a plurality of verify levels associated with the given verify stage. Also, as described in further detail below, a discrete set of verify actions performed during a given verify stage also includes performing sense operations to sense program statuses of selected memory cells having a target memory state that matches the memory state associated with the given verify stage.

With respect to a program stage, the set of program voltages with which the program circuit 600 biases the control gates and channels includes a program selected memory cell gate voltage, a program unselected memory cell gate voltage, a program selected SGD gate voltage, a program unselected SGD gate voltage, a program SGS gate voltage, a program selected drain-side voltage, a program unselected drain-side voltage, and a program source-side voltage. The program circuit 600 biases control gates of selected memory cells with a program selected memory cell gate voltage during a program stage to move selected memory cells into or toward their target memory states, such as by increasing their respective threshold voltages. The program circuit 600 biases, with the program unselected memory cell gate voltage, control gates of unselected memory cells during a program stage. The program circuit 600 biases, with the program selected SGD gate voltage, control gates of SGD transistors coupled to selected memory cells during a program stage. The program circuit 600 biases, with the program unselected SGD gate voltage, control gates of SGD transistors coupled to unselected memory cells during a program stage. The program circuit 600 biases, with the program SGS gate voltage, control gates of SGS transistors during a program stage. The program circuit 600 biases, with the program selected drain-side voltage, drain ends of channels coupled to program-enabled memory cells during a program stage. The program circuit 600 biases, with the program unselected drain-side voltage, drain ends of channels coupled to program-inhibited memory cells during a program stage. The program circuit 600 biases, with the program source-side voltage, the source ends of channels during a program stage.

With respect to a verify stage, the set of verify voltages with which the program circuit 600 biases the control gates and channels includes a verify selected memory cell gate voltage, a verify unselected memory cell gate voltage, a verify selected SGD gate voltage, a verify unselected SGD gate voltage, a verify SGS gate voltage, a verify selected drain-side voltage, a verify unselected drain-side voltage, and a verify source-side voltage. The program circuit 600 biases control gates of selected memory cells with the verify selected memory cell gate voltage during a verify stage. The program circuit 600 biases, with the verify unselected memory cell gate voltage, control gates of unselected memory cells during a verify stage. The program circuit 600 biases, with the verify selected SGD gate voltage, control gates of SGD transistors coupled to selected memory cells during a verify stage. The program circuit 600 biases, with the verify unselected SGD gate voltage, control gates of SGD transistors coupled to unselected memory cells during a verify stage. The program circuit 600 biases, with the verify SGS gate voltage, control gates of SGS transistors during a verify stage. The program circuit 600 biases, with the verify selected drain-side voltage, drain ends of channels coupled to verify-enabled memory cells during a verify stage. The program circuit 600 biases, with the verify unselected drain-side voltage, drain ends of channels coupled to verify-inhibited memory cells during a verify stage. The program circuit 600 biases, with the verify source-side voltage, the source ends of channels during a verify stage.

The program circuit 600 is configured to bias the control gates and channels with the program and verify voltages during the program and verify stages by way of the control lines of the block 602, including the control gate lines SGD, WLL, SGSL, the bit lines BL, and the source line SL. In particular, the program circuit 600 is configured to bias the control gates of the memory cells, the SGD transistors, and the SGS transistors with the program and verify gate voltages by way of the word lines WLL, the SGD lines, and the SGS line, respectively. The program circuit 600 is configured to bias the drain ends of the channels with the program and verify drain-side voltages. The program circuit 600 is configured to bias the source ends of the channels with the program and verify source-side voltages.

In this context, the program and verify voltages are also or alternatively referenced or labeled with respect to the control lines biasing the control gates and channels. In particular, the program and verify selected memory cell gate voltages are referred to as program and verify selected word line voltages, the program and verify unselected memory cell gate voltage are referred to as program and verify unselected word line voltages, the program and verify selected drain-side voltages are referred to as program and verify selected bit line voltages, the program and verify unselected drain-side voltages are referred to as program and verify unselected bit line voltages, the program and verify unselected source-side voltages are referred to as program and verify source line voltages, the program and verify SGS gate voltages are referred to as program and verify SGS line voltages, the program and verify selected SGD gate voltages are referred to as program and verify selected SGD line voltages, and the program and verify unselected SGD gate voltages are referred to as program and verify unselected SGD line voltages.

In order to bias the control lines of the block, and in turn the control gates and the channels with the program and verify voltages, the program circuit 600 may include a voltage supply circuit 604 that supplies the program and verify voltages to the control lines. Through supply of the program and verify voltages to the control lines, the voltage supply circuit 604 applies the program and verify voltages to the control lines, biases the control lines with the program and verify voltages, and/or generates the program or verify voltage on the control lines. From the perspective of the control lines, a control line receives, is supplied with, or is biased with a program or verify voltage from the voltage supply circuit 604, biases respective control gates or channels with the program or verify voltage it receives, applies the program or verify voltage it receives to respective control gates or channels, generates a program or verify voltage in response to receipt of the program or verify voltage it receives from the voltage supply circuit 604, generates the program or verify voltage at a level of the program or verify voltage it receives, applies the program or verify voltage it generates to a respective control gate or channel, or biases a respective control gate or channel with the program or verify voltage it generates in response to the program or verify voltage it receives. These terms and phrases to describe how the program circuit 600 biases the control gates and channels of the block 602 with the program and verify voltages through supply of the program and verify voltages to the control lines of the block 602 are generally used interchangeably herein, unless expressly described otherwise.

As indicated in FIG. 6, the voltage supply circuit 602 may be configured to generate the program and verify voltages, and/or cause the control lines to generate their respective voltages at levels relative to a ground reference GND having a ground reference voltage level of 0 V. However, some voltages during some of the program or verify stages may be generated at levels referenced to a different reference point other than the ground reference GND, such as the source line SL for example. Herein, voltage levels may be presumed to be indicated with reference to the ground reference voltage level of 0 V, unless expressly described otherwise.

In the example configuration in FIG. 6, the voltage supply circuit 604 includes three voltage supply circuits that supply the program and verify voltages to the control lines, including a control gate line voltage supply circuit 606, a bit line voltage supply circuit 608, and a source line voltage supply circuit 610. The control gate line voltage supply circuit 606 is configured to supply or apply the program and verify gate voltages to the control gate lines of the block 602. In particular, the control gate line voltage supply circuit 606 is configured to supply the program and verify selected and unselected word line voltages to the word lines WLL, the program and verify selected and unselected SGD line voltages to the SGD lines, and the program and verify SGS line voltages to the SGS line. The bit line voltage supply circuit 608 is configured to supply or apply the program and verify selected and unselected bit line voltages to the bit lines BL of the block 602. The source line voltage supply circuit 610 is configured to supply or apply the program and verify source line voltages to the source line SL of the block 602. Other ways of configuring the voltage supply circuit 604 may be possible.

In addition, in the example configuration in FIG. 6, the control gate line voltage supply circuit 606 and the bit line voltage supply circuit 608 each include two circuit components, a voltage generation circuit and a decoder circuit. In general, a voltage generation circuit generates voltages supplied to control lines, and a decoder circuit selectively routes the generated voltages to the control lines.

In further detail, the control gate line voltage supply circuit 606 includes a control gate line voltage generation circuit 612 and a row decoder circuit 614. The control gate voltage generation circuit 612 may represent at least a portion of the power control circuit 160 of FIG. 2B. The row decoder circuit 614 may represent at least a portion of the row decoder 148 of FIG. 2B.

The control gate voltage generation circuit 612 is configured to generate a plurality or a set of control gate line voltages, including a selected word line voltage $V_{WLS}$, an unselected word line voltage $V_{WLU}$, a selected SGD line voltage $V_{SGDS}$, an unselected SGD line voltage $V_{SGDU}$, and a SGS line voltage $V_{SGS}$. For simplicity, the control gate line voltages generated by the control gate line voltage generation circuit 612 are not separated into distinct program control gate line voltages and verify control gate line voltages. Instead, the control gate line voltage generation circuit 612 is shown in FIG. 6 as generating a single set of control gate line voltages. In practical implementation, the control gate line voltage generation circuit 612 may simultaneously generate the control gate line voltages for program and verify stages in various ways. In one example implementation, as depicted in FIG. 6, the control gate line voltage generation circuit 612 may generate a single set of control gate line voltages. The control gate line voltages may be program gate line voltages during program stages and verify gate line voltages during verify stages. The control gate line voltage generation circuit 612 may be configured to set the control gate line voltages to program levels for program stages and set the control gate line voltages to verify levels for verify stages. In addition, the control gate line voltage generation circuit 612 may be configured to adjust the levels of the control gate line voltages between program levels and verify levels as the program circuit 600 transitions from a program stage to a verify stage or from a last verify stage in one program-verify cycle to a program stage of a next program-verify cycle. In other example implementations, the control gate line voltage generation circuit 612 is configured to generate separate sets of program and verify control gate line voltages. For such implementations, the control gate line voltage generation circuit 612 may include a selection circuit, such as in the form of switches or multiplexers, that selects which set of control gate line voltages, either the program control gate line voltages or the verify control gate line voltages, to provide to the row decoder circuit 614.

Regardless of the implementation, the control gate line voltage generation circuit's 612 generation of a program or verify control gate line voltage and generation of a control gate line voltage at a program level or a verify level are used interchangeably herein to refer to the same voltage. That is, during a program stage, the control gate line voltage generation circuit 612 generates program control gate line voltages or control gate line voltages at program levels. During a verify stage, the control gate line voltage generation circuit 612 generates verify control gate line voltages or control gate line voltages at verify levels.

In general, as used herein, phrases or terms such as "generating a program or verify voltage" and "generating a voltage at a program or verify level"—as well as other similar phrases or terms such as "supplying a program voltage" and "supplying a voltage at a program or verify level"; "applying a program or verify voltage" and "applying a voltage at a program or verify level"; or "biasing a control line with program or verify voltage" and "biasing a control line with a voltage at a program or verify level"—are generally used interchangeably, unless expressly described otherwise.

In addition, the control gate line voltage generation circuit 612 may be configured to generate the control gate line voltages at different program levels for different program stages, and/or at different verify levels for different verify stages. For example, for at least some program operations, the control gate line generation circuit 612 may be configured to generate the selected word line voltage $V_{WLS}$ in the form of program gate voltage pulses (or just program voltage pulses or program pulses) at different program pulse levels in or during different program stages. As another example, for at least some program operations, the control gate line generation circuit 612 may be configured to generate the selected word line voltage $V_{WLS}$ in the form of verify gate voltage pulses (or just verify voltage pulses or verify pulses) at different verify pulse levels in or during different verify stages. For example, the control gate line generation circuit 612 may output the verify pulse at one level when verifying selected memory cells associated with a first target memory state in a first verify stage, and the verify pulse at a different level when verifying selected memory cells associated with a second target memory state in a second verify stage. As the program circuit 600 transitions from one verify stage to another, the control gate line voltage generation circuit 612 may change or transition the level of the selected word line voltage $V_{WLS}$ from one verify pulse level to another verify pulse level, with each verify pulse level associated with the respective verify stage being performed, in order to generate consecutive verify pulses for the consecutive verify operations.

The row decoder circuit 614 is a circuit that selectively routes or supplies the control gate line voltages to the control gate lines. The row decoder circuit 614 may include a set of input terminals that receives the control gate line voltages from the control gate line voltage generation circuit 612. In addition, the row decoder circuit 614 may include a set of output terminals coupled to the control gate lines. The row decoder 614 may selectively route or supply the control gate line voltages it receives at its input terminals from the control gate voltage generation circuit 612 to its output terminals for supply or application to the control gate lines.

The row decoder circuit 614 is configured to selectively route or supply the control gate line voltages in that the row decoder 614 may route the control gate line voltages to different control gate lines at different times within the same program operation or during different program operations, depending on the memory cells of the block 602 that are selected, unselected, program-enabled, program-inhibited, verify-enabled, and verify inhibited for different program operations or for different program or verify stages within the same program operation. As an example, the row decoder circuit 614 may supply the selected word line voltage $V_{WLS}$, such as in the form of one or more program pulses, to a first word line during a first program operation, and may supply the selected word line voltage $V_{WLS}$, such as in the form of one or more program pulses, to a second, different word line WLL during a second program operation.

The row decoder circuit 614 may have any of various circuit configurations to selectively route or supply the control gate line voltages to the control gate lines. For at least some example configurations, the row decoder circuit 614 may include a plurality of switches (e.g., transistors) that turn on and off to selectively connect the input terminals to the output terminals. The on and off states of the switches may form conductive paths between the input and output terminals of the row decoder 614 that selectively supply or route the control gate line voltages. The switches may have any of various configurations, such as single-tier or multi-tier (or tree) configurations. For a given program operation or a given program or verify stage of the program operation, a given overall state of the control gate switches configured in on and off states may determine how the row decoder circuit 614 routes the control gate line voltages to the various control gate lines of the block 602.

In addition, the bit line voltage supply circuit 606 includes a bit line voltage generation circuit 616 and a column decoder circuit 618. The bit line voltage generation circuit 616 may represent at least a portion of the power control circuit 160 of FIG. 2B. The column decoder circuit 618 may represent at least a portion of the column decoder 148 of FIG. 2B.

The bit line voltage generation circuit 616 is configured to generate a plurality or a set of bit line voltages, including a selected bit line voltage $V_{BLS}$ and an unselected bit line voltage $V_{BLU}$. For simplicity, the bit line voltages generated by the bit line voltage generation circuit 616 are not separated into distinct program voltages and verify voltages. Instead, the bit line voltage generation circuit 616 is shown in FIG. 6 as generating a single set of bit line voltages. In practical implementation, the bit line voltage generation circuit 616 may generate the bit line voltages for program and verify stages in various ways. In one example implementation, as depicted in FIG. 6, the bit line voltage generation circuit 616 may generate a single set of bit line voltages. The bit line voltages may be program voltages during program stages and verify voltages during verify stages. The bit line voltage generation circuit 616 may be configured to set the bit line voltages to program levels for program stages and set the bit line voltages to verify levels for verify stages. In addition, the control gate voltage generation circuit 616 may be configured to adjust the levels of the bit line voltages between program levels and verify levels as the program circuit 600 transitions from a program stage to a verify stage or from a last verify stage in one program-verify cycle to a program stage of a next program-verify cycle. In other example implementations, the bit line voltage generation circuit 616 is configured to generate separate sets of program and verify bit line voltages. For such implementations, the bit line voltage generation circuit 616 may include a selection circuit, such as in the form of switches or multiplexers, that selects which set of bit line voltages, either the program voltages or the verify voltages, to provide to the column decoder circuit 618.

Regardless of the implementation, the bit line voltage generation circuit 616 generating a program or verify bit line voltage and the bit line voltage generation circuit 616 generating a bit line voltage at a program level or a verify level are used interchangeably and refer to generation of the same voltage. That is, during a program stage, the bit line voltage generation circuit 616 generates program bit line voltages or bit line voltages at program levels. During a verify stage, the bit line voltage generation circuit 616 generates verify bit line voltages or bit line voltages at verify levels.

The column decoder circuit 618 is a circuit that selectively routes or supplies the bit line voltages to the bit lines. The column decoder circuit 618 may include a set of input terminals that receives the bit line voltages from the bit line voltage generation circuit 616. In addition, the column decoder circuit 618 may include a set of output terminals coupled to the bit lines. The column decoder 618 may selectively route or supply the selected and unselected bit line voltages it receives at its input terminals from the bit line voltage generation circuit 616 to its output terminals for supply or application to the bit lines.

The column decoder circuit 618 is configured to selectively route or supply the bit line voltages in that the column decoder 618 may route the bit line voltages to different bit lines at different times within the same program operation or during different program operations, depending on the memory cells of the block 602 that are selected, unselected, program-enabled, program-inhibited, verify-enabled, and verify-inhibited for different program operations or for different program or verify stages within the same program operation. As an example, during a program stage of a program-verify cycle, the column decoder circuit 618 may supply the selected bit line voltage $V_{BLS}$ at an associated program level to a first set of the bit lines BL, and supply the unselected bit line voltage $V_{BLU}$ at an associated program level to a second set of the bit lines BL. During a first verify stage of the program-verify cycle, the column decoder circuit 618 may supply the selected bit line voltage $V_{BLS}$ at an associated verify level to a third set of the bit lines BL, and supply the unselected bit line voltage $V_{BLU}$ at an associated verify level to a fourth set of the bit lines BL. Then, during a second verify stage of the program-verify cycle, the column decoder circuit 618 may supply the selected bit line voltage $V_{BL}$ at the associated verify level to a fifth set of the bit lines BL, and supply the unselected bit line voltage $V_{BLU}$ at the associated verify level to a sixth set of the bit lines BL. The first, third, and fifth bit line sets receiving the selected bit line voltage $V_{BLS}$ during the program stage and the first and second verify stages may include bit lines that are the same or different from each other, or have some bit lines that are the same and some that are different. Similarly, the second, fourth, and sixth bit line sets receiving the unselected bit line voltage $V_{BLU}$ during the program stage and the first and second verify stages may include bit that are the same or different from each other, or have some bit lines that are the same and some that are different.

The column decoder circuit 618 may have any of various circuit configurations to selectively route or supply the bit line voltages to the bit lines BL. For at least some example configurations, the column decoder circuit 618 may include a plurality of switches (e.g., transistors) that turn on and off to selectively connect the input terminals to the output terminals. The on and off states of the switches may form conductive paths between the input and output terminals of the column decoder 618 that selectively supply or route the bit line voltages. The switches may have any of various configurations, such as single-tier or multi-tier (or tree) configurations. For a given program operation or a given program or verify stage of the program operation, a given overall state of the switches configured in on and off states may determine how the column decoder circuit 618 routes the bit line voltages to the various bit lines of the block 602.

For some example configurations, such as the one shown in FIG. 6, the output terminals of the column decoder circuit 618 are coupled to the bit lines BL by way of a plurality of sense circuits 620 configured to perform sense operations to sense program statuses of selected memory cells during verify stages of program operations. Details of the sense circuits 620 and sense operations are described in further detail below.

In the example configuration in FIG. 6, the plurality of sense circuits 620 includes an m-number of sense circuits 620(1) to 620(m), with each sense circuit 620 coupled to a respective one of the m-number of bit lines BL1 to BLm. Other sense circuit configurations may be possible. For example, the number of sense circuits 620 may be less than the number of bit lines BL of a block. In addition or alternatively, one sense circuit 620 may be coupled to different bit lines of different blocks. For example, the first sense circuit 620(1) may be coupled to the first bit line BL1 of the block 602, and may be coupled to a different first bit line BL1 of a different block of the memory cell structure 142. Other sense circuit configurations are possible, as described in further detail below.

For some example configurations, the bit line voltages output from the column decoder 618 may directly pass through the sense circuits 620 such that the levels of the bit line voltages as they are received by the bit lines BL are the same or substantially the same as their levels at the output terminals of the column decoder circuit 618. In other example configurations, the sense circuits 620 may each include any of various circuit components, such as resistors, capacitors, and/or semiconductor devices (e.g., transistors) as non-limiting examples, that alter the voltage levels of the bit line voltages they receive, such as by reducing the levels. In particular example configurations, the sense circuits 620 each include a respective semiconductor device, such as a transistor, that receives a bit line voltage from the column decoder 618. The semiconductor devices may include respective first terminals, such as gate terminals, that receive the bit line voltages from the column decoder circuit 618. The semiconductor devices may further include respective second terminals, such as source terminals, that output the bit line voltages onto the bit lines BL by lowering the bit line voltages by a threshold voltage level from the level at which the bit line voltages were received at their first (gate) terminals. Various ways of supplying bit line voltages to bit lines by way of sense circuits may be possible.

The program circuit 600 may further include a program controller 622. A program controller is a circuit that controls program operations. A program controller controls when program operations begin and when they end. In addition, a program controller controls when program stages and verify stages within a program operation begin and end. A program controller controls the transitions of stages from one stage to a next stage, and controls the transitions of program cycles from one program cycle to a next program cycle. In addition, a program controller sets the voltages on the control lines of a block. A program controller may do so by controlling the voltage levels of the voltages that a voltage supply circuit generates and supplies, and when the voltage supply circuit generates and supplies the voltages at their particular levels. For example, a program controller controls whether and/or when selected and unselected voltages are generated at associated program levels or associated verify levels. In addition, a program controller sets the voltages on the control lines by controlling how voltages are routed to control lines of a block, and can change which voltages are routed to which control lines.

In addition, a program controller may also determine where to store data. For example, a program controller may determine that data is to be stored, and identify a collection of memory cells into which to store or program the data, such as by identifying a plane, a block, a word line, and/or a word line cell group that includes the collection of memory cells. The program controller may identify that collection of memory cells as the selected memory cells of a program operation.

A program controller may determine where to store data in response to receipt of address information from the controller 102 (FIG. 2A) or otherwise identify a unique physical address (e.g., one that includes a particular plane, a particular block, a particular word line, and/or a particular word line cell group) that identifies a physical location of the selected memory cells into which to program the data.

In addition, a program controller may know or determine a storage scheme under which data is be stored in selected memory cells. By knowing the storage scheme, a program controller may know whether to program the selected memory cells as SLC cells or MLC cells, as defined by the storage scheme. In addition, where the selected memory cells are to be programmed as MLC cells, the program controller may know the number of bits-per-cell each of the MLC cells are configured to store, as defined by the storage scheme. A program controller may control the biasing on the control lines in order program the selected memory cells as SLC cells or MLC cells, in accordance with the storage scheme.

A program controller may also identify the data values of the data to be programmed into the selected memory cells. A program controller may know which data values are to be stored in which memory cells of the selected memory cells. Based on this knowledge, the program controller may know the target memory states of each of the selected memory cells of a program operation. In turn, the program controller may determine, during the course of the program operation, which selected memory cells are sufficiently programmed and which selected memory cells are insufficiently programmed. Based on these determinations, a program controller can determine which selected memory cells to configure as program-inhibited memory cells and which selected memory cells to configure as program-enabled memory cells during the program stages. In addition, by knowing the target memory states of each of the selected memory cells, a program controller can determine which of the selected memory cells to configure as verify-enabled memory cells and which of the selected memory cells to configure as verify-inhibited memory cells for each of the verify stages associated with the different memory states. A program controller can control the biasing on the control lines in order to configure the various selected memory cells as program-enabled or program-inhibited memory cells during program stages, and as verify-enabled or verify-inhibited memory cells during the verify stages.

In further detail with respect to example configuration FIG. 6, the program controller 622 may be configured to set the voltages on the control lines at certain levels and during certain program and verify stages in order to perform program operations. To do so, the program controller 622 is configured to control the voltage supply circuit 604 to supply, apply, or output the program voltages to the control lines during program stages, and to supply, apply, or output the verify voltages to the control lines during verify stages.

With respect to the control gate line voltage supply circuit 606, the program controller 622 is configured to control the control gate line voltage supply circuit 606 to supply, apply, or output the control gate line voltages $V_{SGDS}$, $V_{SGDU}$, $V_{WLS}$, $V_{WLU}$, $V_{SGS}$ to the control gate lines at program levels during program stages, and at verify levels during the verify stages. The program controller 622 may control the control gate line voltage generation circuit 612 to generate the control gate line voltages $V_{SGDS}$, $V_{SGDU}$, $V_{WLS}$, $V_{WLU}$, $V_{SGS}$ at associated program levels during program stages. In addition, the program controller 622 may control the control gate line voltage generation circuit 612 to generate the control gate line voltages $V_{SGDS}$, $V_{SGDU}$, $V_{WLS}$, $V_{WLU}$, $V_{SGS}$ at associated verify levels during verify stages. In some example configurations, as shown in FIG. 6, the program controller 622 may output a control gate line voltage control signal CTRLCLV to control the control gate line voltage generation circuit 612 to generate the control gate line voltages $V_{SGDS}$, $V_{SGDU}$, $V_{WLS}$, $V_{WLU}$, $V_{SGS}$ at either the associated program levels or verify levels, or otherwise output the control gate line voltages $V_{SGDS}$, $V_{SGDU}$, $V_{WLS}$, $V_{WLU}$, $V_{SGS}$ as either program voltages or verify voltages to the row decoder circuit 614.

In addition, the program controller 622 is configured to control the row decoder circuit 614 by configuring the row decoder 614 in any of various states to route the control gate line voltages $V_{SGDS}$, $V_{SGDG}$, $V_{WLS}$, $V_{WLU}$, $V_{SGS}$ to the control gate lines in order to program and verify the selected memory cells during the program and verify stages. As shown in FIG. 6, the program controller 622 may control the row decoder circuit 614 by outputting a row decoder control signal CTRLRD to the row decoder circuit 614. The row decoder circuit 614 may respond to the row decoder control signal CTRLRD by being configured in a state corresponding to a level or value of the row decoder control signal CTRLRD, such as by turning on an off various switches. The program controller 622 may output the row decoder control signal CTRLRD based on physical address information identifying the selected memory cells.

With respect to the bit line voltage supply circuit 608, the program controller 622 is configured to control the bit line voltage supply circuit 606 to supply, apply, or output the bit line voltages $V_{BLS}$, $V_{BLU}$ to the bit lines at program levels during program stages, and at verify levels during the verify stages. The program controller 622 may control the bit line voltage generation circuit 616 to generate the bit line voltages $V_{BLS}$, $V_{BLU}$ at associated program levels during program stages. In addition, the program controller 622 may control the bit line voltage generation circuit 616 to generate the bit line voltages $V_{BLS}$, $V_{BLU}$ at associated verify levels during verify stages. In some example configurations, as shown in FIG. 6, the program controller 622 may output a bit line voltage control signal CTRLBLV to control the bit line voltage generation circuit 616 to generate the bit line voltages $V_{BLS}$, $V_{BLU}$ at either the associated program levels or verify levels, or otherwise output the bit line voltages $V_{BLS}$, $V_{BLU}$ as either program voltages or verify voltages to the column decoder circuit 618.

In addition, the program controller 622 is configured to control the column decoder circuit 618 by configuring the column decoder 618 in any of various states to route the bit line voltages $V_{BLS}$, $V_{BLU}$ to the bit lines in order to program and verify the selected memory cells during the program and verify stages. As shown in FIG. 6, the program controller 622 may control the column decoder circuit 618 by outputting a column decoder control signal CTRLCD to the column decoder circuit 618. The column decoder circuit 618 may respond to the column decoder control signal CTRLCD by being configured in a state corresponding to a level or value of the column decoder control signal CTRLCD, such as by turning on an off various switches.

The program controller 622 may output the column decoder control signal CTRLCD based on physical address information identifying the selected memory cells. In addition, the program controller 622 may output the column decoder control signal CTRLCD based on the program statuses of the selected memory cells obtained during verify stages. Based on the program statuses, the program controller 622 may output the column decoder control signal CTRLCD so that the column decoder 618 routes or supplies the selected bit line voltage $V_{BLS}$ to bit lines coupled to insufficiently programmed selected memory cells, and routes or supplies the unselected bit line voltage $V_{BLU}$ to bit lines coupled to sufficiently programmed selected memory cells during program stages. In addition, the program controller 622 may output the column decoder control signal CTRLCD based on the target memory states of the selected memory cells. Based on the target memory states, the program controller 622 may output the column decoder control signal CTRLCD so that the column decoder 618 routes or supplies the selected bit line voltage $V_{BLS}$ to bit lines coupled to matched memory cells and routes or supplies the unselected bit line voltage $V_{BLU}$ to bit lines coupled to unmatched memory cells during the verify stages.

With respect to the source line voltage supply circuit 610, the program controller 622 is configured to control the source line voltage supply circuit 610 to supply, apply, or output the source line voltage $V_{SL}$ to the source line SL at program levels during program stages, and at verify levels during the verify stages. In some example configurations, as shown in FIG. 6, the program controller 622 may output a source line voltage control signal CTRLSLV to control the source line voltage supply circuit 610 to generate the source line voltage $V_{SL}$ at either the associated program level or verify level.

During a program operation, the program controller 622 configures the word lines, the bit lines, and the SGD lines of the block 602 in selected states and unselected states in order to program selected memory cells into their target memory states while keeping the unselected memory cells in their initial memory states. A word line in a selected state is referred to as being selected and/or as a selected word line. A word line in an unselected state is referred to as being unselected and/or as an unselected word line. A bit line in a selected state is referred to as being selected and/or as a selected bit line. A bit line in an unselected state is referred to as being unselected and/or as an unselected bit line. An SGD line in a selected state is referred to as being selected and/or as a selected SGD line. An SGD line in an unselected state is referred to being unselected and/or as an unselected SGD line.

A selected word line (or selected word line layer) of a program operation is a word line (or word line layer) that is coupled to selected memory cells during a program operation. A selected word line may perform different roles or different functions during program stages and verify stages of a program operation. At least for NAND technology, during a program stage, a selected word line applies a selected word line voltage at an associated program level, referred to as a program gate voltage pulse (or just program pulse), to selected memory cells and/or biases selected memory cells with a program pulse, such as by applying a program pulse to control gates of selected memory cells, and/or by biasing the control gates of selected memory cells with a program pulse during the program stage. During a verify stage, a selected word line applies a selected word line voltage at a verify level, referred to as a verify gate voltage pulse (or just verify pulse), to selected memory cells and/or biases selected memory cells with a verify pulse, such as by applying a verify pulse to control gates of selected memory cells, and/or by biasing the control gates of selected memory cells with a verify pulse during the verify stage.

An unselected word line (or unselected word line layer) of a program operation is a word line (or word line layer) that is not coupled to any selected memory cells during a program operation. In addition or alternatively, an unselected word line of a program operation is a word line that does not apply at least one program pulse to at least one selected memory cell and/or that does not apply at least one verify pulse to at least one selected memory cell during the program operation. For program operations that are confined to a particular region of the memory cell structure 142, the unselected word lines are those word lines in the particular region that are not the selected word line. For example, for a program operation where the selected memory cells are coupled to the same word line (or disposed in the same word line layer), the unselected word lines are the word lines of the block that are not the selected word line.

A selected bit line of a program operation is a bit line that enables or allows a selected memory cell coupled to the selected bit line to be programmed or verified. During a program stage of a program operation, a selected bit line is a bit line that configures a selected memory cell in a program-enable state to allow or enable the selected memory cell to be programmed during the program stage. During a verify stage of a program operation, a selected bit line is a bit line that configures a selected memory cell in a verify-enable state to allow or enable the selected memory cell to be verified during the verify stage.

An unselected bit line of a program operation is a bit line that inhibits, prevents, or locks out a selected memory cell coupled to the unselected bit line from being programmed or verified. During a program stage of a program operation, an unselected bit line is a bit line that configures a selected memory cell in a program-inhibit state to inhibit, prevent, or lock out the selected memory cell from being programmed during the program stage. During a verify stage of a program operation, an unselected bit line is a bit line that configures a selected memory cell in a verify-inhibit state to inhibit, prevent, or lock out the selected memory cell from being verified during the verify stage.

In addition, a selected SGD line of a program operation is a SGD line that enables or allows selected memory cells coupled to the SGD line to be programmed or verified. During a program stage of a program operation, a selected SGD line is a SGD line that configures a selected memory cell in a program-enable state to allow or enable the selected memory cell to be programmed during the program stage. During a verify stage of a program operation, a selected SGD line is a SGD line that configures a selected memory cell in a verify-enable state to allow or enable the selected memory cell to be verified during the verify stage.

An unselected SGD line of a program operation is an SGD line that inhibits, prevents, or locks out unselected memory cells coupled to the SGD line from being programmed or verified. The SGD line may inhibit, prevent, or lock out these unselected memory cells from being programmed or verified even though they may be coupled to selected bit lines and/or selected word lines. During a program stage of a program operation, an unselected memory cell disposed in the same word line layer as a selected memory cell may be coupled to a selected bit line during the program stage. The unselected SGD line coupled to that unselected memory cell is an SGD line that configures the unselected memory cell in the program-inhibit state so that the unselected memory cell is not programmed during the program stage despite being coupled to the selected bit line. During a verify stage of a program operation, an unselected memory cell disposed in the same word line layer as a selected memory cell may be coupled to a selected bit line during the verify stage. The unselected SGD line coupled to that unselected memory cell is an SGD line that configures the unselected memory cell in the verify-inhibit state so that the unselected memory cell is not verified during the verify stage despite being coupled to the selected bit line.

At any given point in time during a program operation, the word lines, the bit lines, and the SGD lines have respective selected statuses. A selected status of a line is a status identifier that identifies whether the line is a selected line or an unselected line. During the course or duration of a program operation, the selected status of a line may stay the same or may change. For a selected status of a line that changes, the change may be from the selected state to the unselected state, or from the unselected state to the selected state. In addition, for a selected status of a line that changes, the change may occur within a single program cycle (e.g., a single program-verify cycle). For example, within a single program cycle, a change in a selected status of a line may occur during a transition from a program stage to a verify stage, or from one verify stage to another verify stage. Within the single program cycle, a selected status of a line may change once or multiple times. In addition or alternatively, for a selected status of a line that changes, the change may occur across program cycles. For example, a line may be selected during a program stage of one program cycle and then unselected during a program stage of another or next program cycle. As another example, a line may be selected during a last verify stage of one program cycle and then may be unselected during a program stage of another or a next program cycle.

For each program stage and verify stage of a program operation, the program controller 622 may identify each of the word lines WLL, the bit lines BL, and the SGD lines as selected or unselected, and configure each of the word lines WLL, the bit lines BL, and the SGD lines in selected and unselected states according to the identifications. In particular, according to the identifications, the program controller 622 configures each of the word lines WLL as a selected word line or an unselected word line, configures each of the bit lines BL as a selected bit line or an unselected bit line, and configures each of the SGD lines as a selected SGD line or an unselected SGD line.

The program controller 622 configures each of the word lines WLL, the bit lines BL, and the SGD lines in selected and unselected states by supplying or biasing them with respective selected and unselected voltages. In particular, the program controller 622 configures a word line as a selected word line by supplying or applying the selected word line voltage $V_{WLS}$ to that word line and/or by biasing the word line with the selected word line voltage $V_{WLS}$. The word line receiving or biased with the selected word line voltage $V_{WLS}$ becomes or is configured as a selected word line and generates a selected word line voltage by generating its voltage at a selected word line level. Similarly, the program controller 622 configures a word line as an unselected word line by supplying or applying the unselected word line voltage $V_{WLU}$ to that word line and/or by biasing the word line with the unselected word line voltage $W_{WLU}$. The word line receiving or biased with the unselected word line voltage $W_{WLU}$ becomes or is configured as an unselected word line and generates an unselected word line voltage by generating its voltage at an unselected word line level.

In a similar manner, the program controller 622 configures a SGD line as a selected SGD line by supplying or applying the selected SGD line voltage $V_{SGDS}$ to that SGD line and/or by biasing the SGD line with the selected SGD line voltage $V_{SGDS}$. The SGD line receiving or biased with the selected SGD line voltage $V_{SGDS}$ becomes or is configured as a selected SGD line and generates a selected SGD line voltage by generating its voltage at a selected SGD level. Similarly, the program controller 622 configures a SGD line as an unselected SGD line by supplying or applying the unselected SGD line voltage $V_{SGDU}$ to that SGD line and/or by biasing the SGD line with the unselected SGD line voltage $V_{SGDU}$. The SGD line receiving or biased with the unselected SGD line voltage $V_{SGDU}$ becomes or is configured as an unselected SGD line and generates an unselected SGD line voltage by generating its voltage at an unselected SGD level.

The selected and unselected levels at which the word lines and SGD lines generate their respective voltages may be the same as or different than the voltage levels of the selected and unselected word line and SGD line voltages $V_{WLS}$, $V_{WLU}$, $V_{SGDS}$, $V_{SGDU}$. For example, the row decoder circuit 614 may provide a voltage drop such that the selected and unselected word lines and SGD lines are biased with or generate their respective selected and unselected voltages at levels that are lower than the levels at which the control gate line voltage generation circuit 612 generates the selected and unselected word line and SGD line voltages $V_{WLS}$, $V_{WLU}$, $V_{SGDS}$, $V_{SGDU}$. For such example configurations, the control gate line voltage generation circuit 612 is configured to generate the selected and unselected word line and SGD line voltages $V_{WLS}$, $V_{WLU}$, $V_{SGDS}$, $V_{SGDU}$, as well as the SGS line voltage $V_{SGS}$ at sufficiently high levels to achieve appropriate biasing of the control gate lines SGD, WLL, SGSL.

For some example configurations, the selected and unselected word line and SGD line voltages $V_{WLS}$, $V_{WLU}$, $V_{SGDS}$, $V_{SGDU}$ are be referred to as global selected and unselected voltages, and the selected and unselected voltages that the word lines and SGD lines generate and/or are biased with are referred to as local selected and unselected voltages. Similarly, the control gate line voltage generation circuit 612 generates a global SGS line voltage $V_{SGS}$, and the SGS line SGSL generates and/or is biased with a local SGS line voltage $V_{SGS}$. In this context, the control gate line voltage supply circuit 606 generates global control gate line voltages, including global selected and unselected control gate line voltages, and supplies or routes the global control gate line voltages to the control gate lines of the block 602. In response, the control gate lines of the block 602 generate respective local control gate line voltages. Selected control gate lines generate local selected control gate line voltages or voltages at local selected levels, and unselected control gate lines generate local unselected control gate line voltages or voltages at local selected levels. Herein, for simplicity, no express distinction is made between the levels, including the selected and unselected levels, of the control gate line voltages that the control gate line voltage generation circuit 612 generates, and the levels, including the selected and unselected levels, of the control gate line voltages that the control gate lines generate.

In addition, the program controller 622 configures a bit line as a selected bit line by supplying or applying the selected bit line voltage $V_{BLS}$ to that bit line and/or by biasing the bit line with the selected bit voltage $V_{BLS}$. The bit line receiving or biased with the selected bit line voltage $V_{BLS}$ becomes or is configured as a selected bit line and generates a selected bit line voltage by generating its voltage at a selected bit line level. Similarly, the program controller 622 configures a bit line as an unselected bit line by supplying or applying the unselected bit line voltage $V_{BLU}$ to that bit line and/or by biasing the bit line with the unselected bit line voltage $V_{BLU}$. The bit line receiving or biased with the unselected bit line voltage $V_{BLU}$ becomes or is configured as an unselected bit line and generates an unselected bit line voltage by generating its voltage at an unselected bit line level.

The selected and unselected levels at which the bit lines generate their respective voltages may be the same as or different than the voltage levels of the selected and unselected bit line voltages $V_{BLS}$, $V_{BLU}$. For example, the column decoder circuit 618 and/or the sense circuits 620 may provide one or more voltage drops such that the selected and unselected bit lines are biased with or generate their respective selected and unselected bit line voltages at levels that are lower than the levels at which the bit line voltage generation circuit 616 generates the selected and unselected bit line voltages $V_{BLS}$, $V_{BLU}$. For such example configurations, the bit line voltage generation circuit 616 is configured to generate the selected and unselected bit line voltages $V_{BLS}$, $V_{BLU}$ at sufficiently high levels to achieve appropriate biasing of the bit lines.

For some example configurations, the selected and unselected bit line voltages $V_{BLS}$, $V_{BLU}$ are be referred to as global selected and unselected bit line voltages, and the selected and unselected voltages that the bit lines generate and/or are biased with are referred to as local selected and unselected bit line voltages. In this context, the bit line voltage supply circuit 608 generates global bit line voltages, including global selected and unselected bit line voltages, and supplies or routes the global bit line voltages to the bit lines of the block 602. In response, the bit lines generate respective local bit line voltages. Selected bit lines generate local selected bit line voltages or voltages at local selected levels, and unselected bit lines generate local unselected bit line voltages or voltages at local selected levels. Herein, for simplicity, no express distinction is made between the levels, including the selected and unselected levels, of the bit line voltages that the bit line voltage generation circuit 616 generates, and the levels, including the selected and unselected levels, of the bit line voltages that the bit lines generate.

As previously described, the program controller 622 may identify or assign each of the word lines, bit lines, and SGD lines as selected or unselected for the program and verify stages of a program operation. The determinations or identifications that the program controller 622 makes to assign each of the word lines, SGD lines, and bit lines as selected or unselected depends on the physical location of the selected memory cells being programmed or verified (i.e., the word lines and bit lines to which they are coupled), the target memory states of the selected memory cells, the program statuses of the selected memory cells, and the particular program stage or verify stage being performed at a given point in time of the program operation.

In an example program operation, the program circuit 600 may perform a program operation to program data (such as one or more pages of data) into a selected word line cell group 624 of the block 602. In general, a selected word line cell group is a word line cell group that includes the selected memory cells that are programmed during the program operation. Those word line cell groups that do not include selected memory cells—i.e., that include unselected memory cells—are unselected word line cell groups of the program operation.

Figure 8A:
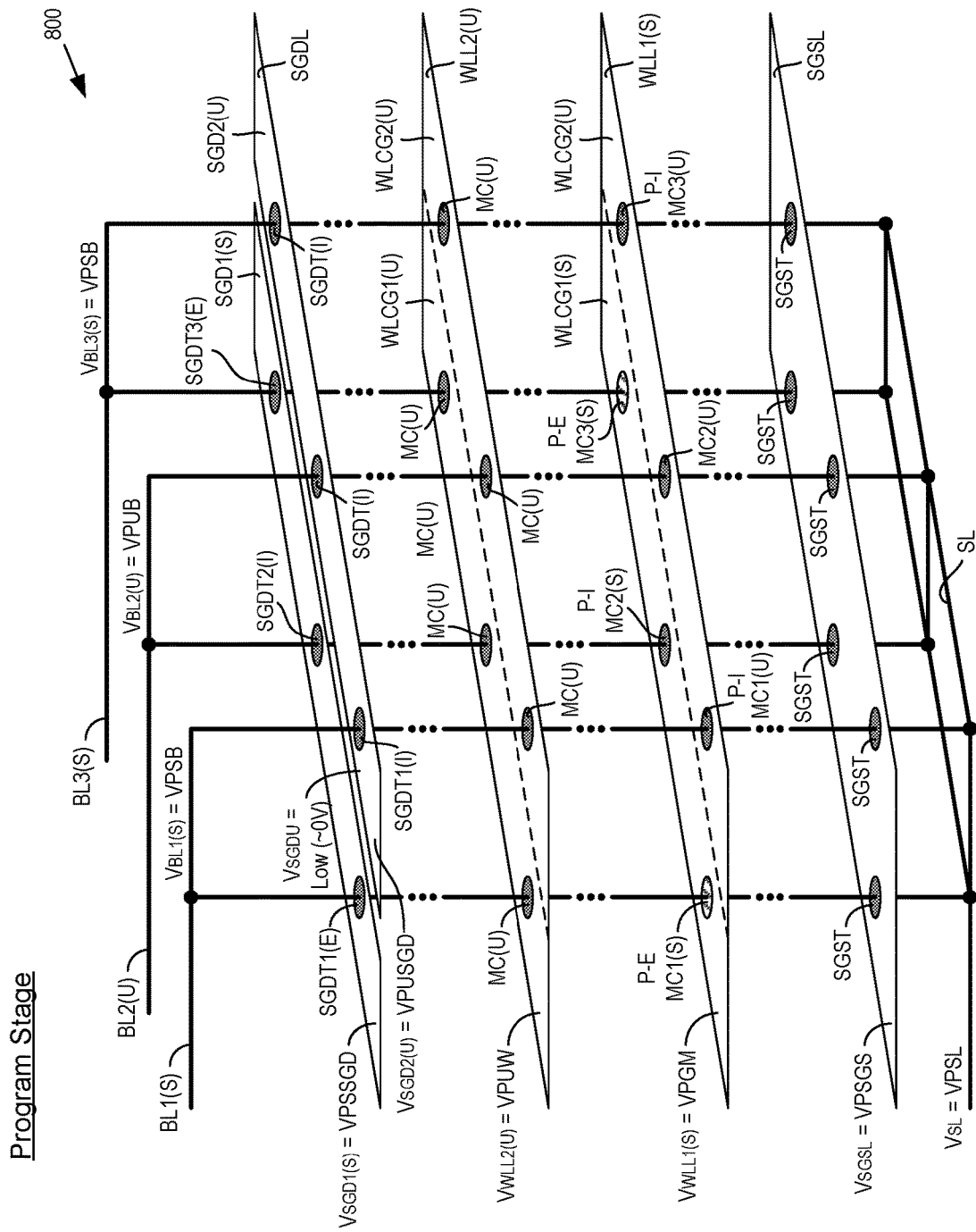
FIG. 8A is an exploded view of a portion of a block biased with program voltages during a program stage of a program-verify cycle.
Figure 8B:
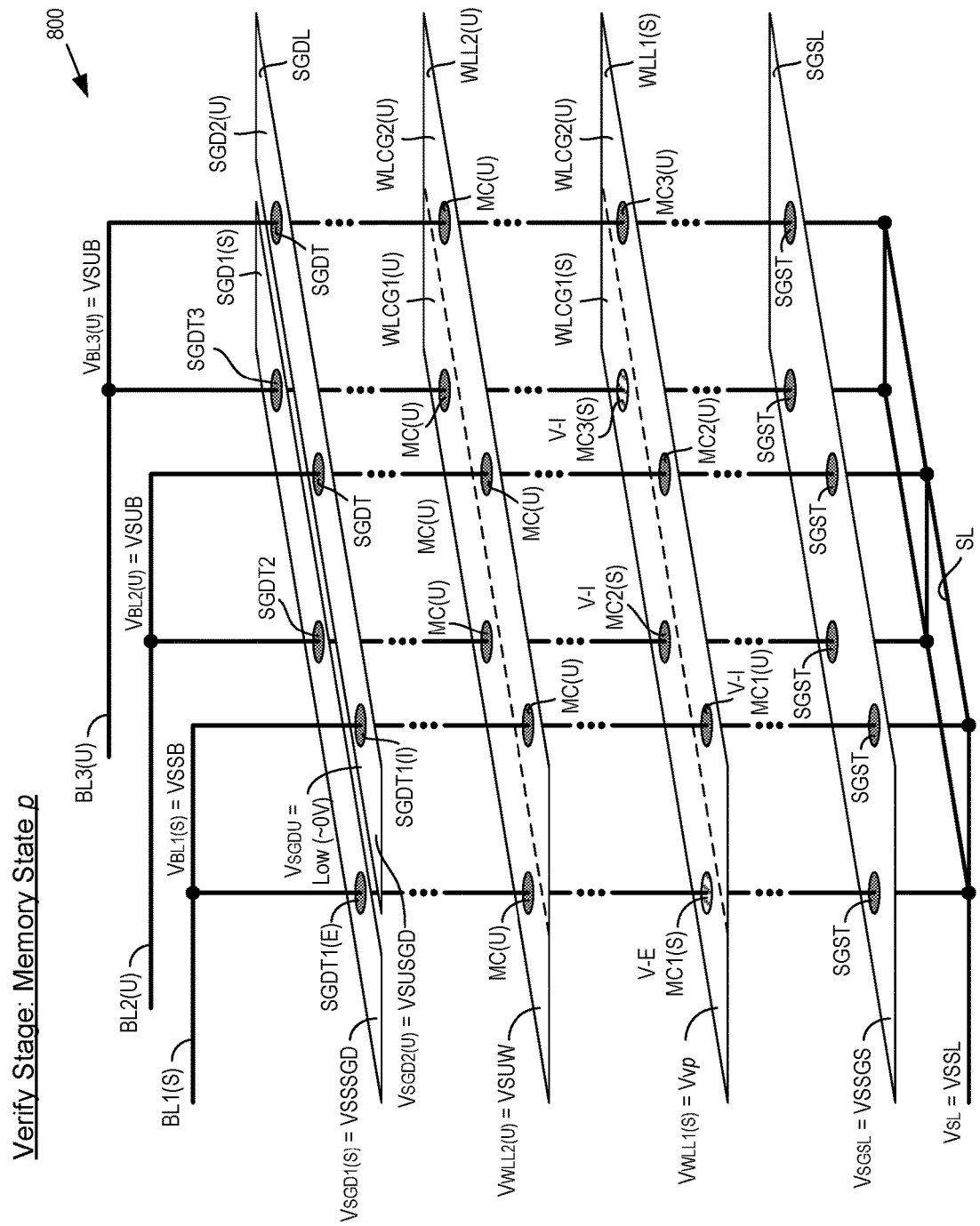
FIG. 8B is the exploded view of the block of FIG. 8A, but biased with verify voltages during a first verify stage of the program-verify cycle.
Figure 8C:
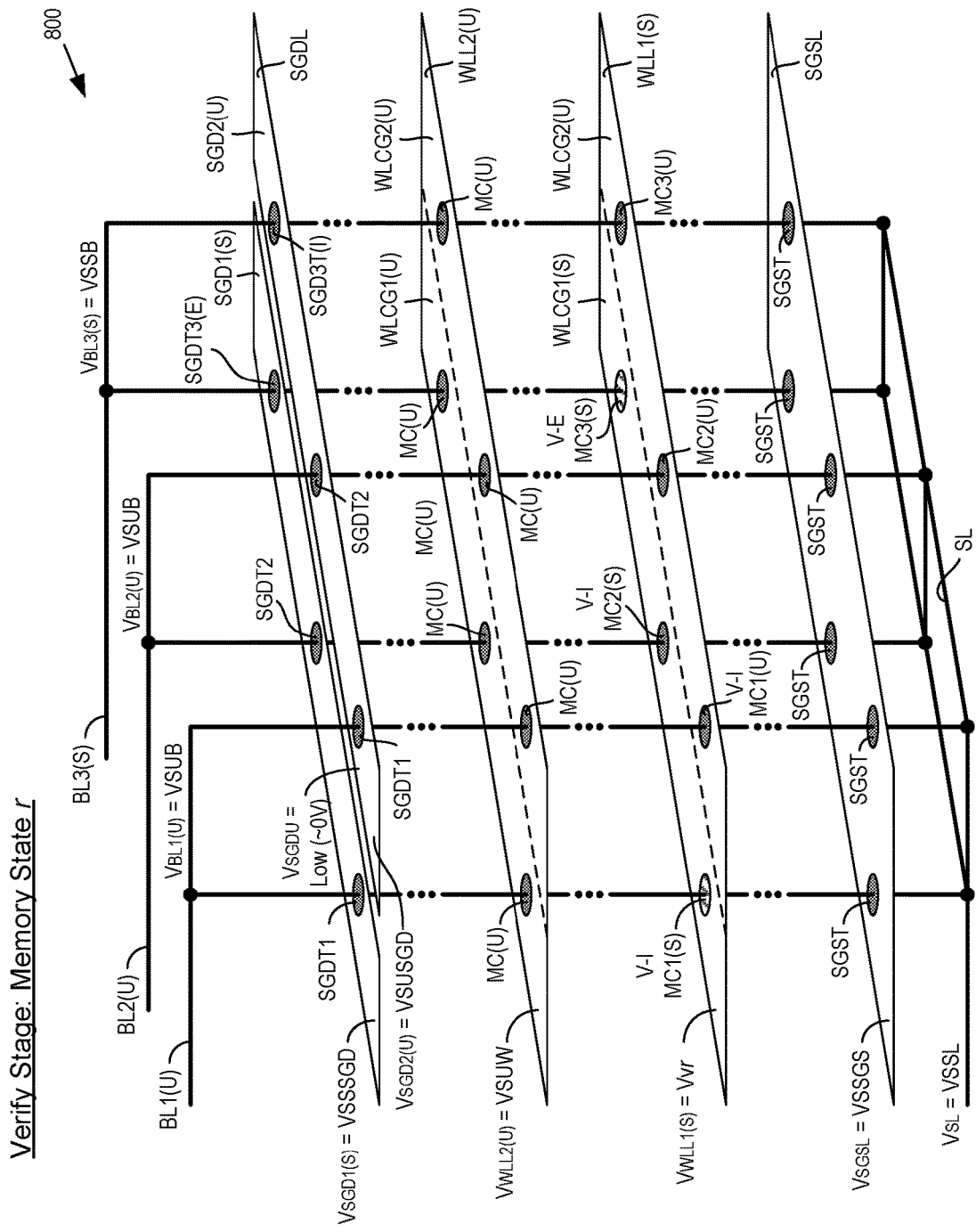
FIG. 8C is the exploded view of the block of FIGS. 8A and 8B, but biased with verify voltages during a second verify stage of the program-verify cycle.

An example program operation (or at least a portion of a program operation) to program data into a selected word line cell group is described with reference to FIGS. 8A-8C and 9, in conjunction with FIG. 6. FIGS. 8A-8C show an exploded perspective view of at least a portion of a 3-D block 800 that includes selected memory cells MC(S) being programmed during the program operation. For simplicity, the block 800 includes two word lines (or word line layers) WLL1, WLL2, two SGD lines SGD1, SGD2, disposed or extending in one or more SGD layers SGDL, an SGS line or layer SGSL, and three bit lines BL1, BL2, BL3. The two word lines WLL1, WLL2 may be adjacent or non-adjacent to each other. For example, the two word lines WLL1, WLL2 may represent any two of the 48 word lines WLL1 to WLL48 of the block 602 of FIG. 6. Similarly, the three bit lines BL1, BL2, BL3 may be adjacent or non-adjacent to each other. For example, the three bit lines BL1, BL2, BL3 may represent any three of the m-number of bit lines BL1 to BLm of the block 602 of FIG. 6.

Figure 9:
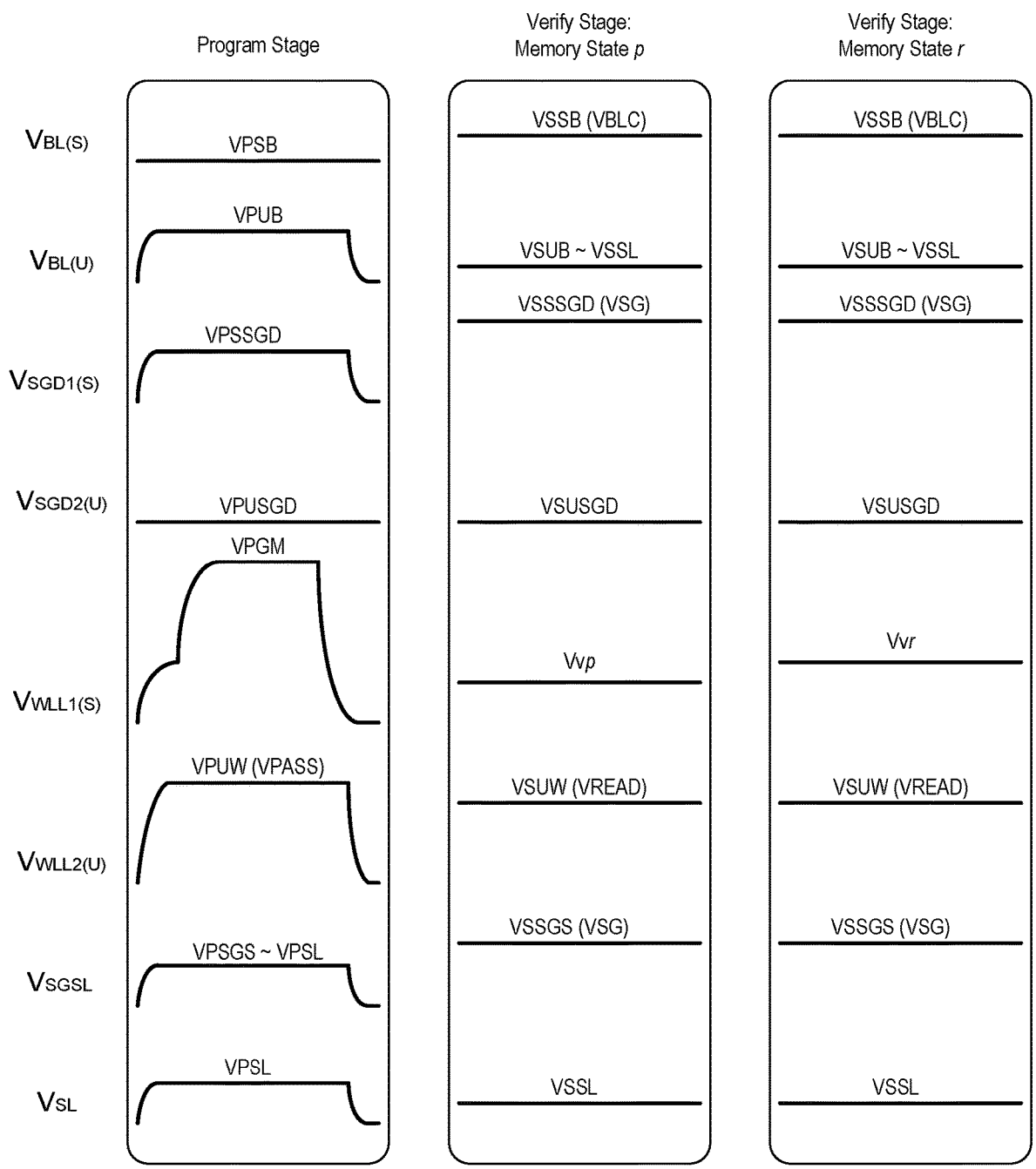
FIG. 9 is a timing diagram of voltage waveforms of the program and verify voltages generated on the control lines of the block of FIGS. 8A-8C during the program and verify stages.

The program operation described with reference to FIGS. 8A-8C and 9 includes a program stage and two verify stages of a program-verify cycle. Application of the program voltages to the control lines of the block 800 during the program stage is described with reference to FIG. 8A. Application of verify voltages to the control lines of the block 800 during a first verify stage is described with reference to FIG. 8B. Application of verify voltages to the control lines of the block 800 during a second verify stage is described with reference to FIG. 8C. FIG. 9 shows a timing diagram of voltage waveforms of the program and verify voltages generated on the control lines of the block 800 during the program and verify stages.

Referring to FIG. 8A, in the example program operation, the program controller 622 has determined to program data into a first word line cell group WLCG1 coupled to the first word line WLL1. Accordingly, the program controller 622 identifies the first word line WLL1 as a selected word line WLL1(S), and the second word line WLL2 as an unselected word line WLL2(U). In addition, the program controller 622 identifies the first word line cell group WLCG1 as a selected word line cell group WLCG1(S), and the other word line cell groups as unselected word line cell groups WLCG(U). The three memory cells MC1, MC2, MC3 of the selected word line cell group WLCG1(S) are selected memory cells MC1(S), MC2(S), MC3(C) of the program operation. The selected memory cells MC(S) of the selected word line cell group WLCG(S) may represent at least a portion of the selected word line cell group 624 of FIG. 6. The other memory cells of the unselected word line cell groups are unselected memory cells MC(U).

In addition, in the example program-verify cycle, the program controller 622 determines that second selected memory cell MC2(S) is sufficiently programmed, and configures it in the program-inhibited state or as a program-inhibited memory cell P-I MC2(S). However, the program controller 622 determines that the first and third selected memory cells MC1(S), MC3(S) are insufficiently programmed and wants to subject them to a program pulse during the program stage. Accordingly, the program controller 622 configures the first and third selected memory cells MC1(S), MC3(S) in the program-enabled state or as program-enabled memory cells P-E MC1(S), P-E MC3(S).

As shown in FIG. 8A, the first bit line BL1 is coupled to the first selected memory cell MC1(S), the second bit line BL2 is coupled to the second selected memory cell MC2(C), and the third bit line BL3 is coupled to the third selected memory cell MC3(C). Accordingly, the program controller 622 identifies the first and third bit lines as selected bit lines BL1(S), BL3(S), since they are coupled to the program-enabled memory cells P-E MC1(S), P-E MC3(S). In addition, the program controller 622 identifies the second bit line as an unselected bit line BL2(U) since it is coupled to the program-inhibited memory cell P-I MC2(S).

In addition, the selected memory cells MC(S) of the selected word line cell group WLCG(S) are coupled to the first SGD line SGD1. Accordingly, the program controller 622 identifies the first SGD line SGD1 as a selected SGD line SGD1(S) and the second SGD line SGD2 as an unselected SGD line SGD2(U) for the program stage.

To properly bias the control lines during the program stage, the program controller 622 may control the voltage supply circuit 604 to generate its voltages at program levels (rather than verify levels). In addition, the program controller 622 may control the row and column decoders 614, 618 to ensure that the selected and unselected voltages are properly routed or supplied to the selected and unselected lines it has identified. In particular, the program controller 622 may control the row decoder 614 so that the row decoder 614 supplies the selected word line voltage $V_{WLS}$ to the selected first word line WLL1(S), the unselected word line voltage $W_{WLU}$ to the unselected second word line WLL2(U), the selected SGD line voltage $V_{SGDS}$ to the selected first SGD line SGD1(S), and the unselected SGD line voltage $V_{SGDU}$ to the unselected second SGD line SGD2(U). In addition, the program controller 622 may control the column decoder 618 so that the column decoder 618 supplies the selected bit line voltage $V_{BLS}$ to the selected first and third bit lines BL1(S), BL3(S), and supplies the unselected bit line voltage $V_{BLU}$ to the unselected second bit line voltage BL2(U).

With reference to FIGS. 8A and 9, during the program stage, the selected first word line WLL1(S) may generate a selected word line voltage at a program level in the form of a program gate voltage pulse (or just program voltage pulse or program pulse). For example, the control gate line supply circuit 614 may supply the selected word line voltage $V_{WLS}$ in the form of a program pulse, and in response, the selected first word line WLL1(S) may generate a program pulse in response to receipt of the selected word line voltage $V_{WLS}$. As used herein, a program gate voltage pulse (or just program voltage pulse or program pulse) is a voltage that is generated, supplied, output, or applied to change a level, value, magnitude, or state of a storage parameter of a memory cell in order to program the memory cell during a program operation. For NAND technology, the program pulse is a voltage applied to or used to bias a selected word line and/or that is applied to the control gates of memory cells coupled to the selected word line. At least for NAND technology, a program-enabled selected memory cell (or just program-enabled memory cell) is a memory cell that responds, or is at least configured to response, to a program pulse by increasing a level of its threshold voltage.

FIG. 9 shows that during the program stage, the selected word line WLL1(S) generates the program pulse by increasing the selected word line voltage $V_{WLU(S)}$ from an initial voltage level up to a program pulse level VPGM. The selected word line WLL1(S) maintains the program pulse at the program pulse level VPGM for a predetermined period of time, and then decreases the voltage back down toward the predetermined period of time at or near the end of the program stage. For at least some embodiments, the program pulse level is in a range of about 16 volts (V) to 22 V. Additionally, program controller 622 may control the program pulse level, such as by increasing the level of the selected word line voltage $V_{WLS}$ during the program stage. For some example configurations, the program pulse level may increase according to an increasing number of program-verify cycles performed.

For at least some program operations, in order for the program-enabled memory cells to increase their threshold voltage levels in response to a program pulse, the program-enabled memory cells have their drain terminals (or just drains) biased to a voltage at a level lower than the program pulse level VPGM and have their source terminals (or just sources) cut off or electrically disconnected from the source line SL. In particular example configurations, the level lower than the program pulse level VPGM is the ground reference voltage level 0 V. To achieve this biasing, the selected bit lines are configured to bias the drain-sides of channels coupled to the program-enabled memory cells with selected bit line voltages at a program selected bit line level VPSB that is lower than the program pulse level VPGM, such as 0 V for example. FIG. 9 collectively labels the selected bit line voltages generated on the selected bit lines BL1(S) and BL3(S) as $V_{BL(S)}$, and shows the selected bit line voltages $V_{BL(S)}$ at a program selected bit line level VPSB during the program stage.

In addition, at least for some example configurations, the SGS line SGSL and the source SL generate their respective SGS line and source line voltages $V_{SGSL}$, $V_{SL}$ at levels that are the same or about the same as each other in order to turn off the SGS transistors SGST during the program stage, which in turn cuts off the source terminals of the memory cells from the source line SL. For some example configurations, the source line SL generates its source line voltage $V_{SL}$ at a program source line level VPSL that is positive (i.e., above the ground reference voltage 0 V), such as 2 V for example, to more effectively cut off the source line SL from the source terminals and/or to reduce the likelihood or impact of channel disturbs. The program source line level VPSL may alternatively be referred to as a program source level PROGSRC. The SGS line SGSL may generate its SGS line voltage $V_{SGSL}$ at a program SGS level that is the same as or about the same as the program source line level VPSL, as indicated in FIG. 9.

In addition, during the program stage, the unselected word line WLL2(U) may generate an unselected word line voltage $V_{WLL2(U)}$ at a program unselected word line level VPUW. In some example configurations, the unselected word line voltage generated by unselected word lines may be referred to as a pass voltage or a voltage generated at a pass voltage level VPASS. In addition or alternatively, for at least some example configurations, the program unselected word line level VPUW (or pass voltage level VPASS) may be in a range of about 8-11 V, such as 10 V for example, although other voltage levels may be possible.

Also, the unselected bit lines may bias the drain-sides of channels coupled to program-inhibited memory cells, and in turn the drains of the program-inhibited memory cells, with an unselected bit line voltage at a program unselected bit line level VPUB that will lock out or prevent selected memory cells from increasing their threshold voltage in response to the program pulse. For at least some example configurations, the program unselected bit line level VPUB is higher than the program selected bit line level VPSB, such as in a range of about 2-3 V for example. Also, for at least some example configurations, the program unselected bit line level VPUB may alternatively be referred to as a sense amp VDD level VDDSA. Accordingly, FIGS. 8A and 9 illustrate the unselected bit line BL2(U) biasing the program-inhibited memory cell P-I MC2(U) with an unselected bit line voltage $V_{BL2(U)}$ at the program unselected bit line level VPUB.

Also, for the example program operation in FIG. 8, the selected bit lines BL1(S), BL3(S) and the selected word line WLL1(S) are also coupled to unselected memory cells that are not to be programmed during the program operation, namely the first and third unselected memory cells MC1(U), MC3(U) of the unselected word line cell group WLCG2(U). For this situation (and other similar situations during program operations), the SGD lines SGD1, SGD2 are used to program-enable those memory cells that are part of the selected word line cell group WLCG1(S), and to program-inhibit those memory cells that are part of the unselected word line cell group WLCG2(U).

To do so, the first SGD line SGD1 is configured as a selected SGD line SGD1(S) that generates a selected SGD line voltage at a program selected SGD level VPSSGD, which in turn configures the SGD transistors coupled to the first SGD line SGD1 as enabled SGD transistors SGDT(E). As used herein, an enabled SGD transistor is an SGD transistor that enables or allows a selected bit line to bias the drain terminal of a memory cell coupled to the selected bit line. Otherwise stated, an enabled SGD transistor is a transistor that enables or allows a drain terminal of a memory cell to be biased by a selected bit line. Accordingly, with respect to FIG. 8A, by being coupled to both selected bit lines BL1(S), BL3(S) and the selected SGD line SGD1 (S), first and third SGD transistors coupled to the first SGD line SGD1(S) are configured as enabled SGD transistors SGDT1(E), SGDT3(E) and, in turn, program-enable the first and third selected memory cells MC1(S), MC(3) of the selected word line cell group WLCG1(S).

On the other hand, the second SGD line SGD2 is configured as an unselected SGD line SGD2(U) that generates an unselected SGD line voltage at a program unselected SGD level VPUSGD, which in turn configures the SGD transistors coupled to the unselected second SGD line SGD2 (U) as inhibited SGD transistors SGDT(I). An inhibited SGD transistor is an SGD transistor that prevents, inhibits, or locks out a selected bit line from biasing the drain terminal of a memory cell coupled to the selected bit line. Otherwise stated, an inhibited SGD transistor is a transistor that prevents, inhibits, or locks out a drain terminal of a memory cell from being biased by a selected bit line. Inhibiting an SGD transistor may alternatively be referred to as boosting the SGD transistor. With respect to FIG. 8A, by being coupled to both the selected bit lines BL1(S), BL3(S) and the unselected SGD line SGD2(U), the first and third SGD transistors coupled to the second SGD line SGD2(U) are configured as inhibited SGD transistors SGDT1(I), SGDT3(I) and, in turn, program-inhibit the first and third unselected memory cells MC1(U), MC3(U) of the unselected word line cell group WLCG2(U).

For some example configurations, the program selected SGD level is higher than the program unselected SGD level. In particular configurations, the program selected SGD level PSSGD is 3 V, and the program unselected SGD level PUSGD is 0 V, although other voltage levels may be possible.

In general, certain combinations of selected and unselected SGD and bit line voltages applied to the SGD transistors may either enable them or inhibit them. In particular implementations, the combination of a selected SGD line voltage and a selected bit line voltage applied may enable the SGD transistors, and the other combinations may inhibit the SGD transistors.

In further detail, an SGD transistor SGDT that has its control gate biased with a selected SGD line voltage and its drain biased with a selected bit line voltage may be enabled. Accordingly, the program circuit 600 may enable an SGD transistor by supplying a selected SGD line coupled to the SGD transistor with the selected SGD line voltage $V_{SGDS}$ and supplying a selected bit line coupled to the SGD transistor with the selected bit line voltage $V_{BLS}$.

An SGD transistor that has its control gate biased with a selected SGD line voltage and its drain biased with an unselected bit line voltage may be inhibited. This type of inhibiting may be referred to as x-mode boosting. The program circuit 600 may perform x-mode boosting to inhibit an SGD transistor by supplying a selected SGD line coupled to the SGD transistor with the selected SGD line voltage $V_{SGDS}$ and an unselected bit line coupled to the SGD transistor with the unselected bit line voltage $V_{BLU}$.

An SGD transistor that has its control gate biased with an unselected SGD line voltage and its drain biased with an unselected bit line voltage may be inhibited. This type of inhibiting may be referred to as xy-mode boosting. A program circuit 600 may perform xy-mode boosting to inhibit an SGD transistor by supplying an unselected SGD line coupled to the SGD transistor with the unselected SGD line voltage $V_{SGDU}$ and by supplying an unselected bit line coupled to the SGD transistor with the unselected bit line voltage $V_{BLU}$.

An SGD transistor that has its control gate biased with an unselected SGD line voltage and its drain biased with a selected bit line voltage may be inhibited. This type of inhibiting may be referred to as y-mode boosting. A program circuit 600 may perform y-mode boosting to inhibit an SGD transistor by supplying an unselected SGD line coupled to the SGD transistor with the unselected SGD line voltage $V_{SMU}$ and by supplying a selected bit line coupled to the SGD transistor with the selected bit line voltage $V_{BLS}$.

Referring particularly to the program operation described with reference to FIGS. 8A-8C and 9, the program controller 622 may control the voltage supply circuit 604 to supply the program voltages to the control gate lines for a predetermined period of time associated with the program stage. Upon expiration of the predetermined time period, the program controller 622 may control the voltage supply circuit 604 to lower the program voltages to initial levels in order to end, terminate, or exit the program stage. Upon exiting the program stage, the program controller 622 may transition the program operation to an initial verify stage of the program-verify cycle.

In general, the program controller 622 can control the transitioning of stages performed in a program operation. A transition of a program operation is a movement or a progression of the program operation from one stage to another stage, such as from a first stage to a second stage, or from a current stage to a next stage. The two stages can be in the same program cycle. For example, the transition can be a transition from a program stage to a verify stage, or can be a transition from one verify stage to another verify stage, such as in accordance with a verify order of a program-verify cycle. Alternatively, the two stages can be in different program cycles. For example, for two program-verify cycles, the transition can be from a last verify stage of a current program-verify cycle to a program stage of a next program-verify cycle. As another example, for two program-only cycles, the transition can be from a program stage of a current program-only cycle to a program stage of a next program-only cycle.

The program controller 622 may control the transitioning of the stages by controlling the program and verify voltages that the voltage supply circuit 604 supplies to the control lines of the block 602. For example, as illustrated in FIG. 9, the program controller 622 ends or terminates the program stage at least by transitioning the program voltages from program levels down to initial levels. This includes stopping the supply of the program pulse to the selected word line WLL1(S), causing the selected word line WLL1(S) to decrease its selected word line voltage from the program pulse level VPGM down to an initial level, such as 0 V for example.

Another example, the program controller 622 may control the transitioning by changing the level of at least one of the control line voltages. To transition from a program stage to a verify stage, the program controller 622 may change all of the levels from program voltage levels to verify voltage levels. When transitioning from a first verify stage to a second verify stage, the program controller 622 may control the transition by changing at least one of the verify voltage levels. For example, the program controller 622 may change a verify voltage pulse applied to the selected word line from a first verify voltage pulse level to a second verify voltage pulse level. In addition, the program controller 622 may control the transition of one verify stage to a next verify stage by changing the voltage levels of the bit line voltages according to the bit lines changing their selected statuses between verify stages.

In further detail with respect to the example program operation of FIGS. 8A-8C and 9, suppose for example that the three selected memory cells MC1(S), MC2(S), MC3(S) have target memory state p, target memory state q, and target memory state r, respectively, where the memory states p, q, and r, are any of various memory states into which memory cells can be programmed under a given storage scheme. FIG. 8B shows example biasing conditions for the block 800 to verify the first selected memory cell MC1(S) for memory state p. FIG. 8C shows example biasing conditions for the block 800 to verify the third selected memory cell MC3(S) for memory state r.

The verify stage to verify the first selected memory cell MC1(S) for memory state p is referred to as the first verify stage, and the verify stage to verify the third selected memory cell MC2(S) for memory stage r is referred to as the second verify stage. The first verify stage may or not be the initial verify stage performed directly after the program stage, depending on the verify order. That is, the program controller 622 may or may not directly transition from the program stage to the first verify stage, depending on the verify order. Where the program controller 622 does not directly transition to the first verify stage, the program circuit 600 may perform one or more other verify stages before performing the first verify stage. Additionally, the second verify stage is generally referred to as being performed or occurring after the first verify stage. However, the program controller 622 may or may not directly transition from the first verify stage to the second verify stage, depending on the verify order. Where the program controller 622 does not directly transition to the second verify stage, the program circuit 600 may perform one or more other verify stages after the first verify stage before performing the second verify stage. FIG. 9 shows example voltage waveforms of the verify voltages generated on the control lines of the block 800 for verifying the first and third selected memory cells MC1(S), MC3(S) during the first and second verify stages.

With reference to FIGS. 8B and 9, during the first verify stage, the selected first word line WLL1(S) may generate a selected word line voltage at a verify level in the form of a verify gate voltage pulse, or just verify voltage pulse or verify pulse. For example, the control gate line supply circuit 614 may supply the selected word line voltage $V_{WLS}$ in the form of a verify pulse, and in response, the selected first word line WLL1(S) may generate a verify pulse. As used herein, a verify gate voltage pulse (or verify voltage pulse or verify pulse) is a voltage that is generated, supplied, output, or applied to verify selected memory cells. In general, during a given verify stage, the selected word line generates a verify pulse at a given verify pulse level Vv that corresponds to the memory stage associated with the given verify stage. The given verify pulse level may be a predetermined level aligned with a lower tail of a model or target threshold distribution curve. Example verify pulse levels Vv include those shown and previously described with reference to FIGS. 5A-5D. FIGS. 8B and 9 show the selected word line WLL1(S) generating the verify pulse at a pth verify pulse level $V_{vp}$ associated with verifying selected memory cells having target memory state p.

For a given program-verify cycle that includes a plurality of verify stages, the selected word line may sequentially generate a plurality of verify pulses, each during one of the multiple verify stages, and each at a respective verify pulse level Vv corresponding to the verify stage in which the verify pulse is being generated. In particular example configurations, the selected word line may sequentially generate the plurality of verify pulses by transitioning the selected word line voltage from one verify pulse level to a next verify pulse level as the program circuit 600 transitions from one verify stage to the next. For at least some verify operations, the selected word line may transition from one verify pulse level to the next without decreasing the selected word line voltage down to an initial or low level (e.g., 0 V) in between verify pulses. Another way to characterize the generation of the verify pulses during a program-verify cycle is that during a program-verify cycle that includes a plurality of verify stages, the selected word line generates a verify pulse at a plurality of verify pulse levels, each corresponding to one of the plurality of verify stages. For some example configurations, a range of the various verify pulse levels may extend from a lowest verify pulse level of 0.8 V to a highest verify pulse level of 6 V, although other verify pulse levels or range of verify pulse levels may be possible.

As previously described, the program circuit 600 verifies selected memory cells during verify stages by determining the program statuses of the selected memory cells. In the verify stages, the program circuit 600, through use of the sense circuits 620, performs sense operations to verify the selected memory cells by sensing their program statuses—i.e., by sensing whether and when the selected memory cells are sufficiently programmed. Otherwise stated, the program circuit 600 executes or performs verify stages by performing sense operations to sense or otherwise determine program statuses of selected memory cells.

In general, as used herein, a sense operation is a memory operation performed to determine a response of a memory cell that is biased according to predetermined bias conditions. A bias with which the memory cell is biased during a sense operation may be any of various types of bias, including any number of biases or any type of bias, such as a voltage, a current, or any of various signals such as direct current (DC) signals or alternating current (AC) wired or wireless signals that can affect a behavior or trigger a response of the memory cell. A status of a memory cell is generally a condition or a state of the memory cell. The status may be one of a plurality of possible predetermined conditions or states in which the memory cell can be. A response of the memory cell when subjected to the bias conveys or communicates the status of the memory cell.

In further detail, a status of a memory cell may be any of various types of statuses. The status type may pertain or be specific to the memory operation for which a sense operation is performed. As previously described, one type of status is a program status, which can include sufficiently programmed, insufficiently programmed, or over-programmed. During a verify stage, a sense circuit performs a sense operation to determine the program status of a memory cell—i.e., to determine of the memory cell is sufficiently programmed or insufficiently programmed. Another status type is a read status, which is the memory state of a memory cell. As described in further detail below, a sense circuit may perform a sense operation during a read stage of a read operation to sense the memory state of a memory cell, and in turn the data value of the data that the memory cell is storing.

A response of the memory cell produced during a sense operation may be any of various measurable properties of an electrical signal, such as a DC or AC voltage or current, or an electromagnetic wave, that the memory cell can generate, conduct, induce, emit, radiate, or otherwise cause to be created in response to being biased during the sense operation. Example measurable properties may include a magnitude, an amount, a level, a frequency, a slope, a duty cycle, a pulse width, a waveform type (sinusoidal, square, sawtooth, e.g.), a rate of change (e.g., a rate of decay or a rate of increase), a modulation, or a signal-to-noise ratio, as non-limiting examples. The type of the response and the value of the response that is measured or sensed may depend on a storage parameter of the memory cell and the level, value, or state of the storage parameter, which in turn indicates the status of the memory cell.

At least for NAND technology, a response of a memory cell is a current that the memory cell draws or causes to be drawn through a bit line. During a sense operation, a memory cell is biased with a predetermined set of voltages to induce the memory cell to draw a current through a bit line. An amount of current that the memory cell draws or causes to draw depends on a threshold voltage level of the memory cell, and in turn, indicates a status, such as a program status or a read status of the memory cell.

A sense circuit is a circuit that senses a response of a memory cell while the memory cell is being biased during a sense operation. A sense circuit can sense the response by sensing or detecting a presence or absence of the response, and/or by measuring an amount, level, value, or magnitude of the response. The function of sensing a status of a memory cell performed by the sense circuits 620 in FIG. 6 have circuit structures that connect to the bit lines BL coupled to the memory cells by enabling or forming current paths that allow currents to flow through them to the bit lines. Other structural configurations for performing the function of current sensing may be possible. For example, other example sense circuits may be connected to the word lines instead of the bit lines, and determine the statuses of the memory cells based on current flow drawn through the word lines. Other example sense circuits may sense a voltage on a word line or a bit line without necessarily having that voltage be dependent on current drawn through the selected memory cells. For such configurations, the sense circuit performs voltage sensing rather than current sensing to determine statuses of the selected memory cells.

Turning back to the first verify stage in FIG. 8B, the sense circuits 620 perform sense operations to sense current drawn through selected bit lines coupled to verify-enabled memory cells having target memory state p while the selected word line WLL1(S) generates a verify pulse at the pth verify pulse level Vvp. For verify-enabled cells that are insufficiently programmed—e.g., have a threshold voltage that is below the range of threshold voltage levels associated with memory state p, the verify pulse at the pth verify pulse level Vvp will be higher than the threshold voltages of the insufficiently programmed memory cells, causing those verify-enabled memory cells to conduct or draw current through the selected bit lines to which they are coupled. Otherwise stated, during a verify stage, verify-enabled memory cells draw current through the selected bit lines to which they are coupled when they are insufficiently programmed. On the other hand, for verify-enabled cells that are sufficiently programmed—e.g., have a threshold voltage that is in the range of threshold voltage levels associated with memory state p, the verify pulse at the pth verify pulse level Vvp will be below or lower than the threshold voltages of the sufficiently programmed memory cells, preventing those verify-enabled memory cells from conducting or drawing current through the selected bit lines to which they are coupled. Otherwise stated, during a verify stage, verify-enabled memory cells draw no or an insignificant amount of current through the selected bit lines to which they are coupled when they are sufficiently programmed.

In practical implementation for at least some example configurations, verify-enabled memory cells may draw varying amounts of current, and in some embodiments, may be characterized as fully conducting or partially conducting depending on how close their threshold voltages are to the verify pulse level. Different program circuits 600 and their respective sense circuits may handle sense operations and identify program statuses in various ways according to different responses of verify-enabled memory cells.

In the focused example in FIG. 8B, of the three selected memory cells MC(S), only the first selected memory cell MC1(S) has the target memory state p, and so only the first selected memory cell of the three is a verify-enabled memory cell V-E MC1(S) in the first verify stage. The other two selected memory cells MC2(S), MC3(S) are verify-inhibited memory cells V-I MC2(S), V-I MC3(S). Accordingly, during the first verify stage, the first bit line BL1 is a selected bit line BL1(S), and the second and third bit lines BL2, BL3 are unselected bit lines BL2(U), BL3(U).

For the first verify stage, the control lines of the block 800 are biased so that a sense circuit 620 coupled to the selected bit line BL1(S) can sense whether the first selected memory cell MC1(5) draws current through the selected first bit line BL1(S) in response to its control gate being biased with the verify pulse at the pth verify pulse level Vvp. Herein, during verify stages, the verify levels at which the control lines are biased are also or alternatively referred to as sense levels, in the context that sense operations are performed to verify the memory cells.

In further detail, the selected first bit line BL1(S) is configured to generate a selected bit line voltage $V_{BL1(S)}$ at a verify or sense selected bit line level VSSB (or VBLC). The unselected second and third bit lines BL2(U), BL3(U) are configured to generate unselected bit line voltages $V_{BL2(U)}$, $V_{BL3(U)}$ (collectively labeled in FIG. 9 as unselected bit line voltage $V_{BL(U)}$ at a verify or sense unselected bit line level VSUB. During verify stages (or during sense operations), the sources of the memory cells are not cut off from the source line, and so for at least some embodiments, the sense bit line levels are measured, indicated, designed for, or referenced, with reference to the source line voltage $V_{SL}$. In particular configurations, the sense selected bit line level VSSB is a positive voltage above a sense source line level VSSL, such as in a range of about 0.2 V to 0.8 V above the sense source line level VSSL. The sense unselected bit line level VUSB is the same or about the same as the sense source line level VSSL, so that there is a zero voltage difference between the source and drain ends of channels including verify-inhibited memory cells, which in turn may prevent current flow through the unselected bit lines and verify-inhibited memory cells, thereby reducing power consumption during the first verify stage.

The sense source line level VSSL may alternatively be referred to as a cell source level VCELSRC. In some example configurations, the sense source line level VSSL is at the ground reference voltage level 0 V. In other example configurations, the sense source line level VSSL is a positive voltage above 0 V, such as 1 V for example. One benefit of the source line SL generating its source line voltage $V_{SL}$ at a positive voltage (e.g., 1 V) is to sense for a negative threshold voltage of memory cells by creating a negative voltage difference between the source line voltage and a selected word line voltage. Creating a bias setting that allows for sensing negative threshold voltages by setting the sense line voltage $V_{SL}$ to a higher level than a selected bit line voltage may be easier from a design implementation, rather than trying to configure the voltage supply circuit 604 to generate a negative voltage below the ground reference voltage.

In addition, during the first verify stage, the unselected word line WLL2(U) may generate an unselected word line voltage $V_{WLL2(U)}$ at a verify or sense unselected word line level VSUW. In some example configurations, the unselected word line voltage generated by unselected word lines may be referred to as a read voltage or a voltage generated at a read voltage level VREAD. In addition or alternatively, for at least some example configurations, the sense unselected word line level VSUW (or VREAD) may be in a range of about 7-9 V, such as 8 V for example, although other voltage levels may be possible.

Also, similar to the program stage in FIG. 8A, the selected bit line BL1(S) and the selected word line WLL1(S) are also coupled to the unselected first memory cell MC1(U) of the unselected word line cell group WLCG2(U) during the first verify stage, as indicated in FIG. 8B. If the unselected first memory cell MC1(U) is verify-enabled during first verify stage, it could draw current through the selected bit line BL1(S), which could lead to the sense circuit coupled to the selected bit line BL1(S) identifying an incorrect program status of the selected first memory cell MC1(S) when performing the sense operation during the first verify stage. Similar to the program stage, the first and second SGD lines SGD1, SGD2 are configured as selected and unselected SGD lines, respectively, in order to verify-enable the selected memory cells coupled to the selected word lines and selected bit lines, and verify-inhibit the unselected memory cells coupled to selected word lines and selected bit lines.

With respect to FIG. 8B, the first SGD line SGD1 generates a selected SGD line voltage $V_{SGD1(S)}$ at a verify or sense selected SGD level VSSSGD level (which may also or alternatively be referred to as a select gate level VSG), which at least for some example configurations may be in a range of about 5-8 V. An SGD transistor that has its control gate biased with a selected SGD line voltage at the sense selected SGD level $V_{SGD2(U)}$ and its drain terminal biased with a selected bit line voltage at the sense selected bit line level VSSB (or VBLC) may be enabled or turned on to allow a memory cell to which it is coupled draw current during a verify stage if the memory cell is insufficiently programmed. In addition, the second SGD line SGD2 generates an unselected SGD line voltage $V_{SGD2(U)}$ at a verify or sense unselected SGD level VSUSGD level, which at least for some example configurations may be at or close to 0 V. An SGD transistor that has its control gate biased with an unselected SGD line voltage at the sense unselected SGD level VSUSGD despite having its drain terminal biased with a selected bit line voltage at the sense selected bit line level VSSB (or VBLC) may be inhibited or turned off to prevent or inhibit an unselected memory cell to which it is coupled draw current during a verify stage.

In addition, at least for some example configurations, the SGS line SGSL may generate the SGS line voltage $V_{SGSL}$ at a sense SGS level VSSGS, which may also be the same level as the sense selected SGD level VSSSGD. Otherwise stated, the selected SGD line SGD1 and the SGS line SGSL may generate their voltages at the same select gate level VSG during the first verify stage.

The program controller 622 may control the voltage supply circuit 604 at the verify or sense levels as shown in FIG. 8B during the first sense stage. During this time period, a sense circuit 620 coupled to the selected first bit line BL1(S) may perform a sense operation to sense for current drawn through the selected first bit line BL1(S). Based on the sensing, the sense circuit 620 may generate a sense result signal that indicates the program status of the verify-enabled memory cell V-E MC1(S) or otherwise keeps track or a record of the program status of the verify-enabled memory cell V-E MC1(S). The sense circuit 620 may output the sense result signal to the program controller 622 or otherwise allow the program controller 622 to determine the program status of the verify-enabled memory cell V-E MC1(S) so that the program controller 620 can determine whether to end the program operation, or at least determine whether to program-enable or program-inhibit the selected first memory cell MC1(S) for a next program cycle.

At the end of the first program stage, the program controller 622 may transition to a next verify stage. At some point during the program-verify cycle, the program controller 622 may transition to the second verify stage, either directly after or after performing one or more verify stages after the first verify stage. FIG. 8C shows example biasing conditions for the block 800 to verify the third selected memory cell MC3(S) for memory state r. FIG. 9 shows example voltage waveforms of the verify voltages generated on the control lines of the block 800 for verifying the selected third memory cells MC3(S) during the second verify stage.

For performance of the second verify stage, the block 800 may be biased similarly as in the first verify stage. One difference is that the selected word line WLL1(S) may generate a verify pulse at an rth verify pulse level associated with memory state r, instead of at the pth verify pulse level associated with memory state p. Also, since the selected third memory cell MC3(S) has the target memory state r, the selected third memory cell is a verify-enabled memory cell V-E MC3(S), while the selected first and second memory cells are verify-inhibited memory cells V-I MC1(S), V-I MC2(S). Accordingly, the first and second bit lines BL1, BL2 are configured as unselected bit lines BL1(U), BL2(U) for the second verify stage and generate unselected bit line voltages $V_{BL1(U)}$, $V_{BL2(U)}$ (collectively labeled in FIG. 9 as $V_{BL(U)}$) at the sense unselected bit line level VSUB, while the third bit line BL3 is configured as a selected bit line BL3(S) for the second verify stage and generates a selected bit line voltage $V_{BL3(S)}$ at the sense selected bit line level VSSB. The first and second SGD lines SGD1, SGD2 may continue to be selected and unselected SGD lines SGD1(S), SGD2(U), respectively so that the third SGD transistor SGDT3 coupled to the selected first SGD line SGD1(S) is an enabled SGD transistor SGDT3(E), and the third SGD transistor SGDT3 coupled to the unselected second SGD line SGD2(U) is an inhibited SGD transistor SGD3(I).

The program controller 622 may control the voltage supply circuit 604 to bias the control lines of the block 800 at their respective voltage levels until the program controller 622 determines that a predetermined period of time for performing the second verify stage has expired or ended. During the predetermined time period, the program controller 622 may control the sense circuits 620 to sense the program statuses of the verify-enabled memory cells. For example, with reference to FIG. 8C, the program controller 622 may control a sense circuit coupled to the selected third bit line BL3(S) to sense a status of the verify-enabled memory cell V-E MC3(S). At the end of the second program stage, the program controller 622 may transition to a next verify stage, or if the second verify stage is the last verify stage of the program-verify cycle, then program controller 622 may either end the program operation if all of the selected memory cells of the selected word line group WLCG1(S) are sufficiently programmed, or transition to a next program-verify cycle within the program operation.

As previously described, the program circuit 600 may perform a verify operation according to verify order that identifies the memory states to verify and the order in which to perform verify stages associated with the memory states during the verify operation. To perform the verify stages according to a verify order, the control gate line voltage supply circuit 606 may supply or apply a sequence of verify pulses at verify pulse levels Vv to the selected word line according to the verify order. As part of transitioning between verify stages, the control gate line voltage supply circuit 606 may supply a next verify pulse at a next verify pulse level to the selected word line according to the verify order. Accordingly, to transition from a current verify stage to a next verify stage, the control gate line supply circuit 606 transitions from supply a current verify pulse at a current verify pulse level to a next verify pulse at a next verify pulse level. The control gate line supply circuit 606 may transition from the current verify pulse to the next verify pulse by directly transitioning from the current verify pulse level to the next verify pulse level. That is, the control gate line supply circuit 606 does not transition a level of the current verify pulse to an initial or low voltage level (such as the 0 V, e.g.) before transitioning to supplying the next verify pulse. Accordingly, as the control circuit 600 performs and transitions through verify stages of a verify operation according to a verify order, the control gate line voltage supply circuit 606 sequentially applies the verify pulses according to the verify order by directly transitioning to next verify pulse levels as defined or determined by the verify order. In addition, throughout the duration of the verify operation over the plurality of verify stages, the control gate line voltage supply circuit 606 may maintain the other control gate line voltages at their respective verify levels.

Figure 10:
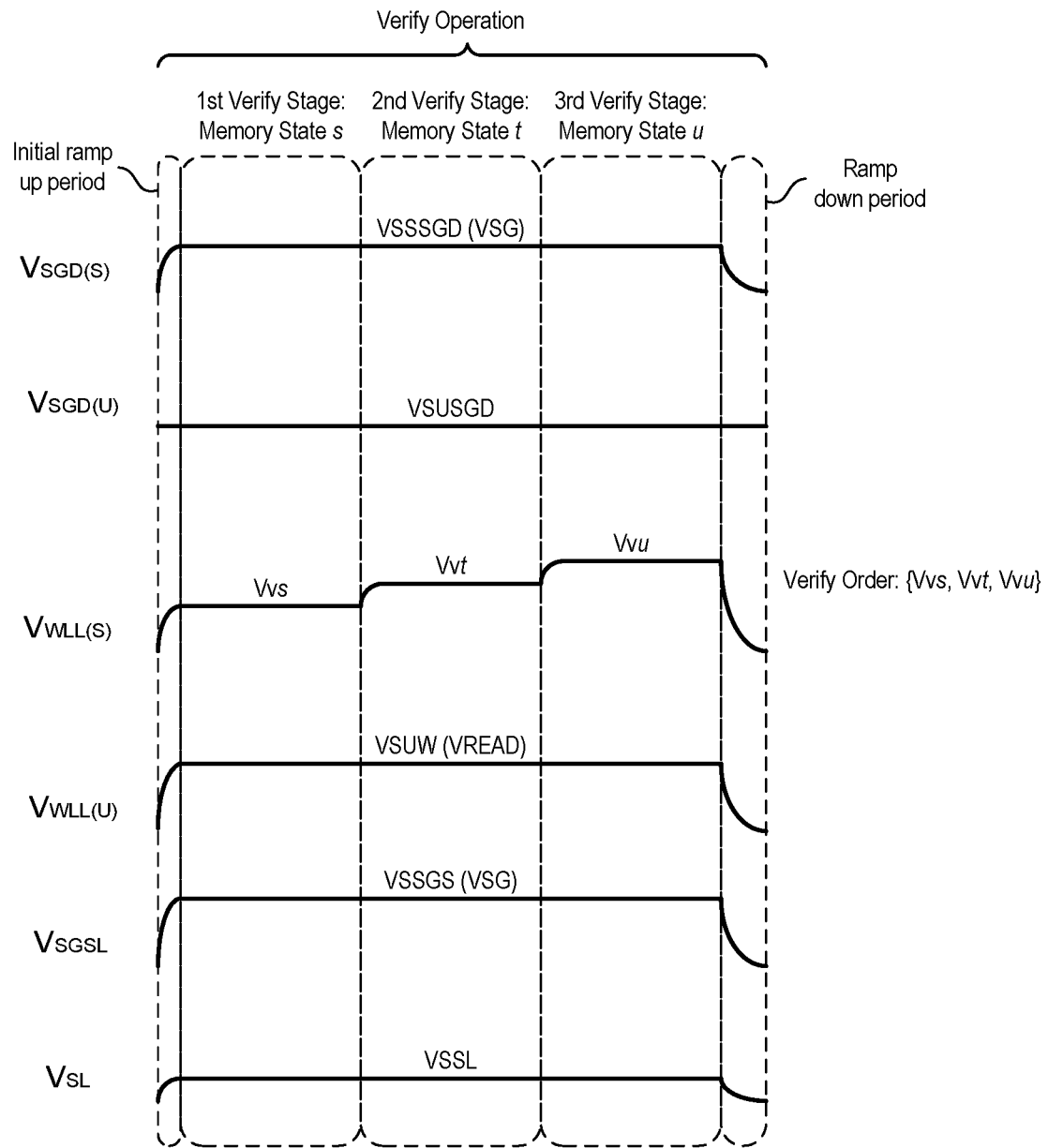
FIG. 10 is a timing diagram of voltage waveforms of control gate and source line voltages generated during consecutive verify stages of a verify operation.

FIG. 10 shows a timing diagram of example waveforms generated on the control gate lines of the block 602 during an example verify operation of a program-verify cycle of a program operation. In the example verify operation, the program controller 622 has determined to verify selected memory cells having memory state s, memory state t, and memory state u as their target memory states. Memory states s, t, and u may represent any of various memory states into which memory cells can be programmed. In addition, more or fewer than three memory states may be possible for other example verify operations.

In addition, the program controller 622 has determined a verify order of memory state s, memory state t, and memory state u. For particular configurations, the program controller 622 may determine the verify order according to sequentially increasing threshold voltage ranges. For example, with reference to FIG. 10, memory state t is associated with a higher threshold voltage range than memory state s, and memory state u is associated with a higher threshold range than memory states s and t. Accordingly, to perform the verify operation, the program controller 622 sets the verify order to be memory state s, then memory state t, and then memory state u.

To perform the verify operation, the program circuit 600 sequentially performs the verify stages for memory states s, t, and u in the verify order. That is, to perform the verify operation according to the verify order, the program controller 622 first performs a first verify stage for memory state s, then a second verify stage for memory state t, and then a third verify stage for memory state u.

The verify operation may include an initial ramp up time period during which the voltage supply circuit 604 ramps up voltages on at least some of the control gate lines from an initial voltage level (e.g., 0 V) to initial verify levels. As shown in FIG. 10, except for the selected word line voltage $V_{WLL(S)}$, the voltage supply circuit 604 maintains the verify or sense control gate line levels and the verify or sense source line level constant over the duration of the verify operation—i.e., over the consecutive verify stages.

With respect to the selected word line voltage $V_{WLL(S)}$, the voltage supply circuit 604, such as with the control gate line voltage supply circuit 606, may sequentially apply the voltage pulses at corresponding voltage pulse levels according to the verify stages being performed and the verify order in which the verify stages are performed for the verify operation. For example with respect to FIG. 10, the voltage supply circuit 604 may apply a first verify pulse to a selected word line WLL(S) at the sth verify pulse level Vvs during the first verify stage for memory state s, then supply a second verify pulse to the selected word line WLL(S) at the tth verify pulse level Vvt during the second verify stage, and then supply a third verify pulse to the selected word line WLL(S) at the uth verify pulse level Vvu during the third verify stage. At least in this context, the program circuit sequentially transitions through the verify stages by transitioning from applying a current verify pulse to applying a next verify pulse to the selected word line WLL(S) according to the verify order.

Also, at least for some example verify operations as shown in FIG. 10, the control gate line supply circuit 606 applies consecutive verify pulses over consecutive verify stages to the selected word line WLL(S) by directly transitioning a selected word line voltage $V_{WLL(S)}$ generated on the selected word line WLL(S) from a current verify pulse level to the next verify pulse level. For two consecutive verify stages including a current verify stage associated with a first memory state and a next verify stage associated with a second memory state, the control gate line voltage supply circuit 606 directly transitions the selected word line voltage $V_{WLL(S)}$ by generating the selected word line voltage $V_{WLL(S)}$ at a first verify pulse level associated with the first memory state, and then directly transitioning the selected word line voltage $V_{WLL(S)}$ from the first verify pulse level to a second verify pulse level associated with the second memory state when the verify operation transitions from the current verify stage to the next verify stage—i.e., when the current verify stage ends and the next verify stage begins.

For example, as shown in FIG. 10, the control gate line voltage supply circuit 604 generates the selected word line voltage $V_{WLL(S)}$ at the sth verify pulse level Vvs during the first verify stage. Then, when the first verify stage ends and the second verify stage begins, the control gate line voltage supply circuit 606 directly transitions from generating the selected word line voltage $V_{WLL(S)}$ at the sth verify pulse level Vvs to generating the selected word line voltage $V_{WLL(S)}$ at tth verify pulse level Vvt. Similarly, when the second verify stage ends and the third verify stage begins, the control gate line voltage supply circuit 606 directly transitions from generating the selected word line voltage $W_{WLL(S)}$ at the tth verify pulse level Vvt to generating the selected word line voltage $V_{WLL(S)}$ at the uth verify pulse level Vvu. In this context, the control gate line voltage supply circuit 606 may be considered to be sequentially stepping through the verify pulses or the verify pulse levels according to the verify order in order to perform the verify operation.

In addition, although not shown in the timing diagram of FIG. 10, during the verify stages, the bit line voltage supply circuit 608 may apply selected and unselected bit line voltages to the selected and unselected bit lines, as previously described. For example with respect to FIG. 10, during the first program state, the bit line voltage supply circuit 608 may apply a selected bit line voltage to those bit lines coupled to selected memory cells having memory state s as their target memory states in order to verify-enable those selected memory cells, and may apply an unselected bit line voltage to those bit lines coupled to selected memory cells having target memory states other than memory state s in order to verify-inhibit those selected memory cells during the first verify stage. When the verify operation transitions from the first verify stage to the second verify stage, the bit line voltages supply circuit 608 may change or transition its bit line biasing so that it applies the selected bit line voltage to those bit lines coupled to selected memory cells having memory state t as their target memory states in order to verify-enabled those selected memory cells, and may apply the unselected bit line voltage to those bit lines coupled to selected memory cells having target memory states other than memory state tin order to verify-inhibit those selected memory cells during the second verify stage. The bit line voltage supply circuit 608 may similarly change its bit line biasing when transitioning to the third verify stage for memory state u.

Also, as previously described, during each stage, the program controller 622 may control the sense blocks 620 during each verify stage in order to verify the program statuses of the verify-enabled memory cells. For example, during the first verify stage, the program controller 622 may control the sense blocks 620 coupled to the selected bit lines to sense the program statuses of verify-enabled memory cells having memory state s as their target memory states. Then, during the second verify stage, the program controller 622 may control the sense blocks 620 coupled to the selected bit lines to sense the program statuses of verify-enabled memory cells having memory state t as their target memory states. Similarly, during the third verify stage, the program controller 622 may control the sense blocks 620 coupled to the selected bit lines to sense the program statuses of the verify-enabled memory cells having memory state u as their target memory states. At the end of the verify operation, the program controller 622 will have obtained, or at least have had the sense blocks 620 sense, the program statuses of the various selected memory cells having memory states s, t, and u during the three verify stages.

At or immediately following the end of the last verify stage, the verify operation may include a ramp down period to conclude the verify operation. During the ramp down period, the voltage supply circuit 604 may ramp down or decrease the verify voltages on the control lines (including the control gate and source lines as shown in FIG. 10) back to initial levels.

Figure 11:
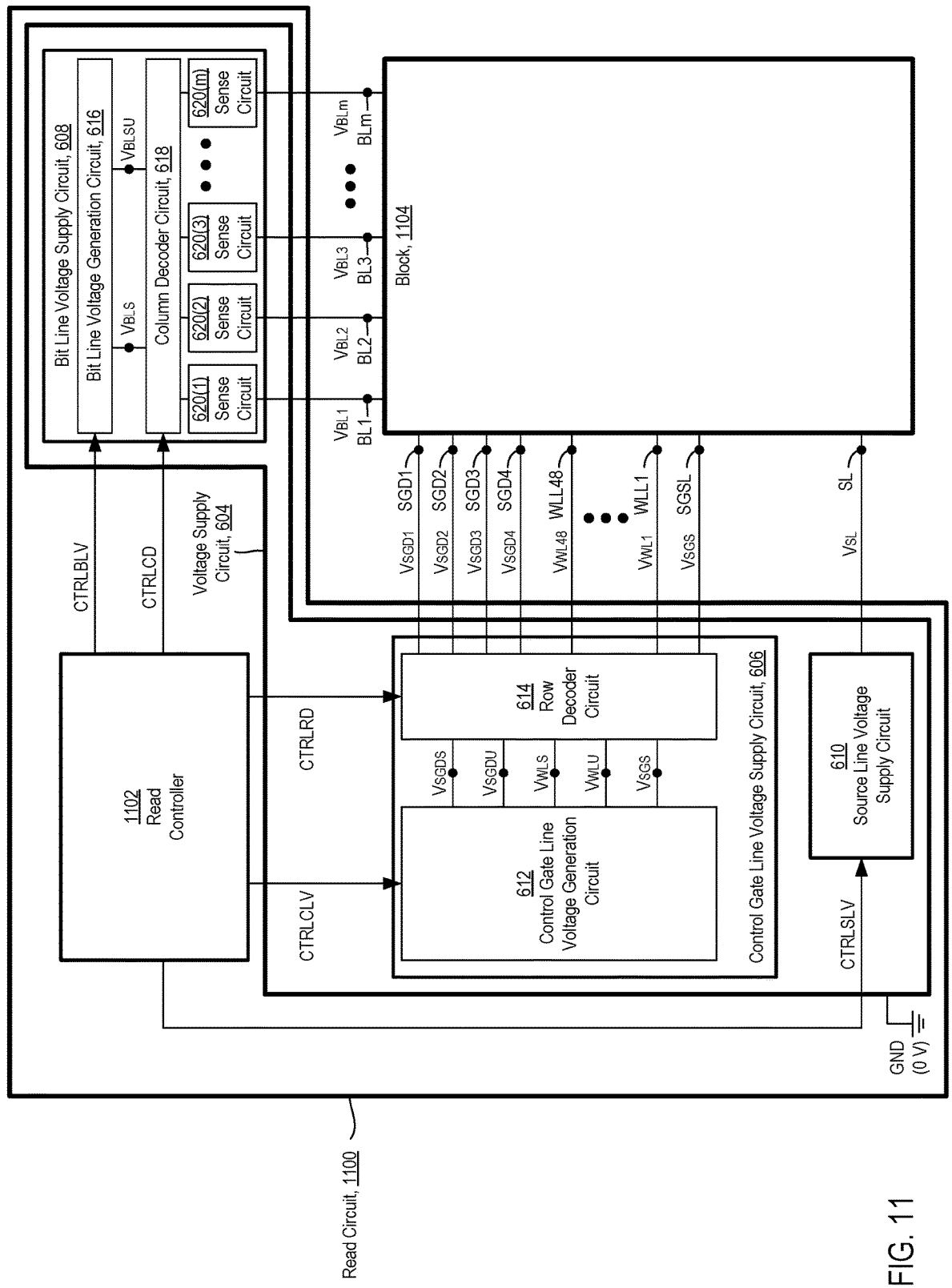
FIG. 11 is a block diagram of an example read circuit of the memory die of FIG. 2B configured to read data from blocks.

FIG. 11 is a block diagram of an example read circuit 1100 configured to perform read operations to read data from a block 1104. As used herein, a read circuit is a circuit, or a collection of circuits or circuit components, that reads data from memory cells. In particular example embodiments, a read circuit is located on the same memory die as the memory cells from which it is reading. Also, as used herein, a read operation is a memory operation that a read circuit performs to read data from memory cells.

The block 1104 may be the same or a similar block as the block 602 of FIG. 6. FIG. 11 shows the block 1104 as including the same configuration of control lines as the block 602 of FIG. 6. In addition or alternatively, the block 1104 may be a block of the memory cell structure 142, one of the blocks BLK in FIG. 3A, 3B, or 4A, have the physical construction or structure of the block 410 if FIGS. 4B, 4C, and/or have the circuit configuration of the block 480 in FIG. 4D.

For at least some example configurations, such as the one shown in FIG. 11, the read circuit 1100 may include the same voltage supply circuit 604 as the program circuit 600 in FIG. 6, and so the voltage supply circuit 604 and its components are labeled or numbered the same way as they are in FIG. 6. The read circuit 1100, however, is configured to generate and supply read voltages, or voltages at read levels, to the control lines rather than program and verify voltages. In particular example configurations, the voltage supply circuit 604 may include separate circuit components to generate separate read voltages for the read operations, and supply those read voltages, rather than the program voltages or the verify voltages, to the control line during read operations. For other example configurations, the voltage supply circuit 604 may include the same circuit components to generate the program, verify, and read voltages, and may be configured to change or adjust the levels of the voltages as necessary in order to perform program and read operations.

In general, during read operations, the bit line voltage supply circuit 608 is configured to supply or apply read selected and unselected bit lines voltages $V_{BLS}$, $V_{BLU}$ (or selected and unselected bit line voltages $V_{BLS}$, $V_{BLU}$ at read levels to the selected and unselected bit lines of the block, the control gate line voltage supply circuit is configured to supply or apply read control gate line voltages (or control gate line voltages at read levels) to the control gate lines of the block. In particular, during a read operation, the control gate line voltage supply circuit is configured to supply or apply a read selected SGD line voltage $V_{SGDS}$ (or a selected SGD line voltage at a read level) to a selected SGD line of the block 1104, a read unselected SGD line voltage $V_{SGDU}$ (or an unselected SGD line voltage at a read level) to unselected SGD lines of the block 1104, a read a selected word line voltage $V_{WLS}$, such as in the form of a read gate voltage pulse (or just read voltage pulse or read pulse), to a selected word line of the block 1104, a read unselected word line voltage $W_{WLU}$ (or an unselected word line voltage at a read level) to unselected word lines of the block 1104, and a read SGS line voltage $V_{SGS}$ (or a SGS line voltage at a read level) to the SGS line of the block 1104. The source line voltage supply circuit 610 is configured to supply or apply a read source line voltage $V_{SL}$ or a source line voltage at a read level) to the source line of the block.

In particular example configurations, such as shown in FIG. 11, the bit line voltage generation circuit 616 may generate the selected and unselected bit line voltages $V_{BLS}$, $V_{BLU}$ at read levels, and the column decoder 618 may supply the selected and unselected bit line voltages $V_{BLS}$, $V_{BLU}$ to the bit lines of the block 1104. In addition, the control gate line voltage generation circuit 606 may generate the control gate line voltages at read levels, and the row decoder circuit 614 may supply the selected and unselected control gate line voltages to the control gate lines of the block 1104.

The read circuit 1100 is configured to perform read operations to read data from selected memory cells. As used herein, a selected memory cell of a read operation is memory cell from which data is read during the read operation. In addition, memory cells that are not the subject of a read operation are referred to as unselected memory cells. Otherwise stated, an unselected memory cell of a read operation is a memory cell from which data is not read during a read operation.

In particular example embodiments, the read circuit 1100 confines a read operation to a particular region or portion of the memory cell structure 142. For such embodiments, the selected memory cells include a first portion or first group of the particular region, and the unselected memory cells include a second portion or second group of the particular region.

At least for NAND technology, the read circuit 1100 confines a read operation to a block. The selected memory cells of a read operation are part of a first set or group of the memory cells of the block, and the unselected memory cells are part of a second set or group of the memory cells of the block, namely those memory cells that are not the selected memory cells. In particular example embodiments, the selected memory cells of a read operation are disposed in or coupled to the same word line (or word line layer) and/or are configured to be biased by the same word line (or word line layer). In further particular embodiments, the selected memory cells of a read operation include only those memory cells that are part of the same or single word line cell group (or string).

The read circuit 1100 may be configured to perform read similar operations similar to how the program circuit 600 performs verify operations. One way they are similar is that similar to how the program circuit 600 performs verify operations by sensing program statuses of selected memory cells, the read circuit 1100 performs read operations by sensing read statuses of selected memory cells. As previously described, a read status is a memory state of a memory cell. The memory state may be an actual memory state that is sensed, regardless of whether the actual memory state is the same as different from the target memory state of the memory cell when it was programmed. Similar to how the program circuit utilizes the sense circuits 620 to sense the program statuses of the selected memory cells, the read circuit 1100 utilizes the sense circuits 620 to sense the read statuses of the selected memory cells.

Another way read operations are performed similar to verify operations is that when performing a read operation, the read circuit 1100 may separate or divide the read operation into discrete read stages. A read stage is at least a portion of a read operation during which the read circuit 1100 performs a discrete set of read actions to read at least portions of the data values that the selected memory cells are storing. As described in further detail below, the discrete set of read actions may include applying a discrete set of biases, such as voltages, to the control lines of the block in order to read at least portions of data values from the selected memory cells. The discrete set of read actions may also include performing sense operations to sense read statuses of the selected memory cells.

By dividing or separating a read operation into different read stages, the program circuit associates each read stage with a different one of the plurality of memory states in which each of the selected memory cells can be configured. The memory state associated with a given read stage is referred to as the associated memory state of the given read stage.

At least for NAND technology, for a given read stage with an associated memory state, the read circuit 600 performs the read stage to determine or find out which of the selected memory cells are programmed in memory states at or above the associated memory state, and which of the selected memory cells are programmed in memory states below the associated memory state. By determining which memory cells are at or above the associated memory state and which are below may allow the read circuit 1100 to determine a portion, such as a bit value, of each of the data values that the selected memory cells are storing. For some example configurations, portions of a data value may be referred to by page designators (e.g., upper page, lower page, and middle page), with each page designator corresponding to one of a plurality of bit positions of a data value, such as the least significant bit, the most significant bit, or one or more bits in between the least and most significant bits. When performing a read stage, the read circuit 1100 may identify bit values of bits of particular bit positions of the data values that the selected memory cells are storing.

In addition, to perform a read operation, the read circuit 1100 performs or executes the read stages sequentially in a predetermined read order. The read order may be an order of memory states. Like a verify order, where a given memory state is positioned in the read order determines when the read circuit 1100 performs a given read stage associated with the given memory state relative to when the read circuit 1100 performs the other read stages.

In addition, like a verify operation, to perform a read operation that includes a plurality of read stages, the read circuit 1100 sequentially performs or executes the read operation by sequentially transitioning from one read stage to another read stage according to the read order. When the read circuit 1100 ends a current read stage, the read circuit 1100 identifies a next read stage in the read order as the current read stage, and begins performing the new current read stage. The read circuit 1100 sequentially performs the read stages in this manner until a last read stage in the read order is performed. After performing the last read stage, the read circuit 1100 may identify the data values of all of the selected memory cells.

During a read operation, the read circuit 1100 may configure the selected memory cells in one of two read bias states, including a read-enable state and a read-inhibit state. A read-enable state is a bias state that enables or allows a selected memory cell to be read—i.e., enables or allows read status of the selected memory cell to be determined. When the read circuit 1100 configures a selected memory cell in the read-enable state, the read-enabled selected memory cell (which can just be referred to as a read-enabled memory cell) is able or allowed to be read, meaning that at least a portion of the data value that the read-enabled memory cell is storing can be determined. If the read circuit 1100 configures a selected memory cell is the read-enabled state during a read stage, the read circuit 1100 may determine whether the read-enabled memory cell is programmed in a memory state at or higher or lower than the associated memory state of the read stage.

In addition, a read-inhibit state is a bias state that prevents or inhibits a selected memory cell from being read—i.e., prevents or inhibits a read status of the selected memory cell from being determined. When the program circuit 600 configures a selected memory cell in the read-inhibit state, the read-inhibited selected memory cell (which can just be referred to as a read-inhibited memory cell) is prevented or inhibited from being read, meaning that at least a portion of the data value that the read-inhibited memory cell is storing cannot be determined. If the read circuit 1100 configures a selected memory cell in the read-inhibit state during a read stage, the read circuit 1100 may not determine whether the read-inhibited memory cell is programmed in a memory state at or higher or lower than the associated memory state of the read stage.

Like the program-enable, program-inhibit, verify-enable, and verify-inhibit states, the read-enable and read-inhibit states are referred to as bias states in that the read circuit 1100 applies different biases, such as in the form of voltages having different levels, to bit lines and SGD lines in order to configure each of the selected memory cells in the read-enable state or the read-inhibit state. In addition or alternatively to being referred to as a read-inhibited memory cell, a selected memory cell configured in the read-inhibit state may be referred to as a locked-out memory cell in that it is locked out from being read during a read operation or a particular stage of the read operation.

In general, during a read operation, the read circuit 1100 configures each of the selected memory cells as read-enabled memory cells in order to determine the data values that they are storing. However, for some example program operations, the read circuit 1100 may be able to ascertain a complete data value of a selected memory cell before the read circuit completes all of the read stages. In that situation, the read circuit may configure the selected memory cell as a read-inhibited memory cell for a remainder of the read operation, which may prevent current draw through the bit line coupled in the read-inhibited memory cell and reduce power consumption.

The read circuit 1100 may configure the selected memory cells as read-enabled and read-inhibit memory cells during read operations similar to how the program circuit 600 configures the selected memory cells as verify-inhibited and verify-enabled memory cells during verify operations. During a read operation, the bit line voltage supply circuit 608 may supply or apply the selected bit line voltage $V_{BLS}$ to selected bit lines to configure selected memory cells coupled to the selected bit lines as read-enabled memory cells, and may supply or apply the unselected bit line voltage $V_{BLU}$ to unselected bit lines to configure unselected memory cells coupled to the unselected bit lines as read-inhibited memory cells. In this context, a selected bit line of a read operation is a bit line that is biased with a selected bit line voltage, configures a selected memory cell as a read-enabled memory cell, and/or allows a selected memory cell to be read. An unselected bit line of a read operation is a bit line that is biased with an unselected bit line voltage, configures a selected memory cell as a read-enabled memory cell, and/or prevents or inhibits a selected memory cell from being read.

In addition, similar to how the control gate line voltage supply circuit 606 supplies or applies the selected SGD line voltage $V_{SGDS}$ to a selected SGD line to enable SGD transistors, and in turn allow selected memory cells to be program-enabled or verify-enabled during program operations, the control gate line voltage supply circuit 606 supplies or applies the selected SGD line voltage $V_{SGDS}$ to a selected SGD line to enable SGD transistors, and in turn allow selected memory cells to be read-enabled during read operations. Also, similar to how the control gate line voltage supply circuit 606 supplies or applies the unselected SGD line voltage $V_{SGDS}$ to unselected SGD lines to inhibit SGD transistors, and in turn inhibit certain unselected memory cells from being programmed or verified during program operations, the control gate line voltage supply circuit 606 supplies or applies the unselected SGD line voltage $V_{SGDU}$ to unselected SGD lines to inhibit SGD transistors, and in turn inhibit certain unselected memory cells from being read during read operations.

One difference between the read circuit 1100 and the program circuit 600 is that the read circuit 1100 may include a read controller 1102 instead of a program controller 622. A read controller is a circuit that controls read operations. A read controller controls when read operations begin and when they end. In addition, a read controller controls when read stages within a read operation begin and end. A read controller controls the transitions of stages from one stage to a next stage. In addition, a read controller sets the voltages on the control lines of a block. A read controller may do so by controlling the voltage levels of the voltages that a voltage supply circuit generates and supplies, and when the voltage supply circuit generates and supplies the voltages at their particular levels. For example, a read controller controls whether and/or when selected and unselected voltages are generated at associated read levels. In addition, a read controller sets the voltages on the control lines by controlling how voltages are routed to control lines of a block, and can change which voltages are routed to which control lines.

In addition, a read controller may determine where to read data from. For example, a read controller may determine that data is to be read, and identify a collection of memory cells from which to read the data, such as by identifying a plane, a block, a word line, and/or a word line cell group that includes the collection of memory cells. The read controller may identify that collection of memory cells as the selected memory cells of a read operation.

A read controller may determine from where to read data in response to receipt of address information from the controller 102 (FIG. 2A) or otherwise identify a unique physical address (e.g., one that includes a particular plane, a particular block, a particular word line, and/or a particular word line cell group) that identifies a physical location of the selected memory cells from which to read the data.

In addition, a read controller may know or determine a storage scheme under which data is being stored in selected memory cells. By knowing the storage scheme, a read controller may know whether the memory cells are programmed as SLC cells or MLC cells, as defined by the storage scheme. In addition, where the selected memory cells are programmed as MLC cells, the read controller may know the number of bits-per-cell each of the MLC cells are storing, as defined by the storage scheme. A read controller may control the biasing on the control lines in order read the data values of the selected memory cells as SLC cells or MLC cells, in accordance with the storage scheme. In addition, a read controller may control the biasing on the control lines in order to configure the various bit lines, word lines, and SGD lines as each selected or unselected, and in turn configured the selected memory cells as read-enabled or read-inhibited, during read operations.

The read circuit 1100, such as through control by the read controller 1102, may be configured to perform a read operation similar to how the program circuit 600 performs a verify operation. For example, during a read operation, the control gate line supply circuit 606 and the source line voltage supply circuit 610 may output their respective voltages at the same sense levels during a read operation as they do during a verify operation. In addition, to perform a read operation, the read controller 1102 may determine a read order, and perform a plurality of read stages according to the read order, similar to how the program controller 622 may perform a verify operation according to a verify order. Also, the bit line voltage supply circuit 608 may supply or apply selected and unselected bit line voltages at the same sense selected and unselected bit line levels VSBS, VSUB in order to read-enable and read-inhibit selected memory cells during various read stages of a read operation, in a similar or same way that the bit line voltage supply circuit supplies or applies the selected and unselected bit line voltages to verify-enable and verify-inhibit selected memory cells during various verify stages of a verify operation.

Figure 12:
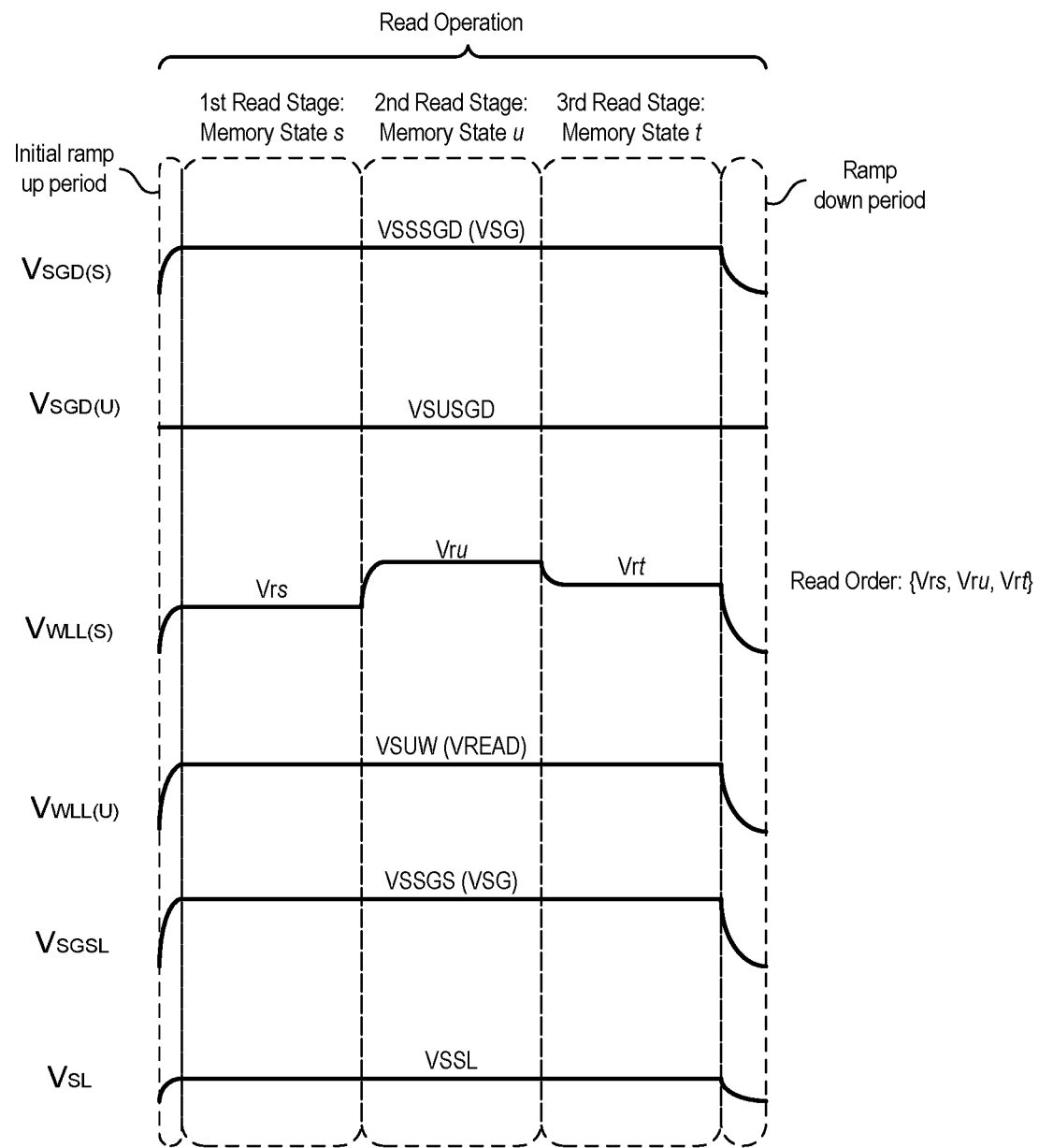
FIG. 12 is a timing diagram of voltage waveforms of control gate and source line voltages generated during consecutive read stages of a read operation.

FIG. 12 is a timing diagram showing voltage waveforms of control gate line and source line voltages generated during a read operation. FIG. 12 shows the selected SGD line voltage $V_{SGD(S)}$, the unselected SGD line voltage $V_{SGD(U)}$, the unselected word line voltage $V_{WLL(U)}$, the SGS line voltage $V_{SGSL}$, and the source line voltage $V_{SL}$ generated with similar waveforms and at the same sense levels as in the verify operation of FIG. 10. One difference is that instead of applying verify pulses at verify pulse levels Vv associated with the memory states, the control gate line supply circuit 606 may supply read pulses at read pulse levels Vr. Example read pulse levels are shown in the threshold voltage distribution plots in FIGS. 5A-5D. Like verify pulse levels, the read pulse levels Vr may each be associated with a respective memory state. During a read operation, when the read circuit 600 performs a read stage associated with a particular memory state, then control gate line voltage supply circuit 608 may supply the read pulse at the read pulse level associated with the particular memory state during the read stage.

In addition, as shown in FIG. 12, the read circuit 1100 may sequentially perform, execute, or transition through the read stages at least by sequentially applying read pulses to the selected word line WLL(S) at the various read pulse levels Vr according to a read order of the read operation. Like verify operations, as shown in FIG. 12, the control gate line voltage supply circuit 608 may transition through the read pulses by directly transitioning to the next read pulse level according to the read order. At least for some example configurations, one difference between a read operation and a verify operation is that to determine the various data values that the selected memory cells are storing, a read order may be "out of order" over at least a portion of the read operation, in that read pulse levels may not consecutive increase according their associated threshold voltage ranges. For example, as shown in FIG. 12, the read circuit 1100 may be configured to perform a second read stage associated with memory state u having a higher associated memory state than memory state t before performing a third read stage associated with memory state t.

At least for NAND technology, when the program circuit 600 applies program pulses to program selected memory cells, the selected memory cells increase their threshold voltages in response to the program pulses by storing or trapping charge, such as under their gates for example. However, locations in between the word lines (or word line layers) may also undesirably store charge in response application of the program pulses, forming parasitic noise source. As used herein, a parasitic noise source is an area, or volume, of a memory array structure other than a bias element configured to be biased with a gate voltage (such as a memory cell, and SGD transistor, an SGS transistor, or a dummy cell for NAND technology) with trapped charge in response to application of program pulses or sense pulses (e.g., verify pulses or read pulses) on control gate lines. When a bias element has its control gate biased with a voltage, charge may be trapped in the charge trap material or layer of a channel in an area of the charge trap material coplanar the control gate of the bias element. However, because the charge trap material is a continuous material in the z-direction extending along a a substantial length of the channel (or memory hole) charge may also be trapped by the charge trap material in other areas, or volumes, other than coplanar with the control gates, including areas, or volumes, in between the control gates of the bias elements.

Figure 16:
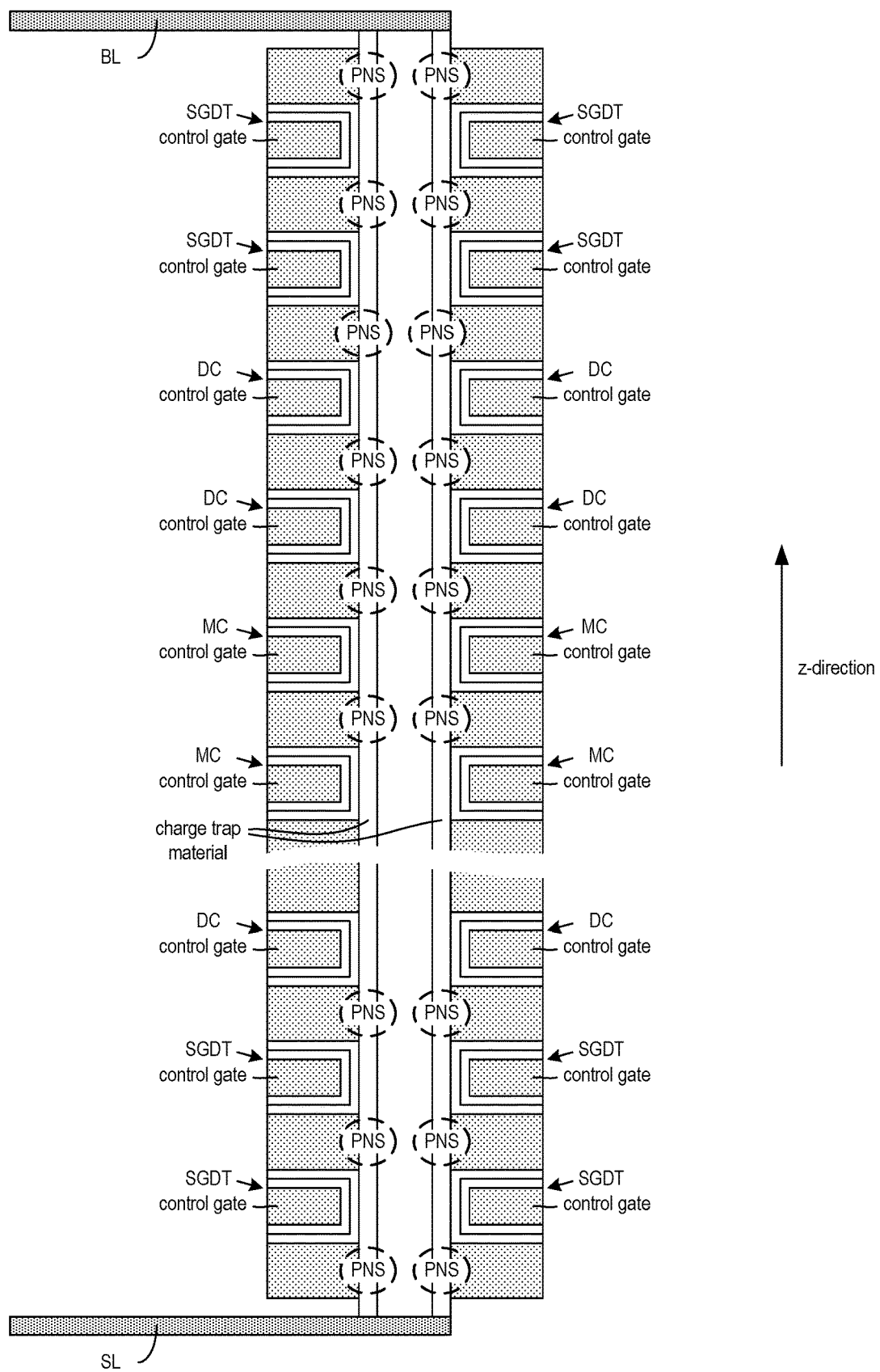
FIG. 16 is a cross-sectional side view of a channel, illustrating example locations of parasitic noise sources.

FIG. 16 is a cross-sectional side view of an example channel and bias elements forming a channel element group associated with the channel, illustrating example locations along a channel where parasitic noise source (PNS) can form. In general, a parasitic noise source (PNS) can form in or adjacent to the charge trap material in locations non-coplanar with the control gates of the bias elements, including in between control gates of bias elements in the z-direction. For example, in FIG. 16, the parasitic noise sources (PNS) can form in between control gates of two memory cells (MC), in between control gates of a memory cell (MC) and a dummy cell (DC), in between control gates of a dummy cell (DC) and a SGD transistor (SGDT), in between a control gate of an SGDT transistor and a bit line BL, in between control gates of a dummy cell (DC) and an SGS transistor (SGST), in between control gates of SGS transistors (SGST), or in between a control gate of an SGS transistor (SGST) and a source line (SL), as non-limiting examples.

Parasitic noise sources in a block are referred to as noise sources in that they can negatively impact or degrade the ability to successfully perform memory operations, including a program circuit's ability to perform verify operations, a read circuit's ability to perform read operations, or more generally, a sense circuit's ability to sense the correct statuses of memory cells during sense operations. For example, after program operations are performed, blocks may experience charge transient effects, such as charge detrapping or migration effects, which may worsen the threshold voltage distributions, particularly at the tails.

During a sense operation to sense a status of a selected memory cell, the noise impact of parasitic noise sources can be controlled or reduced, by increasing the selected bit line or channel voltage. However, performing sense operations with the selected bit line or channel voltage set too high may increase neighboring word line interference caused by neighboring word lines during the sense operations.

Figure 13:
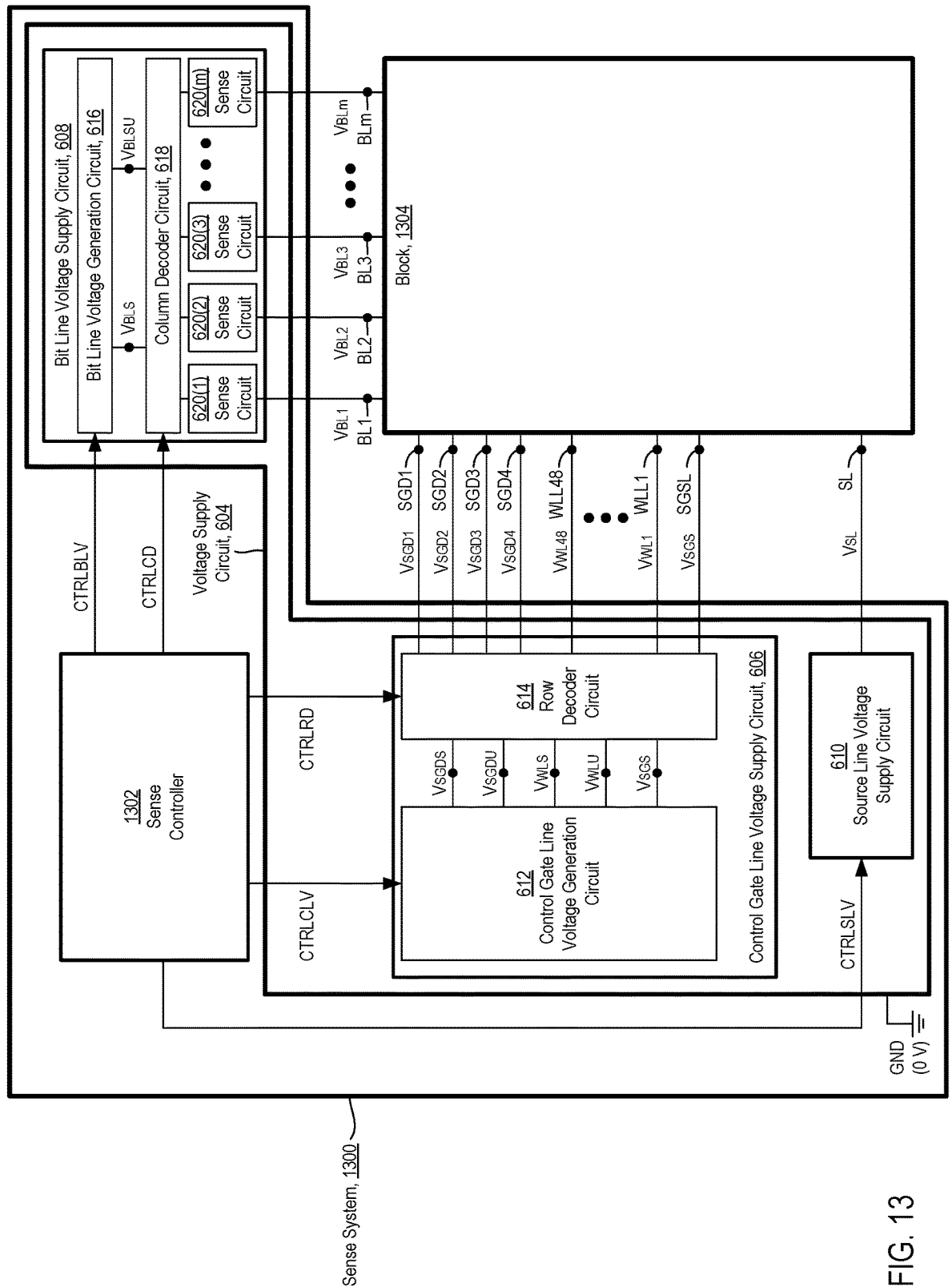
FIG. 13 is a block diagram of an example sense system of the memory die of FIG. 2B configured to sense statuses of memory cells.

FIG. 13 is a block diagram of an example sense system 1300 configured to sense statuses of memory cells of a block 1302. As used herein, a sense system is a circuit, or a collection of circuits or circuit components, that senses statuses of memory cells. In particular example embodiments, a sense circuit is located on the same memory die as the memory cells from which it is sensing.

The block 1302 may be the same or a similar block as the block 602 of FIG. 6 and/or the block 1102 of FIG. 11. FIG. 13 shows the block 1302 as including the same configuration of control lines as the blocks 602 and 1102. In addition or alternatively, the block 1102 may be a block of the memory cell structure 142, one of the blocks BLK in FIG. 3A, 3B, or 4A, have the physical construction or structure of the block 410 if FIGS. 4B, 4C, and/or have the circuit configuration of the block 480 in FIG. 4D.

For at least some example configurations, such as the one shown in FIG. 13, the read circuit 1300 may include the same voltage supply circuit 604 as the program circuit 600 in FIGS. 6 and 11, and so the voltage supply circuit 604 and its components are labeled or numbered the same way as they are in FIGS. 6 and 11. One difference is that the sense system 1300 includes a sense controller 1302 instead of a program controller 622 or a read controller 1102. In general, the sense controller 1302 is configured to control the voltage supply circuit 604, including the sense blocks 620, to perform sense operations to sense statuses of memory cells of the block 1302. The sense operations may include sense operations performed during verify stages of program-verify cycles of program operations, and/or sense operations performed during read stages of read operations. In this regard, the sense controller 1302 may have the functionality of the program controller 622 to perform verify operations, including stages of verify operations, and/or the functionality of the read controller 1102 to perform read operations, including read stages of read operations.

In further detail, the sense system 1300 is configured to perform memory operations to sense statuses of memory cells blocks, such as the block 1302 in FIG. 13. At least with respect to FIG. 13, a memory operation is any operation performed to sense a status of a memory cell. Example memory operations include a verify operation to sense program statuses of memory cells, or a read operation to sense read statuses of memory cells. However, other statuses may be possible, such as a health status of a memory cell relating to the memory cell's ability to store or retain data, a current conduction status of a memory cell indicating whether a memory cell conducted current during a sense operation, a threshold voltage status of a memory cell indicating whether a threshold voltage of a memory cell is higher or lower than a voltage that biased its gate terminal during a sense operation. Various statuses of a memory cell for which a memory operation may be performed may be possible.

In addition, the sense system 1300 is configured to perform a memory operation to sense statuses of selected memory cells. As used herein, a selected memory cell is a memory cell for which a status is sensed during a memory operation. For example, for a verify operation, a selected memory cell is a memory cell being verified, and for a read operation, a selected memory cell is a memory cell being read, as previously described.

In addition, during a memory operation, the sense system 1300 may configure the selected memory cells in a sense-enable state or a sense-inhibit state memory cells. As used herein, a sense-enabled memory cell (i.e., a memory cell configured in the sense-enable state) is a memory cell that is enabled or allowed to have its status sensed during a memory operation. A sense-inhibited memory cell (i.e., a memory cell configured in the sense-inhibited state) is a memory cell that is inhibited or prevented from having its status sensed during a memory operation. For verify operations, sense-enabled cells are those cells that are verify-enabled or configured in the verify-enable state, and sense-inhibited cells are those cells that are verify-inhibited or in the verify-inhibit state. For read operations, sense-enabled cells are those cells that are read-enabled or configured in the read-enable state, and read-inhibited cells are those cells that are read-inhibited or configured in the read-inhibit state.

The sense system 1300, such as through control of the sense controller 1302, is configured to perform a memory operation over a plurality of discrete sense stages. Otherwise stated, the sense system 1300 may separate or divide a memory operation into discrete sense stages. A sense stage is at least a portion of a memory operation during which the sense system 1300 performs a discrete set of sense actions for a predetermined period of time. The discrete set of sense actions may include applying a discrete set of biases, such as voltages, to the control lines of the block to allow or enable the sense circuits to sense statuses of selected memory cells. The discrete set of sense actions may also include the sense circuits performing sense operations to read statuses of the selected memory cells. Where a memory operation is a verify operation, the sense stages are the verify stages of the memory operation. Where a memory operation is a read operation, the sense stages are the read stages of the memory operation.

Each sense stage of a memory operation is associated with a memory state and a reference voltage level. As used herein with respect to sense stages, a reference voltage level is a voltage level with which a threshold voltage of a memory cell is compared to determine a status of the memory cell. In particular memory operations, the reference voltage level is the level of a voltage pulse that is applied to the selected word line during a sense stage. When performing a verify operation, the memory state associated with a verify stage is the target memory state for which the sense system 1300 verifies memory cells. The reference voltage level is the verify pulse level Vv of the verify pulse that the voltage supply circuit 604 applies to the selected word line during the verify stage. When performing a read operation, the memory state associated with a read stage is the memory state relative to which the sense system 1300 determines whether each of the selected memory cells are programmed in memory states that match or are higher, or are lower. The reference voltage level of a read stage is the read pulse level Vr of the read pulse that the voltage supply circuit 602 applies to the selected word line during the read stage.

During memory operations, the control gate line voltage supply circuit 606 applies voltage pulses at reference voltage levels associated with sense stages to selected word lines coupled to selected memory cells. As used herein, at least with respect to memory operations that include sense stages, a selected word line is the word line coupled to the selected memory cells. In addition or alternatively, a selected word line is the word line of the block that biases control gates of selected memory cells with a voltage pulse at a reference voltage level during a sense stage. The selected word line word line is the word line that enables sense circuits to determine threshold voltages of the selected memory cells relative to the reference voltage level in order to determine their statuses.

In addition, during memory operations, the bit line voltage supply circuit 608 applies a selected bit line voltage (or selected channel voltage) $V_{BLS}$ to selected bit lines or selected channels coupled, and applies an unselected bit line voltages (or unselected channel voltage) $V_{BLU}$ to unselected bit lines or unselected channels. As used herein at least with respect to memory operations that include sense stages, a selected bit line is a bit line that biases a selected memory cell with a voltage that configures the selected memory cell as a sense-enabled memory cell during a memory operation, or that allows a selected memory cell to have its status sensed during a memory operation. The voltage that a selected bit line applies is a selected bit line voltage, or a bit line voltage at a sense selected bit line level, that allows or causes a selected memory cell coupled to the selected bit line to be sense-enabled. In addition, an unselected bit line is a bit line that biases a selected memory cell with a voltage that configures the selected memory cell as a sense-inhibited memory cell during a memory operation, or that prevents or locks out a selected memory cell from having its status sensed during a memory operation.

For verify operations, the selected bit lines are those bit lines that generate selected bit line voltages to configure selected memory cells in the verify-enable state, and the unselected bit lines are those bit lines that generate unselected bit line voltages to configure selected memory cells in the verify-inhibit state. For read operations, the selected bit lines are those bit lines that generate bit line voltages to configure selected memory cells in the read-enable state, and the unselected bit lines are those bit liens that generate unselected bit line voltages to configure selected memory cells in the read-inhibit state.

In addition, at least for NAND technology, bit lines bias the memory cells by biasing drain ends of channels coupled to the memory cells. As used herein, at least with respect to memory operations that include sense stages, a selected channel is a channel coupled to a sense-enabled memory cell, and is a channel that a selected bit line biases to configure a selected memory cell in the sense-enable state. In this context, the selected bit line voltage that a selected bit line applies may also be referred to as a selected channel voltage. Also, as used herein at least with respect to memory operations that include sense stages, an unselected channel is a channel coupled to a sense-inhibited memory cell, and is a channel that an unselected bit line biases to configure a selected memory cell in the sense-inhibited state. In this context, the unselected bit line voltage that an unselected bit line applies may also be referred to as an unselected channel voltage.

During a sense stage, the control gate line voltage supply circuit 606 supplies or applies a voltage pulse (e.g., a verify pulse or a read pulse) at a reference voltage level associated with the sense stage to a selected word line. Also, during the sense stage, the bit line voltage supply circuit 608 supplies or applies the selected bit line voltage (or selected channel voltage) $V_{BLS}$ to selected bit lines (or selected channels), and supplies or applies the unselected bit line voltage (or unselected channel voltage) $V_{BLU}$ to unselected bit lines. During supply or application of the voltage pulse at the reference voltage level and the selected and unselected bit line voltages $V_{BLS}$, $V_{BLU}$, the sense circuits 620, such as via control of the sense controller 1302, may perform sense operations to sense statuses of the sense-enabled memory cells. A sense circuit 620 may sense a status of a sense-enabled memory cells by sensing its threshold voltage level relative to the reference voltage level. For example, as previously described, the sense circuit 620 may sense how the sense-enabled memory cell responds, such as whether or how much current it conducts, to having its control gate biased with the voltage pulse at the reference voltage level. How the sense-enabled memory cell responds determines or indicates the status of the sense-enabled memory cell. Upon determining the statuses, the sense circuits 620 may provide the statuses to the sense controller 1302, or otherwise make the statuses accessible to the sense controller 1302, such as by storing the statuses in a storage location that the sense controller 1302 can access.

In addition, the sense system 1300, such as through control of the sense controller 1302, may perform the sense stages of a memory operation in a sense order that defines or identifies the order in which the sense stages of a sense operation are performed. Example sense orders may identify an order of memory states or an order of reference voltage levels. The positions of the memory states or the reference voltage levels in the sense order identifies when the sense stages associated with the memory states or the reference voltage levels are performed relative to each other. For verify operations, the sense order is the verify order, and for read operations, the sense order is the read order, as previously described.

When sense controller 1302 determines to perform a memory operation, the sense controller 1302 may identify or determine a sense order for the memory operation. The sense controller 1302 may then control memory operation by sequentially performing the sense stages according to the sense order, such as by controlling operation of the voltage supply circuit 604, including the sense circuits 620, as the memory operation moves or transitions through the sense stages.

In addition, as previously described with respect to the verify and read operations, the control gate line voltage supply circuit 606, such as via control of the sense controller 1302, may apply the voltage pulses at the reference voltage levels according to a sense order by sequentially stepping through the reference voltage levels. For two consecutive sense stages including a first sense stage and a second sense stage, the control gate line voltage supply circuit 606 may directly transition to generating a voltage on the selected word line from a first reference voltage level associated with the first sense stage to a second reference voltage level associated with the second sense stage. When the second reference voltage level is higher than the first reference voltage level, the sense circuits performing sense operations in the second stage are sensing at a higher threshold voltage level in the second stage compared to first stage. Similarly, when the second reference voltage level is lower than the first reference voltage level, the sense circuits performing sense operations in the second stage are sensing at a lower threshold voltage level in the second stage compared to the first stage.

In further detail, the sense system 1300 is configured to perform memory operations dependent on the reference voltage levels or the memory states associated with the sense stages. In particular, to perform a sense stage, the sense system 1300 may set the selected bit line level (or selected channel level) of the selected bit line voltage (or selected channel voltage) dependent on the reference voltage level or the memory state associated with the sense stage to be performed. For a given sense stage, the sense system 1300 may be configured to select between at least two selected bit line (or selected channel) levels, including a high level and a low level. The sense system 1300 may be configured to set the selected bit line or channel voltage to the high level for performing one or more sense stages associated with relatively higher reference voltage levels or memory states, and set the selected bit line or channel voltage to the low level for performing one or more sense stages associated with relatively lower reference voltage levels or memory states. In doing so, the sense system 1300 controls parasitic noise sources by reducing the amount of noise they create or by reducing the impact or effects that the noise from the parasitic noise sources have when performing sense stages associated with the higher reference voltage levels or memory states, while at the same time minimizing the impact of neighbor word line interference when performing sense stages associated with lower reference voltage levels.

In implementation, the high and low levels of the selected bit line (or channel) voltage generated on the selected bit lines are positive voltage levels referenced with respect to the source line voltage level $V_{SL}$, or alternatively to the ground reference voltage 0 V. In general, the high level is a level that is higher than the low level. For some example embodiments, the high level is in a range of about 0.05 V to 1 V higher than the low level. For other example embodiments, the high level is in a range of about 0.1 V to 0.6 V higher than the low level. For other example embodiments, the high level is in a range of about 0.2 V to 0.4 V higher than the low level. In addition or alternatively, for some example embodiments, the low level is in a range of about 0.05 to 0.6 V above the source line voltage. For other example embodiments, the low level is in a range of about 0.1 V to 0.5 V above the source line voltage. For other example embodiments, the low level is in a range of about 0.2 V to 0.4 V above the source line voltage. In addition or alternatively, for some example embodiments, the high level is in a range of about 0.3 V to 1.2 V above the source line voltage. For other example embodiments, the high level is in a range of about 0.4 V to 0.8 V above the source line voltage. For other example embodiments, the high level is in a range of about 0.5 V to 0.7 V above the source line voltage.

In particular example configurations, the sense controller 1302 is configured to identify a triggering threshold voltage level Vtg. During a memory operation, as long as the sense system 1300 is performing a sense stage associated with a reference voltage level or a memory state lower than the triggering threshold voltage level Vtg, the bit line voltage supply circuit 608 may bias the selected bit lines (or selected channels) with the selected bit line (or channel) voltage $V_{BLS}$ at the low level. However, when beginning to perform a next sense stage in the sense order, if the sense controller 1302 identifies that the next stage is associated with a reference voltage level or a memory state that is higher than the triggering threshold voltage level Vtg, then the sense controller 1302 may control the bit line voltage supply circuit 1302 to increase the voltage level of the selected bit line (or channel) voltage $V_{BLS}$ from the low level to the high level, and bias the selected bit lines with the selected bit line (or channel) voltage $V_{BLS}$ at the high level during performance of that channel stage. If the memory operation includes more sense stages, as long as the sense controller 1302 identifies those additional sense stages as being associated with reference voltage levels or memory states above the triggering threshold voltage level Vtg, the sense controller 1302 may control the bit line voltage supply circuit 1302 to supply the selected bit line (or channel) voltage $V_{BLS}$ at the high level. However, if the sense controller 1302 transitions the memory operation to a sense stage having an associated reference voltage level or memory state that is lower than the triggering reference voltage level Vtg, then the sense controller 1302 may control the bit line voltage supply circuit 1302 to lower or decrease the selected bit line (or channel) voltage $V_{BLS}$ back down to the low level for performance of that next sense stage.

The sense controller 1302 may be configured to control the level of the selected bit line (or channel) voltage $V_{BLS}$ in any of various ways. For some example configurations, the bit line voltage generation circuit 616 may be configured to simultaneously generate a plurality of different selected bit line voltages at different levels, including the high level and the low level. To perform a given sense stage, the sense controller 1302 may output the bit line voltage control signal CTRLBLV as a digital signal having a digital value that selects which of the different selected bit line voltages that the bit line voltage generation circuit 616 outputs to the column decoder circuit 618. For other example configurations, the bit line voltage generation circuit 616 may be configured to generate one selected bit line voltage. To perform a given sense stage, the sense controller 1302 may output the bit line voltage control signal CTRLBLV as an analog signal, such as gate voltage to a gate of transistors that determines an amount of current supplied to a node, which in turn sets the level of the selected bit line voltage $V_{BLS}$. The sense controller 1302 may adjust the level of the analog voltage to change the current in order to change the level of the selected bit line voltage $V_{BLS}$ between the high level and the low level. Various ways of controlling the bit line voltage supply circuit 608 to supply the selected bit line (or channel) voltage at different levels, including a high level and a low level, may be possible.

Figure 14:
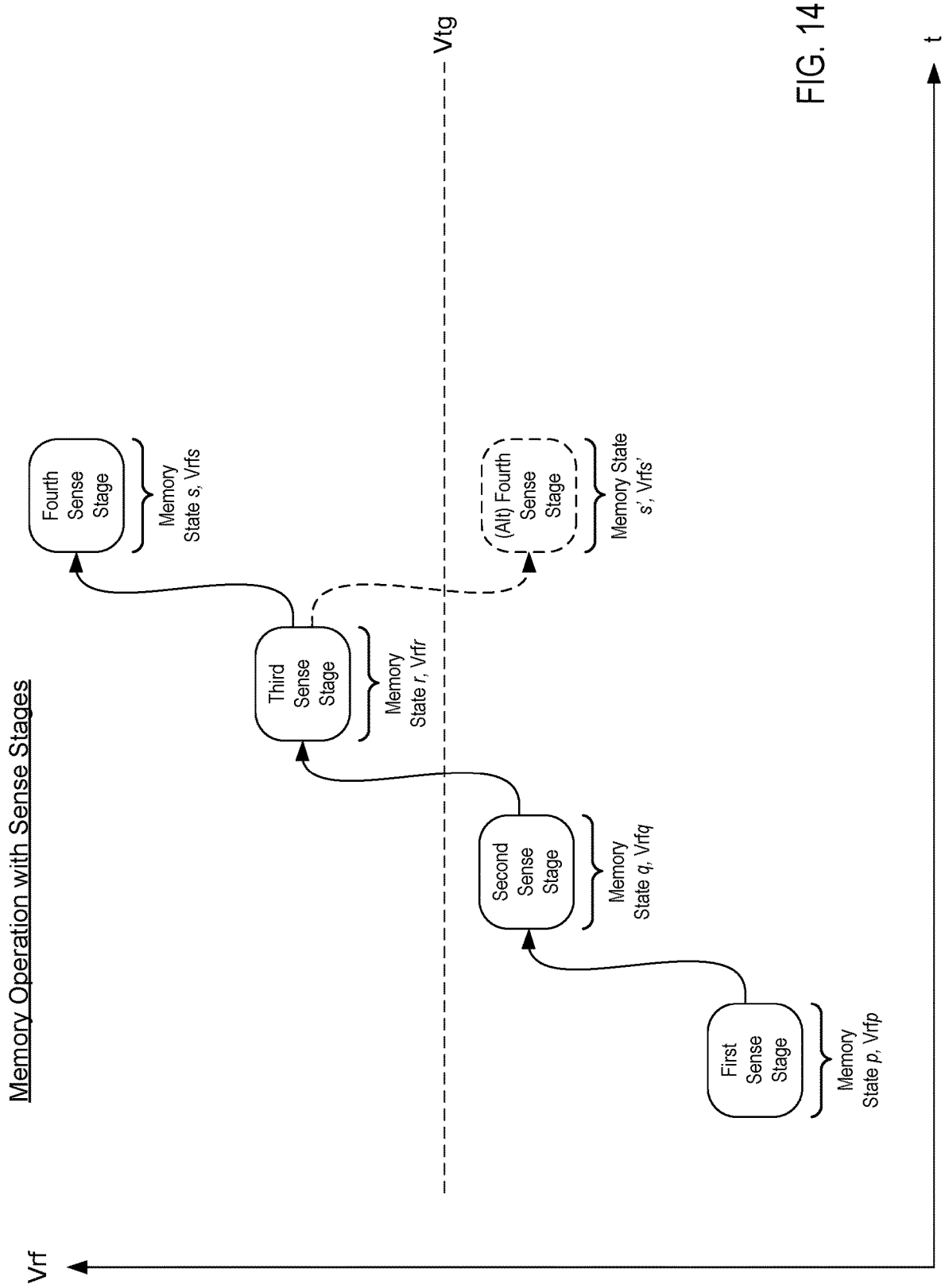
FIG. 14 is a timing diagram of an example memory operation including multiple sense stages performed relative to a triggering threshold voltage level.

FIG. 14 is a timing diagram of an example memory operation including a plurality of sense stages that the sense system 1300 may be configured to perform. The example memory operation is shown as including four sense stages.

The first sense stage is associated with a pth memory state p and a pth reference voltage level Vrfp, the second sense stage is associated with a qth memory state q and a qth reference voltage level Vrfq, the third sense stage is associated with an rth memory state r and an rth reference voltage level Vrfr, and the fourth sense stage is associated with an sth memory state s and an sth reference voltage level Vrfs. Memory state p, q, r, and s may be any of various memory states in which memory cells can be configured. In addition, in the example, the sense controller 1302 may determine to perform the memory operation in accordance with a sense order identifying that the first sense stage associated with memory state p is to be performed first, the second sense stage associated with memory state q is to be performed second, the third sense stage associated with memory state r is to be performed third, and the sense stage associated with memory state s is to be performed fourth, or last.

In addition, as shown in FIG. 14, memory states p and q are associated with reference voltage levels Vrfp, Vrfq below a triggering threshold voltage level Vtg, whereas memory state r is associated with a reference voltage level Vrfr above the triggering threshold level Vtg. Accordingly, the sense system 1300 may perform the first and second stages with the bit line voltage supply circuit 608 applying the selected bit line (or channel) voltage $V_{BLS}$ at the low level to the selected bit lines during the first and second sense stage. Then, when transitioning from the second sense stage to the third sense stage, the sense controller 1302 may determine that the third sense stage is associated with memory state r (or the reference voltage level Vrfr), which is above the triggering threshold voltage level Vtg. In response, the bit line voltage supply circuit 608, such as through control of the sense controller 1302, may apply the selected bit line (or channel) voltage $V_{BLS}$ to the selected bit lines at the high level instead of the low level while performing the third sense stage. After performing the third sense stage, the sense system 1300 may transition to performing the fourth stage. If the sth reference voltage level Vrfs is also above the triggering threshold voltage level Vtg, then the bit line voltage supply circuit may continue to apply the selected bit line (or channel) voltage $V_{BLS}$ to the selected bit lines at the high level during the fourth sense stage. Alternatively, as indicated by the dotted lines in FIG. 14, if the sth reference voltage level Vrfs happens to be below the triggering reference voltage Vtg, then the bit line voltage supply circuit 608, such as through control of the sense controller 1302, may decrease the selected bit line (or channel) voltage $V_{BLS}$ back down to the low level, and apply the selected bit line (or channel) voltage $V_{BLS}$ at the low level during the fourth sense stage.

In a particular example configuration, during memory operations to sense statuses of MLC cells, such as three-bits per cell, the triggering threshold voltage level may be between memory state F and memory state G. For such example configurations, the sense controller 1302 may set the selected bit line (or channel) voltage $V_{BLS}$ to the low level when performing sense stages (e.g., verify stages or read stages) for memory state F or below (i.e., memory states A through F), and may increase the selected bit line voltage $V_{BLS}$ to the high level when performing sense stages for memory state G.

In addition or alternatively, for some example configurations, the sense controller 1302 is configured to identify multiple or a plurality of triggering threshold voltage levels Vtg. In such example configurations, the bit line voltage supply circuit 608 is configured to supply the selected bit line (or channel) voltage at three or more different levels. The three or more different levels may define a range extending from the low level to the high level. In addition, the plurality of triggering threshold voltage level Vtg may define threshold voltage zones. For example, an example configuration that includes two triggering threshold voltage levels, including a first triggering threshold voltage level Vtg1 and a second triggering threshold voltage level Vtg2, where the second triggering threshold voltage level Vtg2 is higher than the first triggering threshold voltage level, may define three threshold voltage zones, including a first threshold voltage zone blow than the first triggering threshold voltage level, a second threshold voltage zone bounded below by first triggering threshold voltage level Vtg1 and above by the second triggering threshold voltage level Vtg2, and a third threshold voltage zone above the second triggering threshold voltage level Vtg2. When performing a sense stage, the sense controller 1302 may determine which threshold voltage zone the associated reference voltage level is in, and set the selected bit line (or channel) voltage $V_{BLS}$ to the level corresponding to the threshold voltage zone. For particular example configurations, the number of different selected bit line (or channel) levels may be equal to the number memory states of a given storage scheme. For such example configurations, the bit line voltage supply circuit 608 may be configured to supply the selected bit line (or channel) voltage $V_{BLS}$ at a different level each time the sense system 1300 transitions to a next sense stage of a memory operation.

Figure 15:
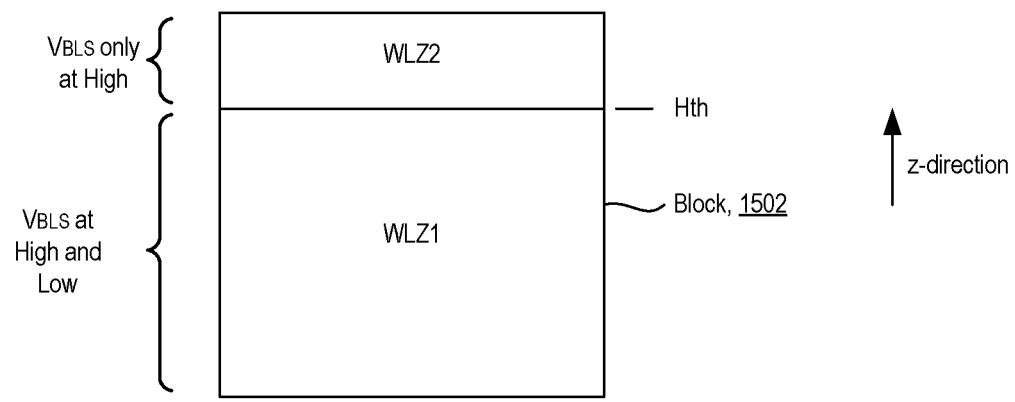
FIG. 15 is a schematic diagram of a block, illustrating different selected bit line biasing schemes for different word line zones of the block.

In addition, for some example configurations, the bit line voltage supply circuit 608 may further be configured to apply the selected bit line (or channel) voltage $V_{BLS}$ to the selected bit lines at levels dependent on word line height. FIG. 15 is a block diagram illustrating memory operations performed on a block 1502 dependent on a height of the block. In FIG. 15, the block 1502 is separated or divided into two zones, including a first word line zone WLZ1 and a second word line zone WLZ2. Higher word lines are those word lines positioned farther away from the substrate in the z-direction. Accordingly, FIG. 15 shows the second word line zone WLZ2 as a higher word line zone that the first word line zone WLZ1.

As shown in FIG. 15, the two word line zones WLZ1, WLZ2 are separated by a height threshold Hth. In some example configurations, the height threshold Hth is a particular word line of the block 1502. In particular example configurations, the height threshold Hth is an edge word line of the block 1502, which is the highest word line or farthest word line from the substrate of the block 1502. Accordingly, for such particular example configurations, the word line zone WLZ2 includes only the highest or edge word line, and the first word line zone WLZ1 includes all of the other word lines of the block 1502.

When performing memory operations for selected memory cells coupled to selected word lines located or positioned in the block 1502 below the height threshold Hth, the bit line voltage supply circuit 608 may supply the selected bit line (or channel) voltage $V_{BLS}$ at a level dependent on the reference voltage level or the memory state of an associated sense stage. In addition, when performing memory operations for selected memory cells coupled to selected word lines located or positioned at or above the height threshold Hth, the bit line voltage supply circuit 608 may supply the selected bit line (or channel) voltage $V_{BLS}$ only at the high level for all of the sense stages, irrespective or independent of the reference voltage level or the memory state associated with a given sense stage. Accordingly, for such example configurations, the bit line voltage supply circuit 608 may switch from supplying the selected bit line (or channel) voltage $V_{BLS}$ at different levels dependent on the sense stage, to supplying the selected bit line (or channel) voltage only at a single level, such as the high level, when crossing the height threshold.

A means for sensing a threshold voltage of a memory cell relative to a reference voltage level for a sense operation, in various embodiments, may include the program circuit 600, a sense circuit 620, a read circuit 1100, a sense system 1300, or the like. Other embodiments may include similar or equivalent means for sensing a threshold voltage of a memory cell.

A means for identifying a bit line voltage for a sense stage may include the program controller 622, the read controller 1102, the sense controller 1302, or the like. Other embodiments may include similar or equivalent means for identifying a bit line voltage for a sense stage.

A means for supplying a bit line voltage to a bit line at a level dependent on a reference voltage level may include the voltage supply circuit 604, the bit line voltage supply circuit 608, the column decoder 618, the sense circuits 620, or the like. Other embodiments may include similar or equivalent means for supplying a bit line voltage.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
   a memory structure comprising a plurality of memory cells arranged in NAND strings; and
   a control circuit connected to the memory structure, the control circuit is configured to:
   identify a memory state of a memory cell coupled to a selected bit line during a plurality of sense stages, each sense stage corresponding to a different reference voltage applied to a word line of the memory cell;
   bias the selected bit line with a bit line voltage at a low level in a first sense stage when a first reference voltage associated with the first sense stage is below a triggering threshold voltage level; and
   bias the selected bit line with the bit line voltage at a high level in a second sense stage when a second reference voltage associated with the second sense stage is above the triggering threshold level.

2. The circuit of claim 1, wherein, the second sense stage is a next sense stage after the first sense stage and the control circuit is configured to increase the bit line voltage from the low level in the first sense stage to the high level in response to the reference voltage associated with the second sense stage being above the triggering threshold level.

3. The circuit of claim 1, wherein, a third sense stage is a next sense stage after the second sense stage and the control circuit is configured to decrease the bit line voltage from the high level to the low level in response to a third reference voltage associated with the third sense stage being below the triggering threshold level.

4. The circuit of claim 1, wherein the memory state comprises a memory state G of a three bits-per-cell storage scheme.

5. The circuit of claim 1, wherein the control circuit is further configured to control a parasitic noise source dependent on the reference voltage associated with the memory state being above or below the triggering threshold level in response to the memory cell coupled to a selected word line below a height threshold.

6. The circuit of claim 1, wherein the sense operation comprises a plurality of sense stages, each of the plurality of sense stages being performed in a sense order.

7. The circuit of claim 6, wherein the sense order is based on an order of levels of the reference voltage.

8. The circuit of claim 6, wherein the sense order is based on an order of a plurality of memory states.

9. The circuit of claim 1, wherein the first sense stage comprises a verify stage and the second sense stage comprises a subsequent verify stage.

10. The circuit of claim 1, wherein the first sense stage comprises a read stage and the second sense stage comprises a subsequent read stage.

11. The circuit of claim 1, wherein the plurality of sense stages includes four sense stages, a first two sense stages having reference voltages below the triggering threshold voltage level and a second two sense stages having reference voltages above the triggering threshold voltage.

12. The circuit of claim 1, wherein the plurality of sense stages includes four sense stages, three sense stages having reference voltages below the triggering threshold voltage level and one sense stage having a reference voltage above the triggering threshold voltage.

13. The circuit of claim 1, wherein the high level is in a range of 0.1 volts to 0.6 volts higher than the low level.

14. The circuit of claim 1, wherein the low level is in a range of 0.05 volts to 0.6 volts above a source line voltage and the high level is in a range 0.4 volts to 0.8 volts above the source line voltage.

15. The circuit of claim 1 wherein the memory cell structure is a 3-D memory structure in which the NAND strings extend vertically through a plurality of levels above a substrate, the control circuit further configured to bias the selected bit line at the low and high levels according to different reference voltages during memory operations for selected memory cells below a height threshold, and to bias the bit line voltage at a same level independent of different reference voltages during memory operations for selected memory cells at or above the height threshold.

16. A circuit comprising:
   a memory structure including a plurality of memory cells arranged in NAND strings, each memory cell has a threshold voltage that is indicative of a memory state; and
   a control circuit connected to the memory structure, the control circuit is configured to apply a first bit line voltage to a bit line connected to a NAND string containing a selected memory cell while applying a first reference voltage to a word line of the selected memory cell in a first sense stage of a read operation and apply a second bit line voltage to the bit line while applying a second reference voltage to the word line in a second sense stage of the read operation.

17. The circuit of claim 15 wherein the first reference voltage is below a triggering threshold voltage, the second reference voltage is above a triggering threshold voltage, and the first bit line voltage is lower than the second bit line voltage.

18. The circuit of claim 17 wherein the control circuit is configured to apply the first bit line voltage in any sense stage in which a reference voltage that is less than the triggering threshold voltage is applied to the word line of the selected memory cell and to apply the second bit line voltage in any sense stage in which a reference voltage that is greater than the triggering threshold voltage is applied to the word line of the selected memory cell.

19. A method of reading a memory cell in a NAND memory comprising:
- biasing a bit line connected to a NAND string containing the memory cell at a low level in a first sense stage in response to determining that a first reference voltage applied to a word line of the memory cell in the first sense stage is less than a triggering threshold voltage; and
- biasing the bit line at a high level in a second sense stage in response to determining that a second reference voltage applied to the word line of the memory cell in the second sense stage is greater than the triggering threshold voltage.

20. The method of claim 19 further comprising:
- subsequent to biasing the bit line at a high level in the second sense stage, biasing the bit line at the low level in a third stage in response to determining that a third reference voltage applied to the word line of the memory cell in the third sense stage is less than the triggering threshold voltage.

* * * * *